US010651189B2

(12) United States Patent
Masuoka et al.

(10) Patent No.: US 10,651,189 B2
(45) Date of Patent: *May 12, 2020

(54) METHOD FOR PRODUCING PILLAR-SHAPED SEMICONDUCTOR MEMORY DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 46 days.

This patent is subject to a terminal disclaimer.

(21) Appl. No.: 16/148,099

(22) Filed: Oct. 1, 2018

(65) Prior Publication Data
US 2019/0043869 A1 Feb. 7, 2019

Related U.S. Application Data

(60) Continuation-in-part of application No. 15/679,357, filed on Aug. 17, 2017, now Pat. No. 10,121,795, (Continued)

(51) Int. Cl.
*H01L 27/1157* (2017.01)
*H01L 29/792* (2006.01)
(Continued)

(52) U.S. Cl.
CPC .... *H01L 27/1157* (2013.01); *H01L 27/11565* (2013.01); *H01L 27/11573* (2013.01);
(Continued)

(58) Field of Classification Search
CPC ............. H01L 27/2454; H01L 29/7827; H01L 21/823487; H01L 21/823885;
(Continued)

(56) References Cited

U.S. PATENT DOCUMENTS 8,189,371 B2 5/2012 Katsumata et al.
2002/0195668 A1* 12/2002 Endoh .................. H01L 27/115
257/390
(Continued)

FOREIGN PATENT DOCUMENTS

JP 02-188966 A 7/1990
JP 04-079369 A 3/1992
(Continued)

OTHER PUBLICATIONS

Ting, C.Y. et al., "Study of Planarized Sputter-Deposited $SiO_2$,", *J. Vasc. Sci. Technol.*, vol. 15, No. 3, May/Jun. 1978, pp. 1105-1112.
(Continued)

*Primary Examiner* — Jarrett J Stark
(74) *Attorney, Agent, or Firm* — Brinks Gilson & Lione

(57) ABSTRACT

A method for producing a pillar-shaped semiconductor memory device includes forming a mask on a semiconductor substrate and etching to form a semiconductor pillar on the semiconductor substrate. A tunnel insulating layer is formed and a data charge storage insulating layer is formed so as to surround the tunnel insulating layer, and a first conductor layer and a second interlayer insulating layer are formed on the semiconductor pillar. A stacked material layer is formed in a direction perpendicular to an upper surface of the semiconductor substrate, the stacked material layer including the first conductor layer and the second interlayer insulating layer. Data writing and erasing due to charge transfer between the semiconductor pillar and the data charge storage insulating layer through the tunnel insulating layer is performed by application of a voltage to the first conductor layer.

15 Claims, 37 Drawing Sheets

Related U.S. Application Data which is a division of application No. 15/164,266, filed on May 25, 2016, now Pat. No. 9,773,801, which is a continuation of application No. PCT/JP2014/055499, filed on Mar. 4, 2014.

(51) Int. Cl.
*H01L 27/11582* (2017.01)
*H01L 27/11565* (2017.01)
*H01L 21/28* (2006.01)
*H01L 27/11575* (2017.01)
*H01L 27/11573* (2017.01)

(52) U.S. Cl.
CPC .. *H01L 27/11575* (2013.01); *H01L 27/11582* (2013.01); *H01L 29/40117* (2019.08); *H01L 29/7926* (2013.01)

(58) Field of Classification Search
CPC ............. H01L 27/1157; H01L 29/7926; H01L 27/11565; H01L 21/28282; H01L 27/11582
See application file for complete search history.

(56) References Cited

U.S. PATENT DOCUMENTS

| | | | |
|---|---|---|---|
| 2007/0252201 A1 | 11/2007 | Kito et al. | |
| 2009/0108333 A1* | 4/2009 | Kito | H01L 27/115 257/324 |
| 2010/0148237 A1* | 6/2010 | Kito | H01L 27/11551 257/315 |
| 2010/0187593 A1 | 7/2010 | Morikado | |
| 2010/0207193 A1* | 8/2010 | Tanaka | H01L 27/11578 257/324 |
| 2011/0298013 A1* | 12/2011 | Hwang | H01L 27/11551 257/208 |
| 2011/0316069 A1 | 12/2011 | Tanaka et al. | |
| 2012/0001264 A1* | 1/2012 | Kim | C09K 13/04 257/368 |
| 2012/0135595 A1 | 5/2012 | Kito et al. | |
| 2013/0032873 A1* | 2/2013 | Kiyotoshi | H01L 29/7926 257/324 |
| 2013/0062681 A1 | 3/2013 | Fujiki et al. | |

FOREIGN PATENT DOCUMENTS

| | | |
|---|---|---|
| JP | 2009-111049 A | 5/2009 |
| JP | 2010-177279 A | 8/2010 |
| JP | 2011-165815 A | 8/2011 |
| JP | 2012-009701 A | 1/2012 |
| JP | 2013-069841 A | 4/2013 |

OTHER PUBLICATIONS

Stewart, A.D.G. et al., "Microtopography of Surfaces Eroded by Ion-Bombardment", *Journal of Material Science*, vol. 4, 1969, pp. 56-69.

Search Report, and English language translation thereof, in corresponding International Application No. PCT/JP2014/055499, dated Apr. 8, 2014, 5 pages.

English language translation of International Preliminary Report on Patentability in corresponding International Application No. PCT/JP2014/055499, dated Sep. 9, 2016, 4 pages.

Office Action in corresponding U.S. Appl. No. 15/164,266, dated Feb. 15, 2017, 10 pages.

Office Action in corresponding U.S. Appl. No. 15/164,266, May 5, 2017, 8 pages.

Notice of Allowance in corresponding U.S. Appl. No. 15/164,266, dated Jun. 29, 2017, 7 pages.

* cited by examiner

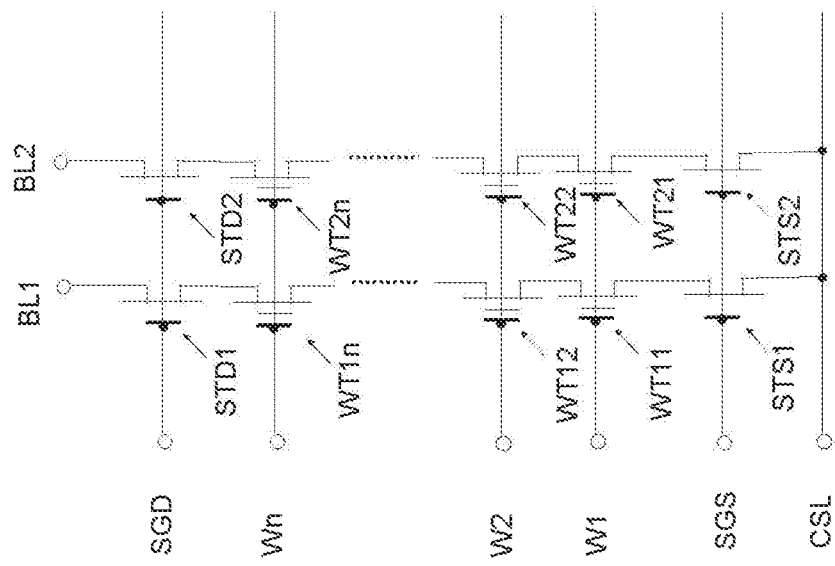

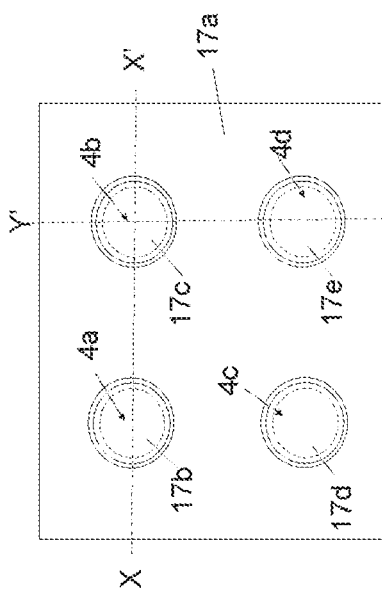
FIG. 2FA
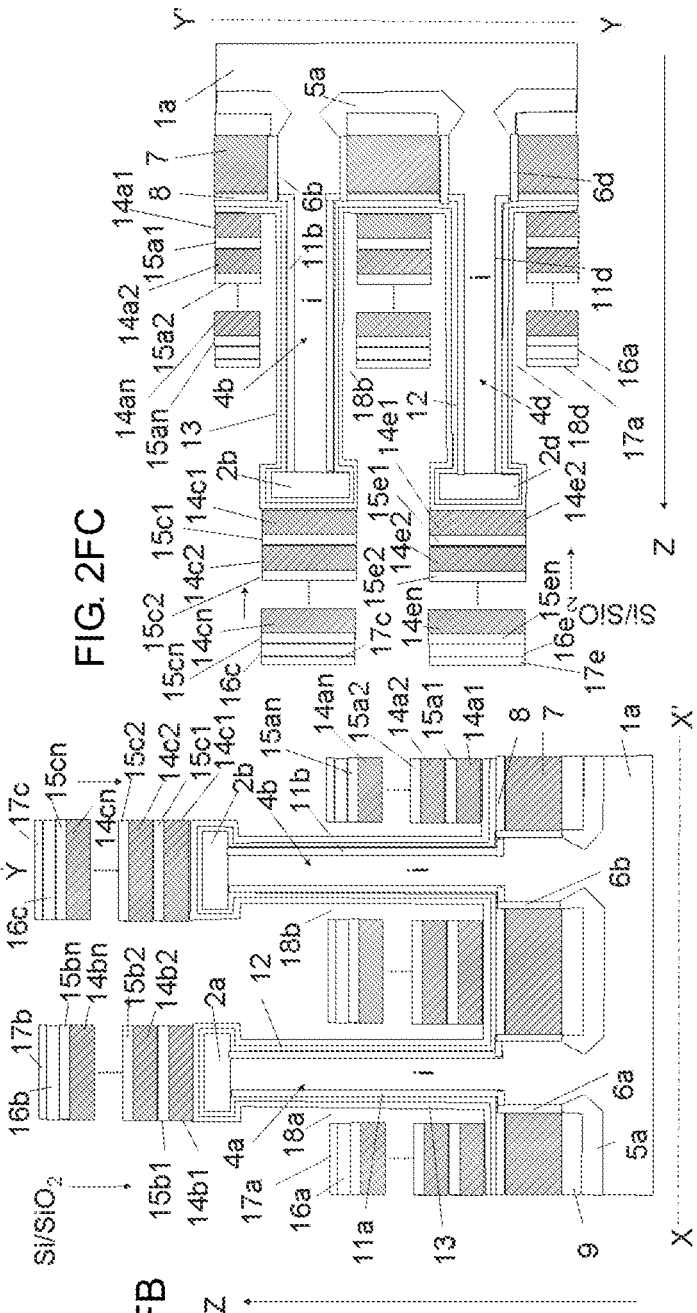
FIG. 2FB
FIG. 2FC

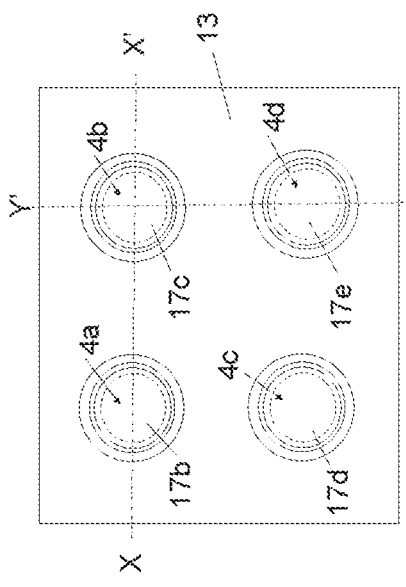
FIG. 2GA
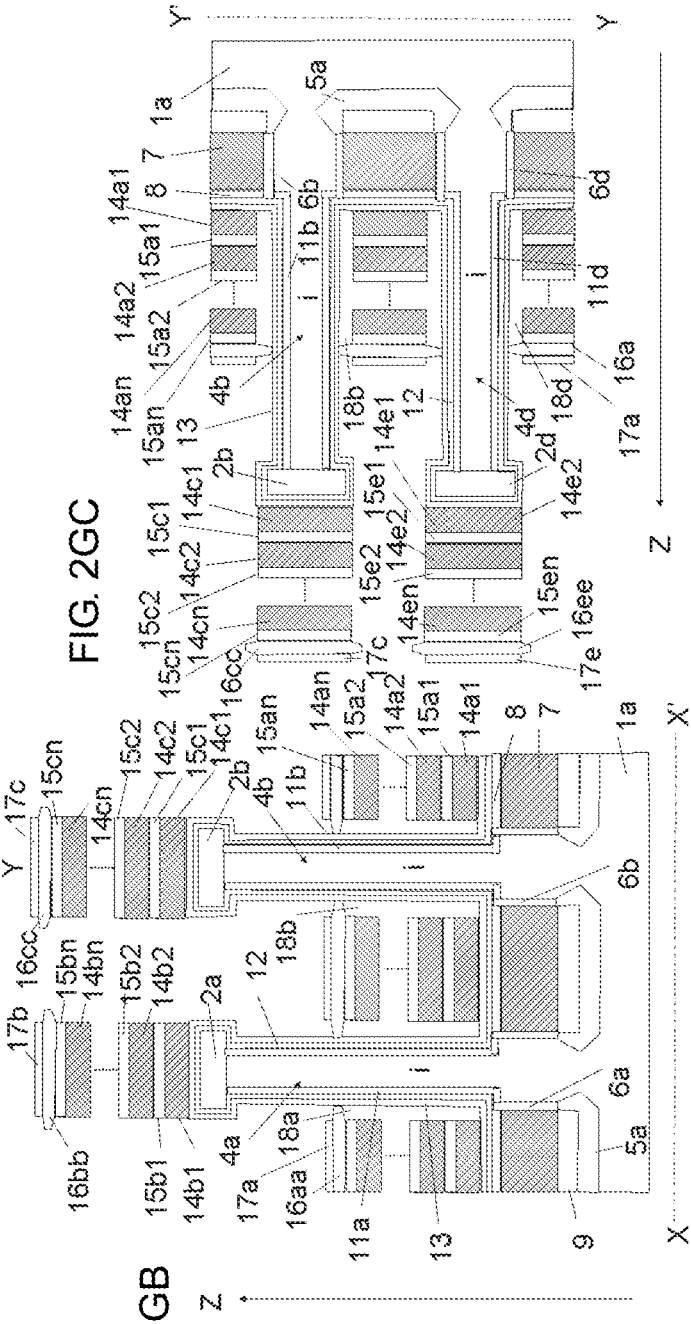
FIG. 2GB
FIG. 2GC

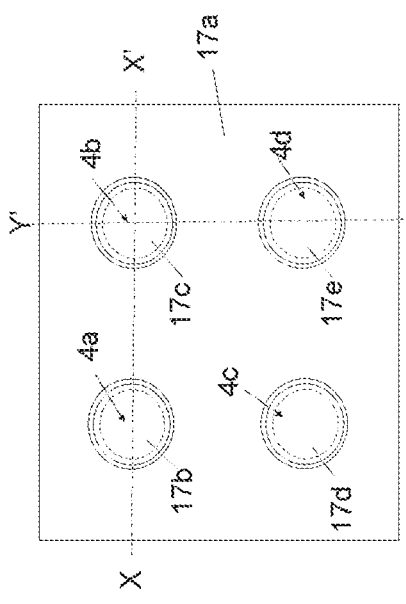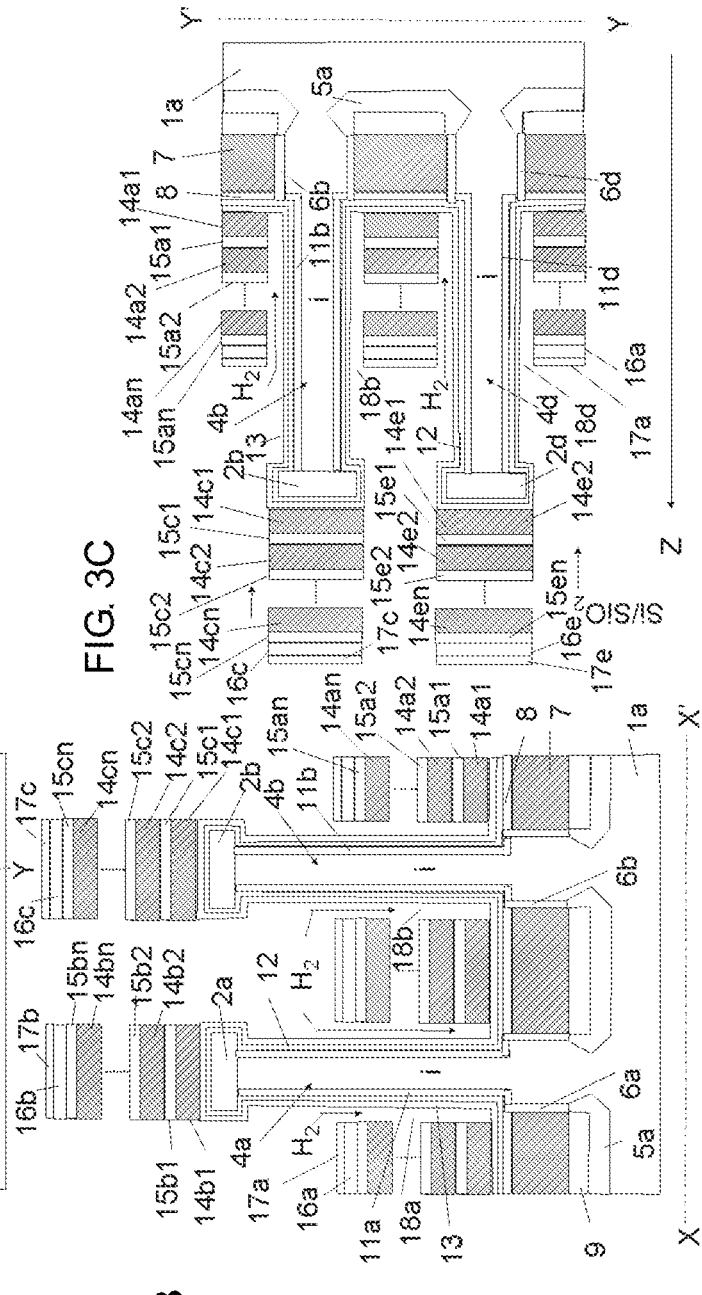

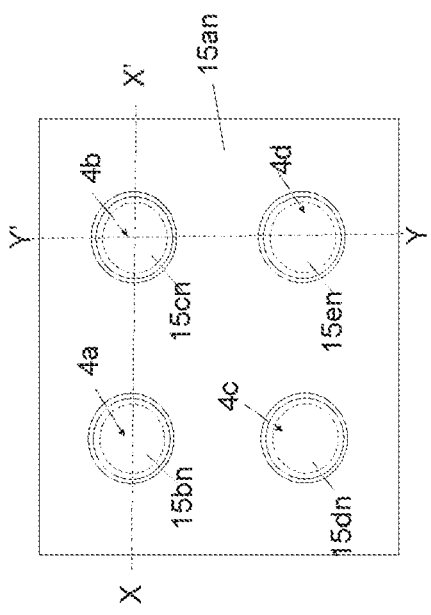
FIG. 4AA
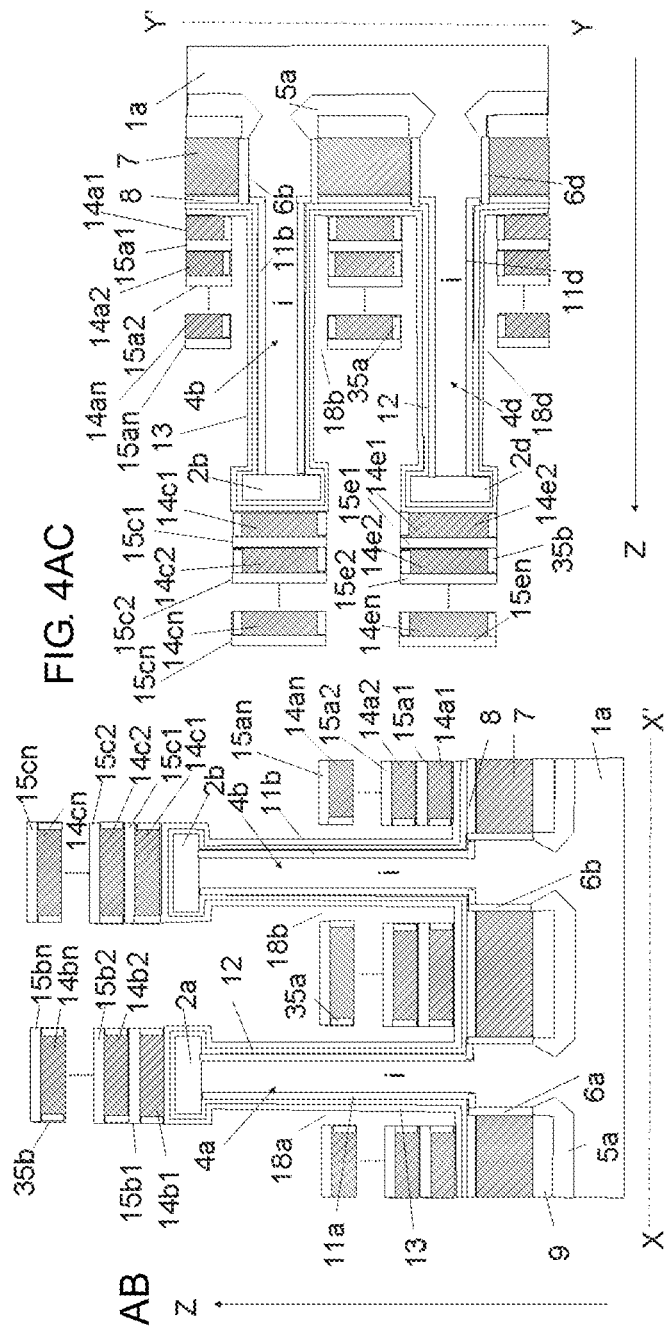
FIG. 4AB
FIG. 4AC

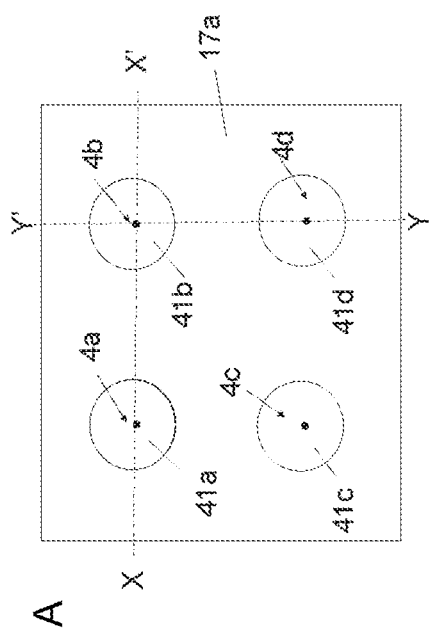
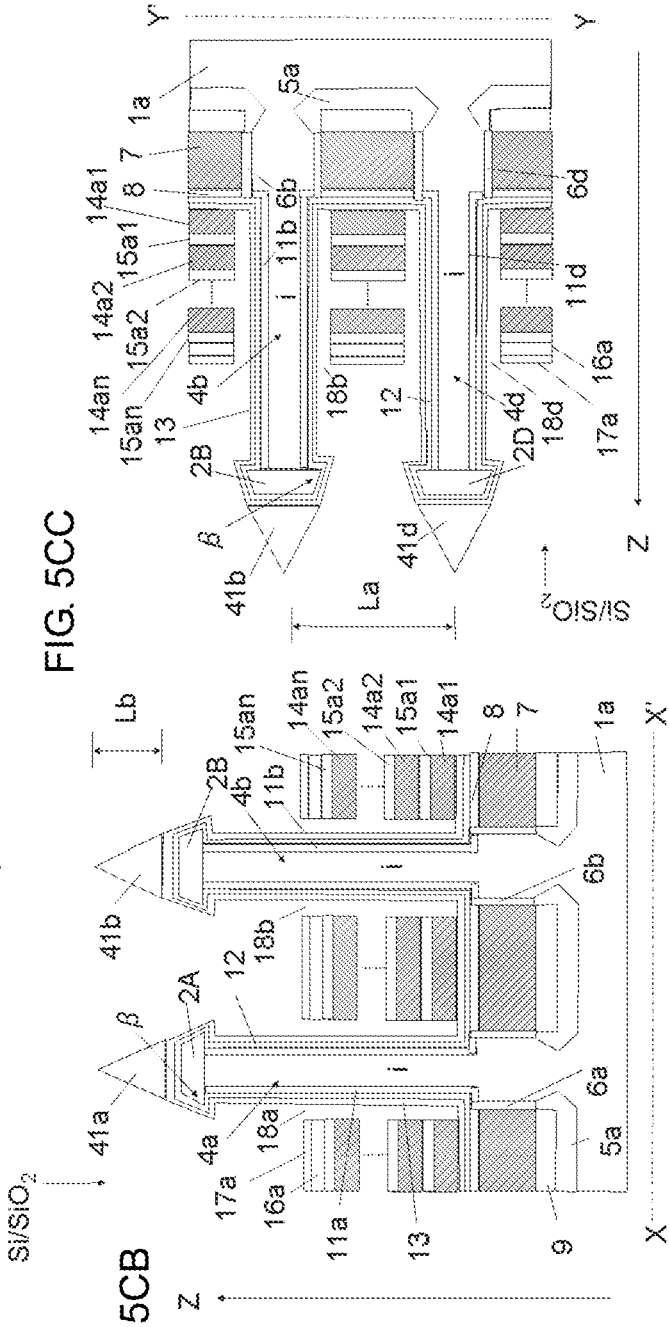
FIG. 5CA
FIG. 5CB
FIG. 5CC

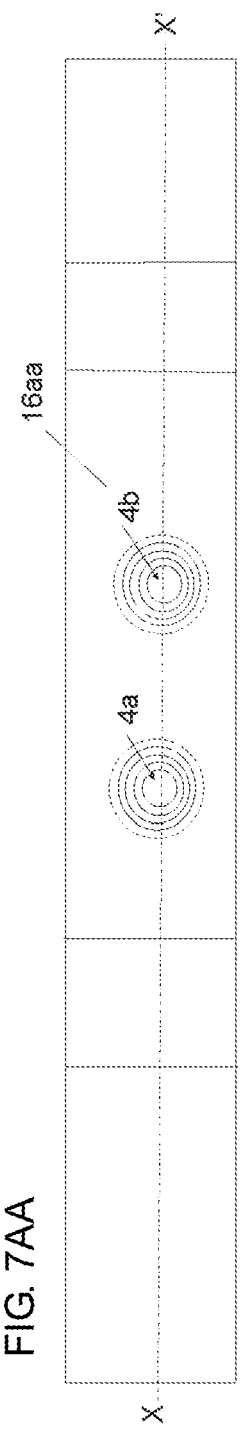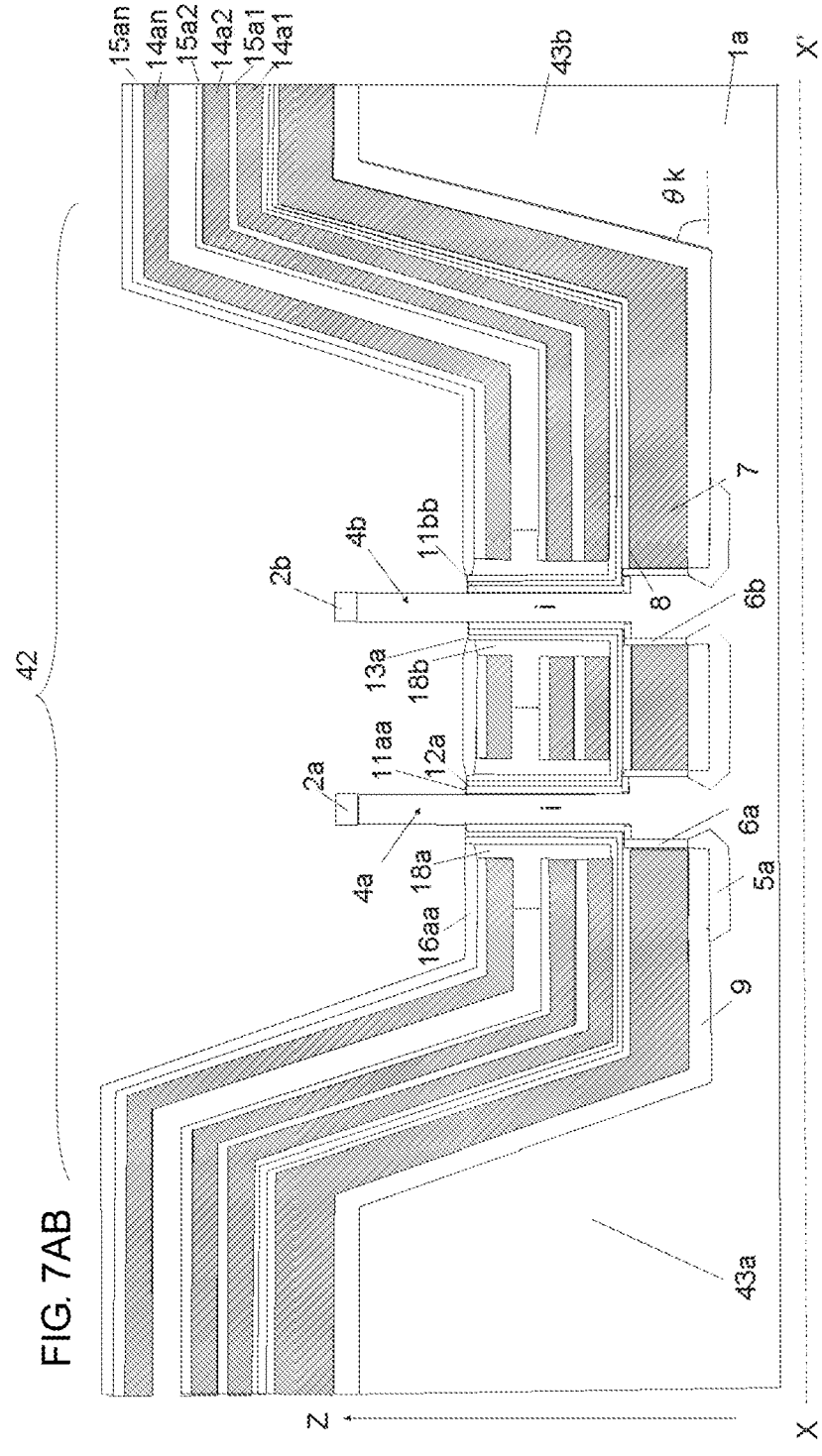
FIG. 7AA
FIG. 7AB

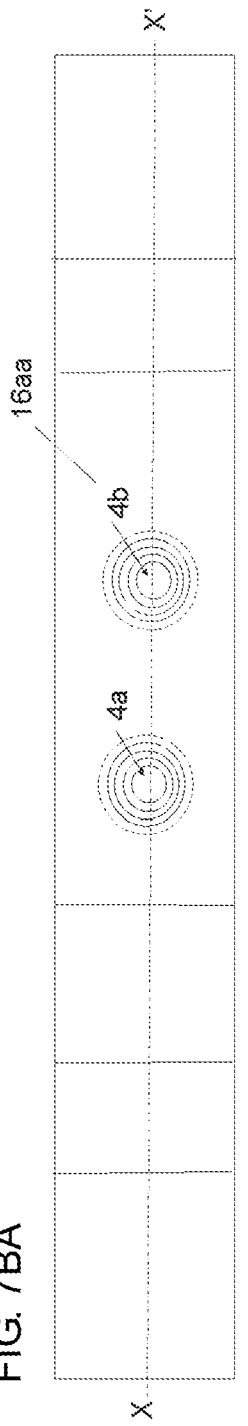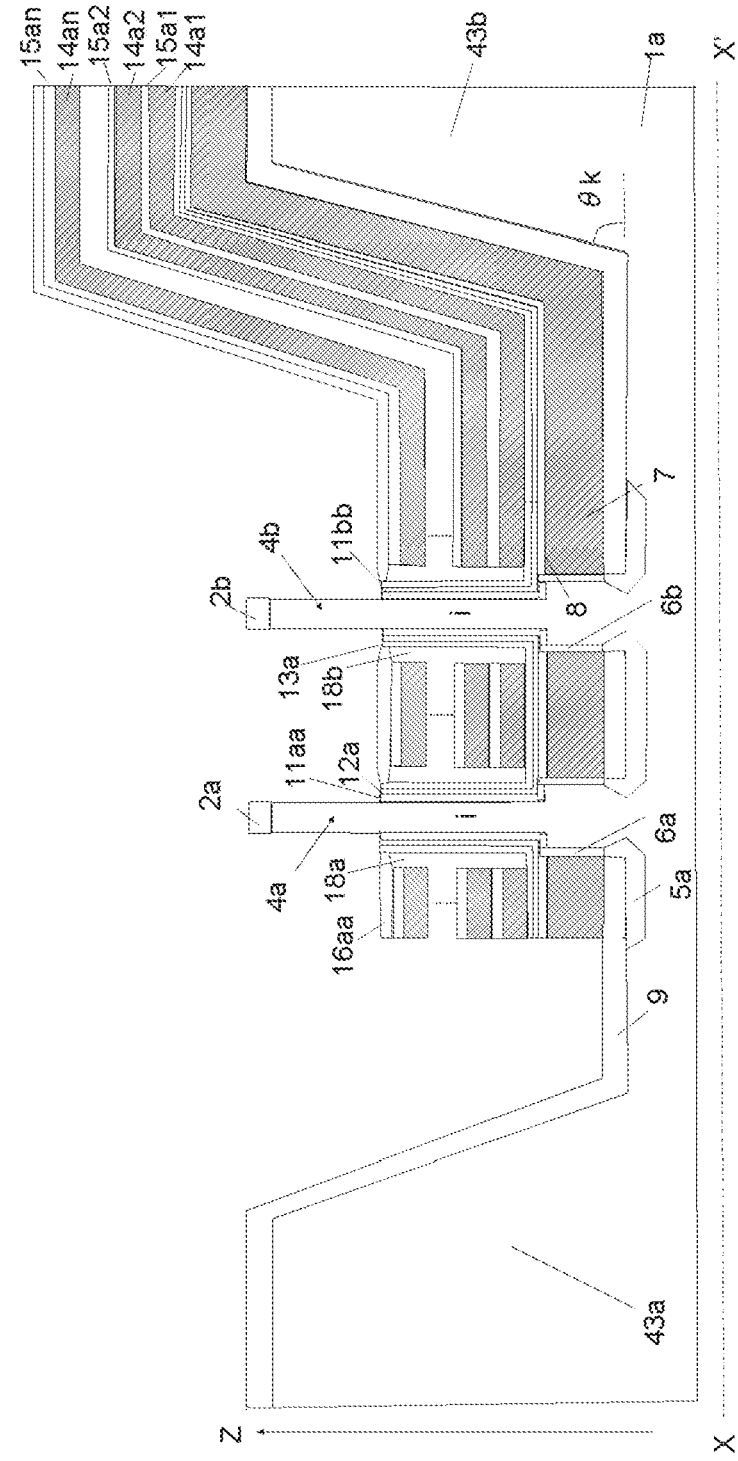
FIG. 7BA
FIG. 7BB

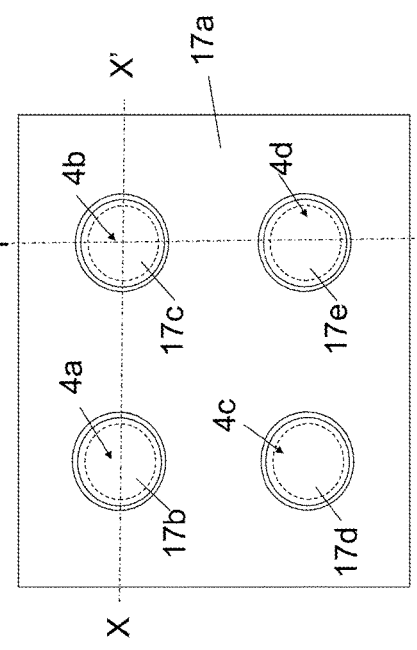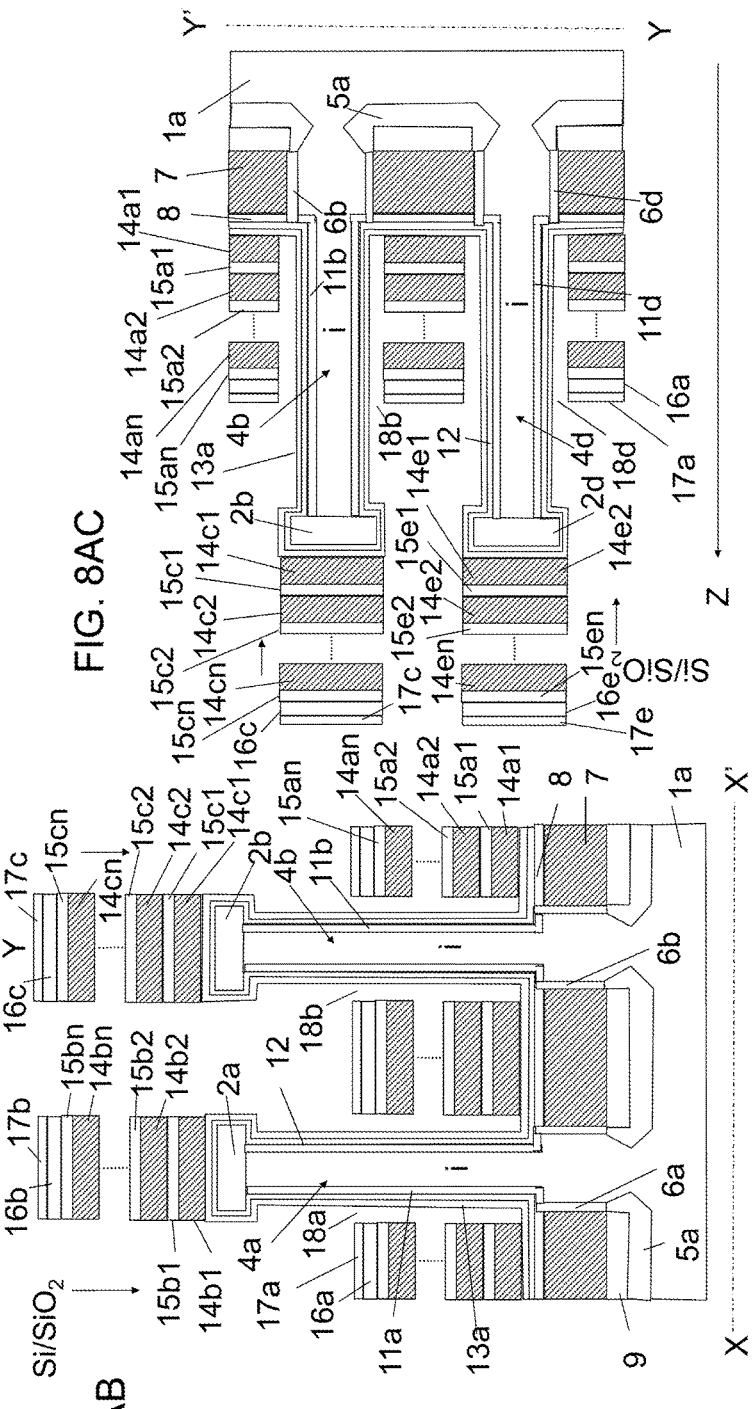

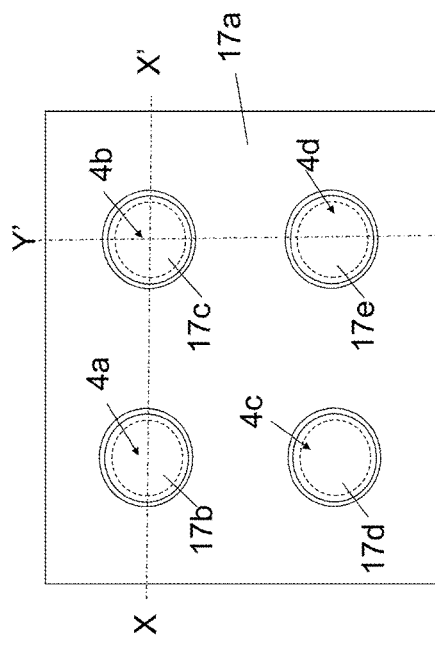
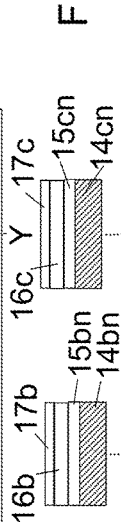
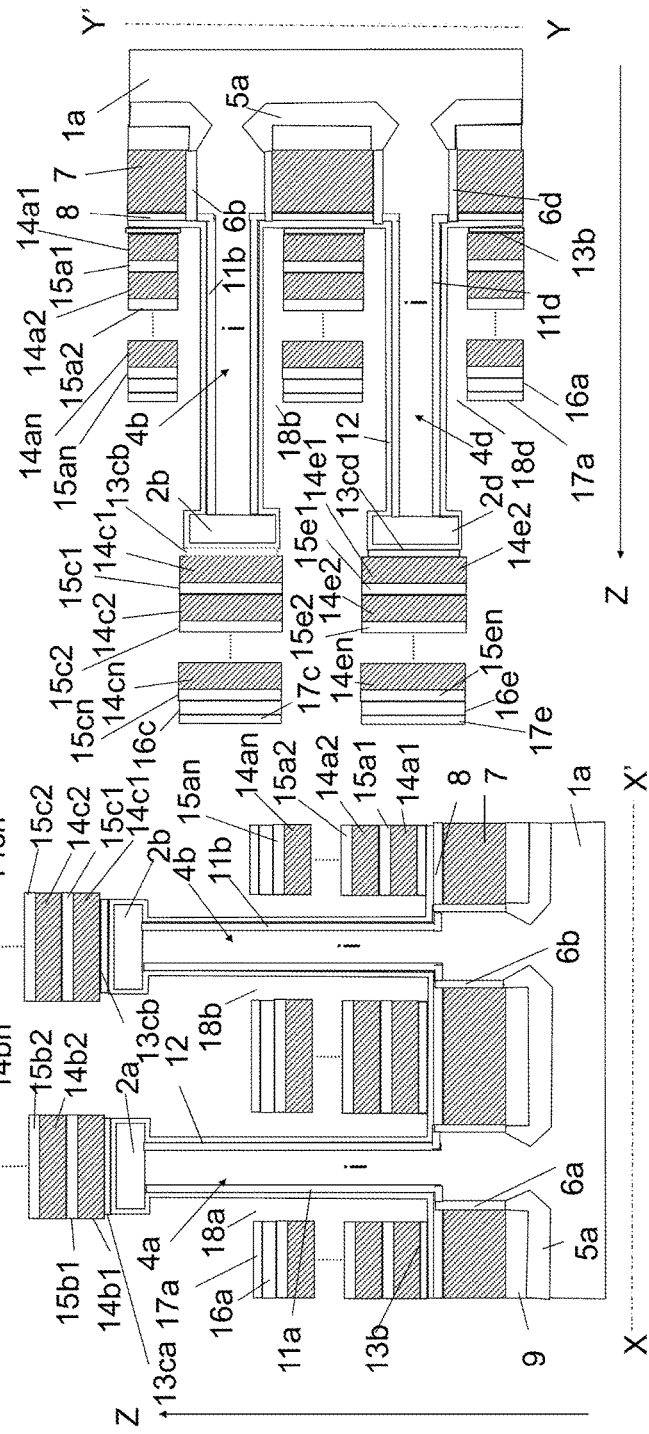
FIG. 8BA
FIG. 8BB
FIG. 8BC

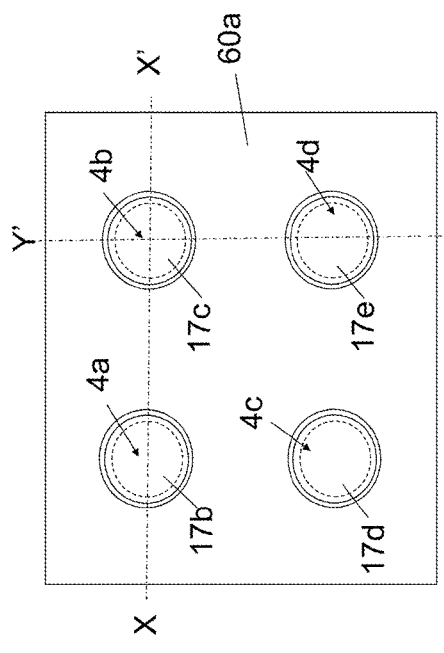
FIG. 10A
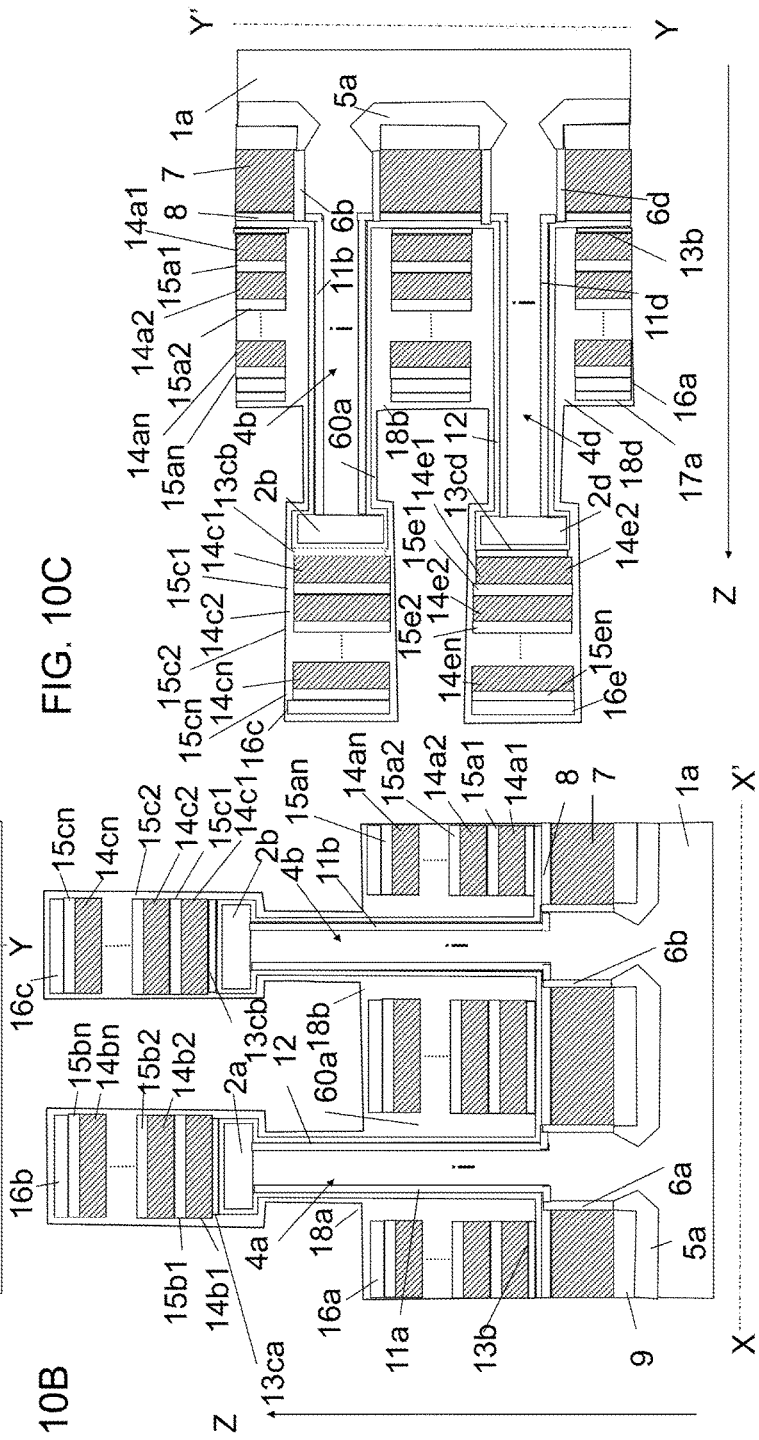
FIG. 10B
FIG. 10C

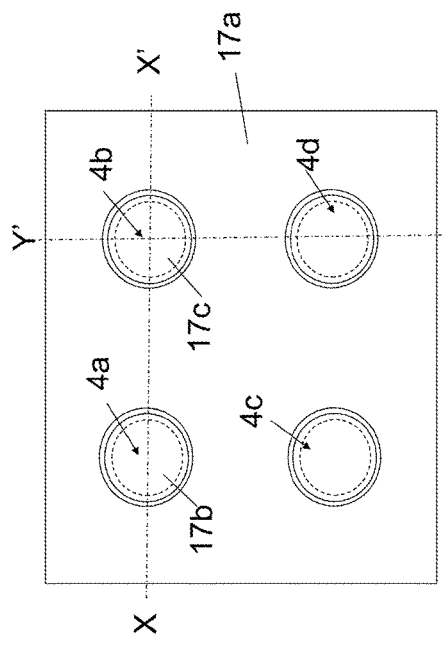
FIG. 11CA
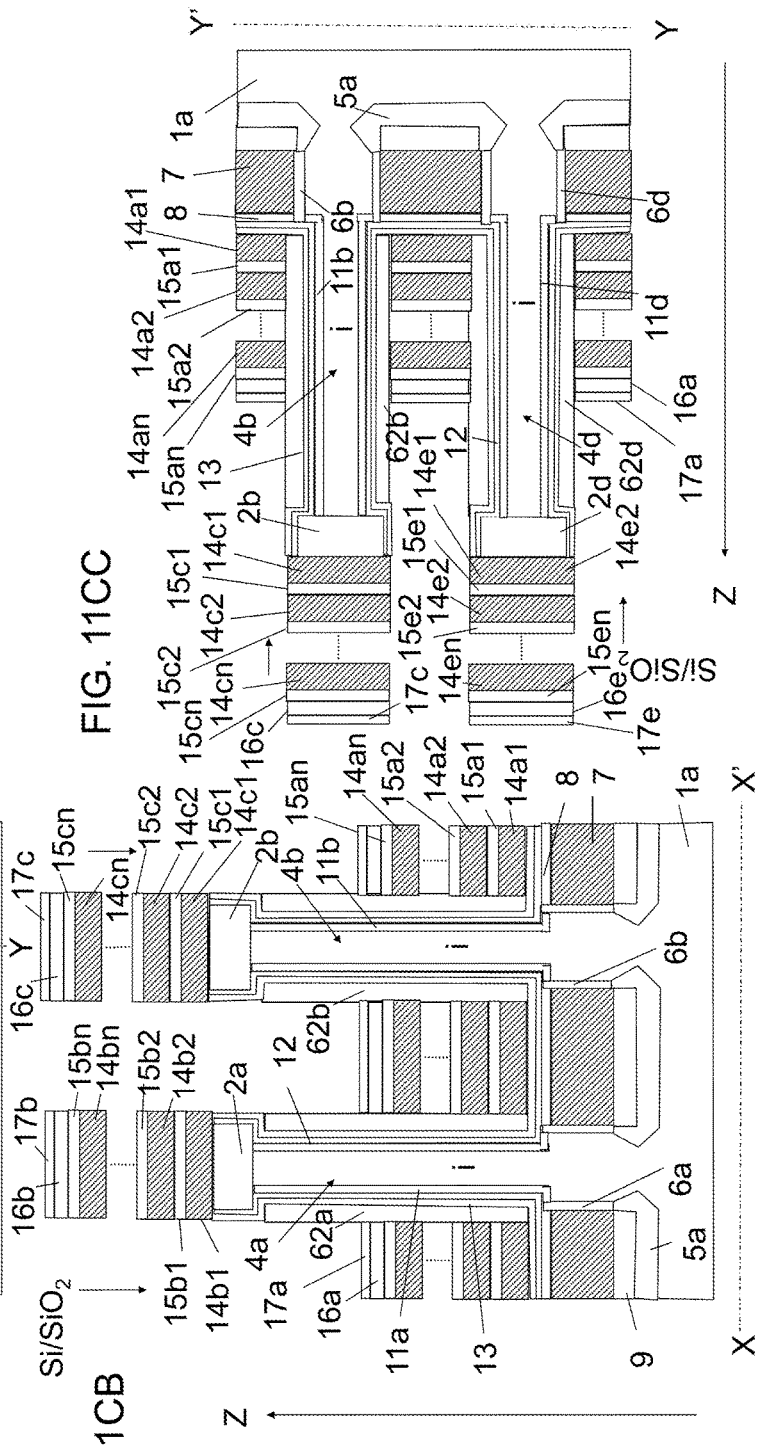
FIG. 11CB
FIG. 11CC

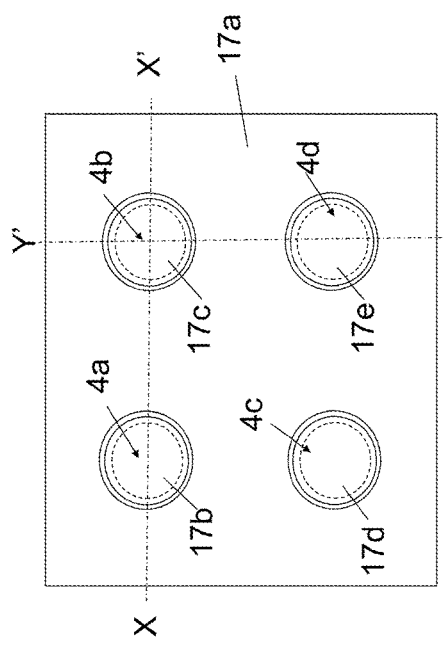
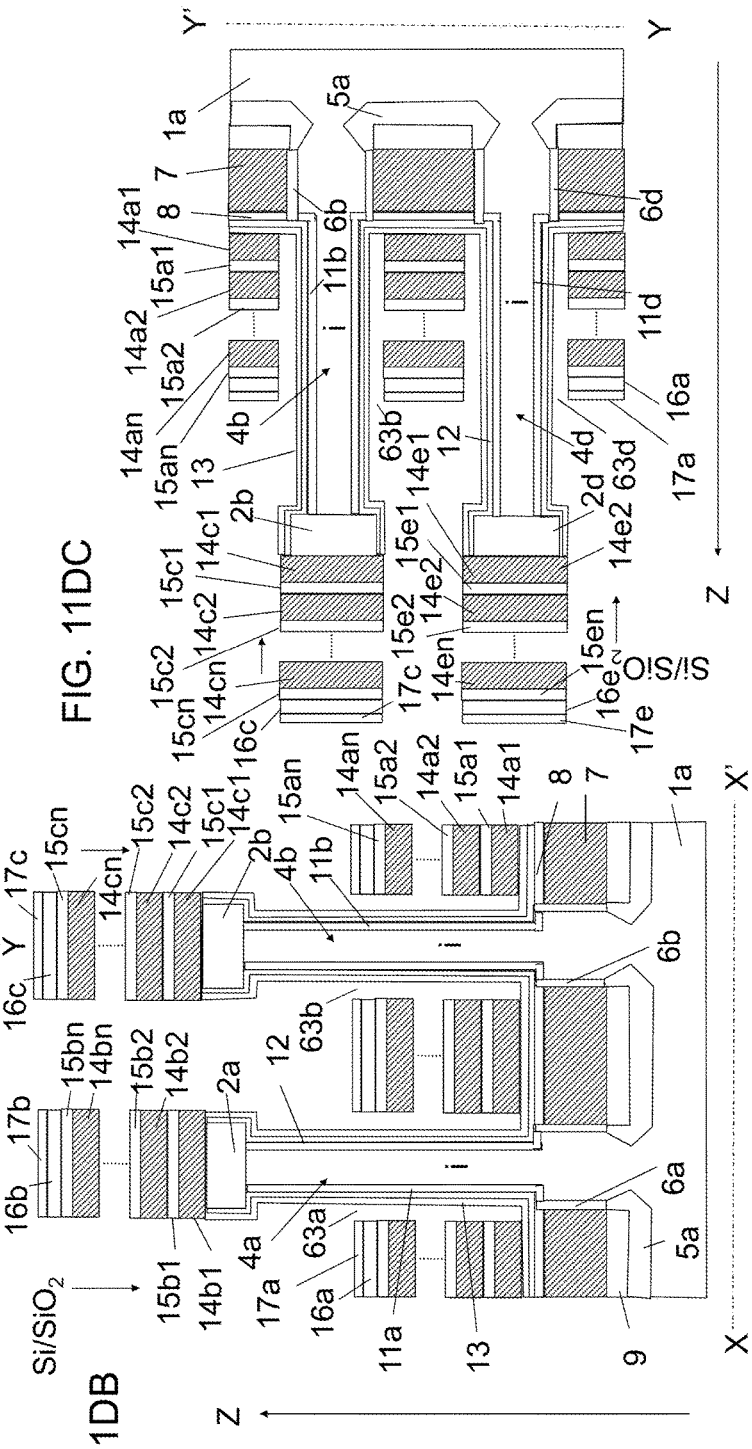
FIG. 11DA
FIG. 11DB
FIG. 11DC

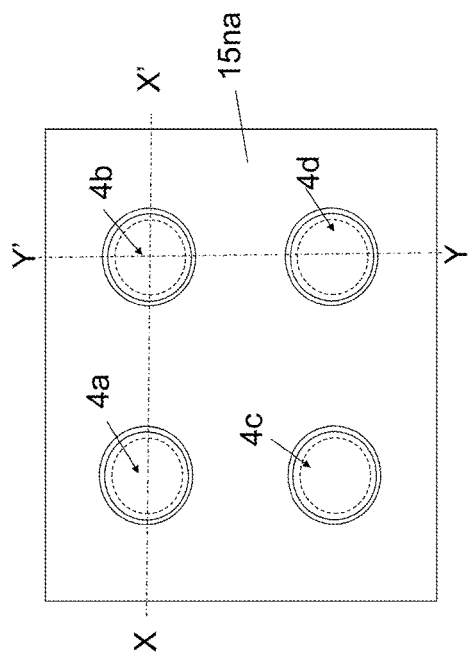
FIG. 12A
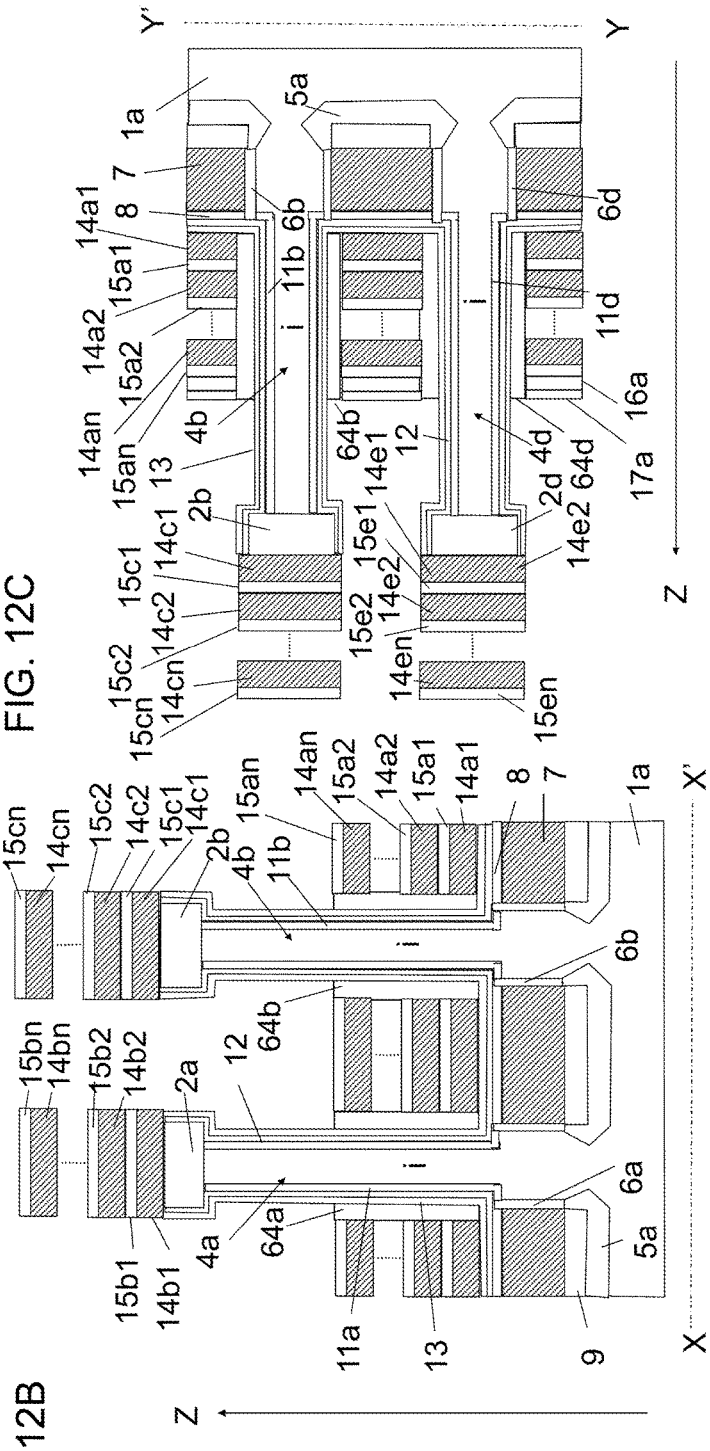
FIG. 12B
FIG. 12C

US 10,651,189 B2

METHOD FOR PRODUCING PILLAR-SHAPED SEMICONDUCTOR MEMORY DEVICE

CROSS REFERENCES TO RELATED APPLICATION

The present application is a continuation-in-part of U.S. divisional application Ser. No. 15/679,357, filed Aug. 17, 2017, which is a U.S. divisional application of U.S. application Ser. No. 15/164,266, filed May 25, 2016, now U.S. Pat. No. 9,773,801, which is a continuation of PCT/JP2014/055499, filed Mar. 4, 2014, the entire contents of which are incorporated herein by reference.

BACKGROUND

1. Technical Field

The present invention relates to a pillar-shaped semiconductor memory device which is a memory device formed in a pillar-shaped semiconductor, and a method for producing the device.

2. Description of the Related Art

In recent years, electronic devices using a memory device typified by a flash memory have been used in various fields, and the market size and application fields of the devices have been further expanding. With these circumstances, the realization of highly integrated memory devices and a reduction in the cost of the memory devices have been desired.

NAND-type flash memories (refer to, for example, C. Y. Ting, V. J. Vivalda, and H. G. Schaefer: "Study of planarized sputter-deposited $SiO_2$", J. Vac. Sci. Technol. 15(3), p.p. 1105-1112, May/June (1978)) are advantageous in the realization of highly integrated devices and a reduction in the cost of the devices. Vertical NAND-type flash memories in which a plurality of memory cell-transistors are stacked around a semiconductor silicon pillar (hereinafter, a semiconductor silicon pillar is referred to as "Si pillar") realize more highly integrated devices (refer to, for example, Japanese Unexamined Patent Application Publication No. 4-79369).

FIG. 13 illustrates a sectional structure of an example of a vertical NAND-type flash memory in the related art (refer to, Japanese Unexamined Patent Application Publication No. 4-79369). Silicon (Si) pillars 101a and 101b are formed on an intrinsic semiconductor silicon substrate 100 (hereinafter, an intrinsic semiconductor silicon substrate is referred to as "i-layer substrate"). Silicon dioxide ($SiO_2$) layers 102a and 102b which are tunnel insulating layers are formed so as to surround outer peripheries of the Si pillars 101a and 101b, respectively. Floating electrodes 103a and 103b that electrically float are formed so as to surround outer peripheries of the $SiO_2$ layers 102a and 102b, respectively. Source-side selection gate electrodes 104a and 104b are formed around lower portions of the Si pillars 101a and 101b, respectively. Drain-side selection gate electrodes 105a and 105b are formed around upper portions of the Si pillars 101a and 101b, respectively. Interlayer $SiO_2$ layers 107a and 107b are formed so as to surround outer peripheries of the floating electrodes 103a and 103b, respectively. Word-line electrodes 108a and 108b are formed so as to surround outer peripheries of the interlayer $SiO_2$ layers 107a and 107b, respectively. A common source $N^+$ layer 109 (hereinafter, a semiconductor layer containing a donor impurity in a large amount is referred to as "$N^+$ layer") is formed in a surface layer of the i-layer substrate 100, the surface layer being connected to bottom portions of the Si pillars 101a and 101b. Drain $N^+$ layers 110a and 110b are formed in top portions of the Si pillars 101a and 101b, respectively. A $SiO_2$ layer 111 is further formed by chemical vapor deposition (CVD) so as to cover the whole. Bit-line wiring metal layers 113a and 113b are respectively formed through contact holes 112a and 112b formed on the drain $N^+$ layers 110a and 110b. Furthermore, $P^-$ layers 114a and 114b (hereinafter, a semiconductor layer containing an acceptor impurity in a small amount is referred to as "$P^-$ layer") are respectively formed in the Si pillars 101a and 101b on the i-layer substrate 100. Memory cell-transistors Qc1 including the $SiO_2$ layers 102a and 102b, the floating electrodes 103a and 103b, the interlayer $SiO_2$ layers 107a and 107b, and the word-line electrodes 108a and 108b are respectively formed on the source-side selection gate electrodes 104a and 104b of the Si pillars 101a and 101b so as to surround outer peripheries of the $P^-$ layers 114a and 114b. Memory cell-transistors Qc2 and Qc3 that have the same structure as the memory cell-transistor Qc1 and that are electrically separated from each other are formed on the memory cell-transistor Qc1. Furthermore, source-side selection transistors Qs1 having the source-side selection gate electrodes 104a and 104b are formed below the memory cell-transistors Qc1, Qc2, and Qc3. Drain-side selection transistors Qs2 having the drain-side selection gate electrodes 105a and 105b are formed above the memory cell-transistors Qc1, Qc2, and Qc3. With this structure, a vertical NAND-type flash memory element having a high density is formed.

In the vertical NAND-type flash memory element illustrated in FIG. 13, it is desirable to easily form the $SiO_2$ layers 102a and 102b which are tunnel insulating layers, the interlayer $SiO_2$ layers 107a and 107b, the source-side selection gate electrodes 104a and 104b, the drain-side selection gate electrodes 105a and 105b, the floating electrodes 103a and 103b, and the word-line electrodes 108a and 108b, all of which have less defects and high reliability so as to surround outer peripheral portions of the Si pillars 101a and 101b, respectively.

A known vertical NAND-type flash memory is produced by repeatedly stacking word-line electrode material layers and insulation films in a vertical direction, subsequently forming a through-hole passing through the stacked word-line electrode material layers and the insulation films, subsequently forming an interlayer insulation film, a $Si_3N_4$ layer (silicon nitride layer) that stores data charges, and a tunnel $SiO_2$ layer on a surface layer of a side face of the through-hole, and further filling the through-hole with a poly-Si layer (hereinafter, a polycrystalline Si layer is referred to as "poly-Si layer") which is to become a channel (refer to, for example, the specification of U. S. Patent Application Publication No. 2007/0252201). Also in this vertical NAND-type flash memory, it is desirable to easily form the interlayer insulation film, the $Si_3N_4$ layer, the tunnel $SiO_2$ layer, and the word-line electrodes, all of which have less defects and high reliability.

In the vertical NAND-type flash memory illustrated in FIG. 13, it is desirable to easily form the $SiO_2$ layers 102a and 102b, the interlayer $SiO_2$ layers 107a and 107b, the source-side selection gate electrodes 104a and 104b, the drain-side selection gate electrodes 105a and 105b, the floating electrodes 103a and 103b, and the word-line electrodes 108a and 108b, all of which have less defects and high reliability so as to surround outer peripheral portions of the Si pillars 101a and 101b.

SUMMARY

A pillar-shaped semiconductor memory device according to a first aspect of the present invention includes a semiconductor substrate; a first semiconductor pillar disposed on the semiconductor substrate and extending in a direction perpendicular to a surface of the semiconductor substrate; a tunnel insulating layer surrounding an outer periphery of the first semiconductor pillar; a data charge storage insulating layer surrounding an outer periphery of the tunnel insulating layer; a first interlayer insulating layer surrounding an outer periphery of the data charge storage insulating layer; a space surrounding an outer periphery of the first interlayer insulating layer; at least one stacked material layer that surrounds an outer periphery of the space and that is formed in a direction perpendicular to the surface of the semiconductor substrate, the stacked material layer including a first conductor layer and a second interlayer insulating layer; and a second conductor layer that is formed on the outer periphery of the first semiconductor pillar and on the at least one stacked material layer, that supports a side face of the first interlayer insulating layer, and that seals the space. In the pillar-shaped semiconductor memory device, the first interlayer insulating layer and the space insulate the first conductor layer from the data charge storage insulating layer. The first interlayer insulating layer insulates the second conductor layer from the data charge storage insulating layer. Data writing and erasing due to data charge transfer between the first semiconductor pillar and the data charge storage insulating layer through the tunnel insulating layer or data charge retention by the data charge storage insulating layer is performed by application of a voltage to the first conductor layer.

The at least one stacked material layer preferably includes a plurality of stacked material layers. The pillar-shaped semiconductor memory device preferably further includes a first gate insulating layer formed below the stacked material layers and surrounding the outer periphery of the first semiconductor pillar, a third conductor layer surrounding an outer periphery of the first gate insulating layer, a first impurity region formed below the third conductor layer and in a bottom portion of the first semiconductor pillar and containing a donor or acceptor impurity, a second gate insulating layer formed above the stacked material layers and surrounding the outer periphery of the first semiconductor pillar, a fourth conductor layer surrounding an outer periphery of the second gate insulating layer, and a second impurity region formed in a top portion of the first semiconductor pillar and having the same conductivity type as the first impurity region. Preferably, the first conductor layer of each of the stacked material layers is connected to a word-line wiring metal layer, the third conductor layer is connected to a source-side selection gate wiring metal layer, the first impurity region is connected to a common source wiring metal layer, the fourth conductor layer is connected to a drain-side selection gate wiring metal layer, and the second impurity region is connected to a bit-line wiring metal layer to form a NAND-type flash memory element in the first semiconductor pillar.

An outer peripheral edge of the first semiconductor pillar is preferably disposed inside an outer peripheral edge of the space in plan view.

The pillar-shaped semiconductor memory device preferably further includes a first outer peripheral semiconductor region formed in an outer periphery of a memory element region in which the first semiconductor pillar is formed; a second semiconductor pillar which is formed in a second outer peripheral semiconductor region included in the first outer peripheral semiconductor region, whose top portion has a height substantially equal to that of a top portion of the first semiconductor pillar, and whose bottom surface has a height substantially equal to that of a bottom surface of the fourth conductor layer; a third gate insulating layer surrounding an outer periphery of the second semiconductor pillar; a fifth conductor layer which is formed so as to surround an outer periphery of the third gate insulating layer, and whose upper and lower ends have heights substantially equal to those of upper and lower ends of the fourth conductor layer; a third impurity region formed above the fifth conductor layer and in a top portion of the second semiconductor pillar and containing a donor or acceptor impurity; and a fourth impurity region formed below the fifth conductor layer and in a bottom portion of the second semiconductor pillar and having the same conductivity type as the third impurity region. A surrounding gate MOS transistor (SGT) is preferably formed in which when one of the third impurity region and the fourth impurity region functions as a source, the other functions as a drain, the second semiconductor pillar disposed between the third impurity region and the fourth impurity region functions as a channel, and the fifth conductor layer functions as a gate.

The pillar-shaped semiconductor memory device preferably further includes a third interlayer insulating layer that is formed on the semiconductor substrate so as to surround the outer periphery of the first semiconductor pillar, and that extends to a side face and an upper surface of the first outer peripheral semiconductor region; and a contact hole connected to an upper surface of the first conductor layer of one of the stacked material layers that have an upper surface on an upper end of a side face of the first outer peripheral semiconductor region. The stacked material layers are preferably formed on the third interlayer insulating layer. An upper surface of the stacked material layers preferably has a height substantially equal to that of an upper surface of the third interlayer insulating layer located on the first outer peripheral semiconductor region. The first conductor layer and the word-line wiring metal layer are preferably connected to each other through the contact hole.

A method for producing a pillar-shaped semiconductor memory device according to a second aspect of the present invention includes a mask insulating layer-forming step of forming, on a semiconductor substrate, a mask insulating layer having a circular shape in plan view; a first semiconductor pillar-forming step of forming a first semiconductor pillar by etching the semiconductor substrate using the mask insulating layer as a mask to form a semiconductor pillar on the semiconductor substrate, and retracting a side face of the semiconductor pillar to the inside of the semiconductor pillar; a tunnel insulating layer-forming step of forming a tunnel insulating layer so as to surround an outer periphery of the first semiconductor pillar; a data charge storage insulating layer-forming step of forming a data charge storage insulating layer so as to surround an outer periphery of the tunnel insulating layer; a first interlayer insulating layer-forming step of forming a first interlayer insulating layer so as to surround an outer periphery of the data charge storage insulating layer; a first conductor layer-forming step of forming a first conductor layer on the outer periphery of the first semiconductor pillar and above the semiconductor substrate by allowing a material atom to be incident from a direction perpendicular to an upper surface of the mask insulating layer; a second interlayer insulating layer-forming step of forming a second interlayer insulating layer by allowing a material atom to be incident on the first conductor layer from a direction perpendicular to the upper surface of the mask insulating layer; a space-forming step of forming a space between a side face of the first interlayer insulating layer and side faces of the first conductor layer and the second interlayer insulating layer in parallel with the first conductor layer-forming step and the second interlayer insulating layer-forming step; and a stacked material layer-forming step of forming at least one stacked material layer in a direction perpendicular to an upper surface of the semiconductor substrate, the stacked material layer including the first conductor layer and the second interlayer insulating layer as one set. In the method, data writing and erasing due to data charge transfer between the first semiconductor pillar and the data charge storage insulating layer through the tunnel insulating layer or data charge retention by the data charge storage insulating layer is performed by application of a voltage to the first conductor layer.

The method preferably further includes a second conductor layer-forming step of forming a second conductor layer on the outer periphery of the first semiconductor pillar and on the at least one stacked material layer by allowing a material atom to be incident from a direction perpendicular to the upper surface of the mask insulating layer; and a second conductor layer-first interlayer insulating layer-connecting step of connecting the second conductor layer to the first interlayer insulating layer by expanding the second conductor layer by heat treatment in a direction parallel to the upper surface of the semiconductor substrate.

In the method, between the stacked material layer-forming step and the second conductor layer-first interlayer insulating layer-connecting step, heat treatment is preferably performed in an atmosphere containing hydrogen.

In the method, between the stacked material layer-forming step and the second conductor layer-first interlayer insulating layer-connecting step, heat treatment is preferably performed in an atmosphere containing oxygen to form an oxide insulating layer in a surface layer of a side face of the first conductor layer.

The method preferably includes a truncated cone-shaped mask insulating layer-forming step of forming, as the mask insulating layer, a truncated cone-shaped mask insulating layer having a truncated cone shape on the first semiconductor pillar; and a cone-shaped stacked material layer-forming step of depositing a material atom by allowing the material atom to be incident from a direction perpendicular to the upper surface of the semiconductor substrate under a condition in which a deposition rate of the material atom on a side face of the truncated cone-shaped mask insulating layer is lower than a removal rate of the material atom to form the at least one stacked material layer above the semiconductor substrate and to form, on the truncated cone-shaped mask insulating layer, a cone-shaped stacked material layer having a conical shape and formed of a material layer common to the at least one stacked material layer.

The method preferably further includes a first gate insulating layer-forming step of forming a first gate insulating layer below the at least one stacked material layer so as to surround the outer periphery of the first semiconductor pillar; a third conductor layer-forming step of forming a third conductor layer so as to surround an outer periphery of the first gate insulating layer; a first impurity region-forming step of forming a first impurity region below the third conductor layer and in a bottom portion of the first semiconductor pillar, the first impurity region containing a donor or acceptor impurity; a second gate insulating layer-forming step of forming a second gate insulating layer above the at least one stacked material layer so as to surround the outer periphery of the first semiconductor pillar; a fourth conductor layer-forming step of forming a fourth conductor layer so as to surround an outer periphery of the second gate insulating layer; and a second impurity region-forming step of forming a second impurity region above the fourth conductor layer, the second impurity region having the same conductivity type as the first impurity region. Preferably, the first conductor layer of the at least one stacked material layer is connected to a word-line wiring metal layer, the third conductor layer is connected to a source-side selection gate wiring metal layer, the first impurity region is connected to a common source wiring metal layer, the fourth conductor layer is connected to a drain-side selection gate wiring metal layer, and the second impurity region is connected to a bit-line wiring metal layer to form a NAND-type flash memory element in the first semiconductor pillar.

The method preferably further includes a first outer peripheral semiconductor region-forming step of forming a first outer peripheral semiconductor region in an outer periphery of a memory element region in which the first semiconductor pillar is formed; a second semiconductor pillar-forming step of forming, in a second outer peripheral semiconductor region included in the first outer peripheral semiconductor region, a second semiconductor pillar whose top portion has a height substantially equal to that of a top portion of the first semiconductor pillar, and whose bottom surface has a height substantially equal to that of a bottom surface of the fourth conductor layer; a third gate insulating layer-forming step of forming a third gate insulating layer so as to surround an outer periphery of the second semiconductor pillar; a fifth conductor layer-forming step of forming a fifth conductor layer whose upper and lower ends have heights substantially equal to those of upper and lower ends of the fourth conductor layer in a direction perpendicular to the semiconductor substrate so as to surround an outer periphery of the third gate insulating layer; a third impurity region-forming step of forming a third impurity region above the fifth conductor layer and in a top portion of the second semiconductor pillar, the third impurity region containing a donor or acceptor impurity; and a fourth impurity region-forming step of forming a fourth impurity region below the fifth conductor layer and in a bottom portion of the second semiconductor pillar, the fourth impurity region having the same conductivity type as the third impurity region. A surrounding gate MOS transistor (SGT) is preferably formed in which when one of the third impurity region and the fourth impurity region functions as a source, the other functions as a drain, the second semiconductor pillar disposed between the third impurity region and the fourth impurity region functions as a channel, and the fifth conductor layer function as a gate.

The method preferably further includes a third interlayer insulating layer-forming step of forming a third interlayer insulating layer on the semiconductor substrate so as to surround the outer periphery of the first semiconductor pillar, the third interlayer insulating layer extending to a side face and an upper surface of the first outer peripheral semiconductor region; and a contact hole-forming step of forming a contact hole so as to be connected to an upper surface of the first conductor layer of the at least one stacked material layer that has an upper surface on an upper end of a side face of the second outer peripheral semiconductor region. The at least one stacked material layer is preferably formed on the third interlayer insulating layer. An upper surface of the at least one stacked material layer preferably has a height substantially equal to that of an upper surface of the third interlayer insulating layer located on the first outer peripheral semiconductor region. The first conductor layer and the word-line wiring metal layer are preferably connected to each other through the contact hole.

According to the aspects of the present invention, a pillar-shaped semiconductor memory device having high reliability and a high density can be provided at a low cost.

BRIEF DESCRIPTION OF THE DRAWING

FIG. 1 is a circuit diagram of a vertical NAND-type flash memory device according to a first embodiment of the present invention.

FIG. 2FA and FIGS. 2FB and 2FC are respectively a plan view and sectional structural views illustrating a vertical NAND-type flash memory device according to the first embodiment and a method for producing the device.

FIG. 2GA and FIGS. 2GB and 2GC are respectively a plan view and sectional structural views illustrating a vertical NAND-type flash memory device according to the first embodiment and a method for producing the device.

FIG. 2IA and FIGS. 2IB and 2IC are respectively a plan view and sectional structural views illustrating a vertical NAND-type flash memory device according to the first embodiment and a method for producing the device.

FIG. 3A and FIGS. 3B and 3C are respectively a plan view and sectional structural views illustrating a vertical NAND-type flash memory device according to a second embodiment of the present invention and a method for producing the device.

FIG. 4AA and FIGS. 4AB and 4AC are respectively a plan view and sectional structural views illustrating a vertical NAND-type flash memory device according to a third embodiment of the present invention and a method for producing the device.

FIG. 5CA and FIGS. 5CB and 5CC are respectively a plan view and sectional structural views illustrating a vertical NAND-type flash memory device according to the fourth embodiment and a method for producing the device.

FIG. 7AA and FIG. 7AB are respectively a plan view and a sectional structural view illustrating a vertical NAND-type flash memory device according to a sixth embodiment of the present invention and a method for producing the device.

FIG. 7BA and FIG. 7BB are respectively a plan view and a sectional structural view illustrating a vertical NAND-type flash memory device according to the sixth embodiment and a method for producing the device.

FIG. 8AA and FIGS. 8AB and 8AC are respectively a plan view and sectional structural views illustrating a vertical NAND-type flash memory device according to a seventh embodiment of the present invention and a method for producing the device.

FIG. 8BA and FIGS. 8BB and 8BC are respectively a plan view and sectional structural views illustrating a vertical NAND-type flash memory device according to the seventh embodiment and a method for producing the device.

FIG. 10A and FIGS. 10B and 10C are respectively a plan view and sectional structural views illustrating a vertical NAND-type flash memory device according to a ninth embodiment of the present invention and a method for producing the device.

FIG. 11CA and FIGS. 11CB and 11CC are respectively a plan view and sectional structural views illustrating a vertical NAND-type flash memory device according to the tenth embodiment and a method for producing the device.

FIG. 11DA and FIGS. 11DB and 11DC are respectively a plan view and sectional structural views illustrating a vertical NAND-type flash memory device according to the tenth embodiment and a method for producing the device.

FIG. 12A and FIGS. 12B and 12C are respectively a plan view and sectional structural views illustrating a vertical NAND-type flash memory device according to an eleventh embodiment of the present invention and a method for producing the device.

DETAILED DESCRIPTION OF THE PREFERRED EMBODIMENTS

Figure 2A:
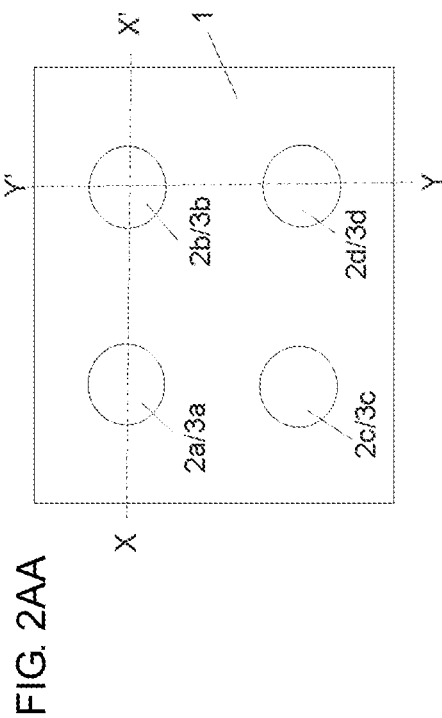
FIG. 2AA and FIGS. 2AB and 2AC are respectively a plan view and sectional structural views illustrating a vertical NAND-type flash memory device according to the first embodiment and a method for producing the device.
Figure 2A:
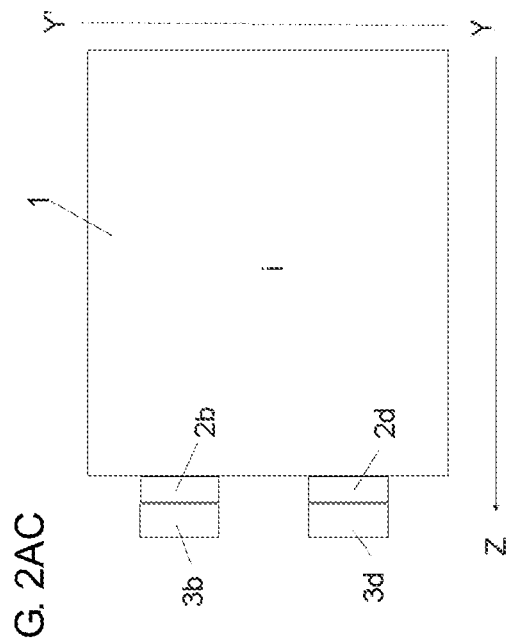
Figure 2A:
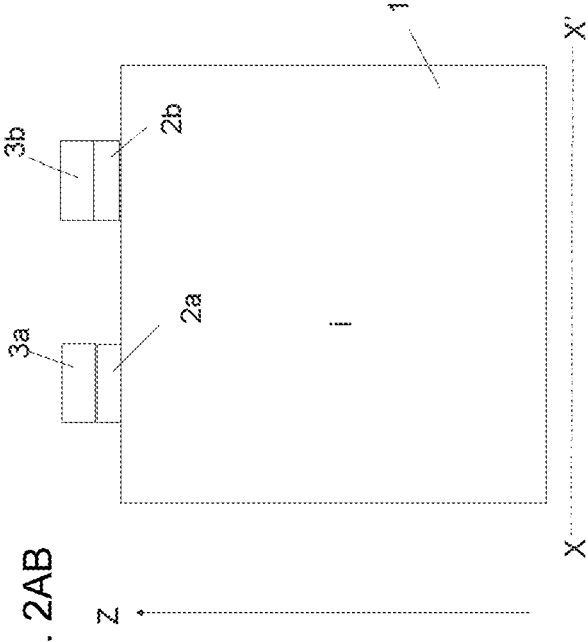

Vertical (pillar structure) NAND-type flash memory devices according to embodiments of the present invention, and methods for producing the devices will now be described with reference to the drawings.

First Embodiment

A method for producing a vertical NAND-type flash memory device according to a first embodiment of the present invention will be described with reference to FIG. 1 and FIGS. 2AA to 2KC.

FIG. 1 illustrates a NAND-type flash memory circuit according to a first embodiment. Gate electrodes of memory cell-transistors WT11, WT12, and WT1n, the number of which is n, and which are connected in series are respectively connected to word lines W1, W2, and Wn, the number of which is n. A source-side selection transistor STS1 and a drain-side selection transistor STD1 are connected to both sides of the memory cell-transistors WT11, WT12, and WT1n, the number of which is n. A gate electrode of the source-side selection transistor STS1 is connected to a source-side selection line SGS. A gate electrode of the drain-side selection transistor STD1 is connected to a drain-side selection line SGD. A source of the source-side selection transistor STS1 is connected to a common source line CSL. A drain of the drain-side selection transistor STD1 is connected to a bit line BL1. Memory cell-transistors WT21, WT22, and WT2n, the number of which is n, and which are connected in series are formed in parallel with the memory cell-transistors WT11, WT12, and WT1n, the number of which is n, and which are connected in series. Gate electrodes of the memory cell-transistors WT21, WT22, and WT2n, the number of which is n are respectively connected to the word lines W1, W2, and Wn. A source-side selection transistor STS2 and a drain-side selection transistor STD2 are respectively connected to the lower side and the upper side of the memory cell-transistors WT21, WT22, and WT2n. A gate electrode of the source-side selection transistor STS2 is connected to the source-side selection line SGS. A gate electrode of the drain-side selection transistor STD2 is connected to the drain-side selection line SGD. A source of the source-side selection transistor STS2 is connected to the common source line CSL. A drain of the drain-side selection transistor STD2 is connected to a bit line BL2. The structure including this circuit is repeatedly formed in a block memory element region.

A method for producing a pillar-shaped semiconductor memory device according to the first embodiment will now be described with reference to FIGS. 2AA to 2KC. In FIGS. 2AA to 2KC, the drawings whose last reference character is A are plan views, the drawings whose last reference character is B are sectional views taken along line X-X' in the drawings whose last reference character is A, and the drawings whose last reference character is C are sectional views taken along line Y-Y' in the drawings whose last reference character is A.

As illustrated in FIGS. 2AA to 2AC, a $Si_3N_4$ film (not shown) is formed on an i-layer substrate 1. A resist film (not shown) is applied onto the $Si_3N_4$ film. Resist layers 3a, 3b, 3c, and 3d each having a circular shape in plan view are formed by a lithographic method. Next, the $Si_3N_4$ film is etched by, for example, a reactive ion etching (RIE) method using the resist layers 3a, 3b, 3c, and 3d as a mask to form $Si_3N_4$ layers 2a, 2b, 2c, and 2d, respectively.

Figure 2B:
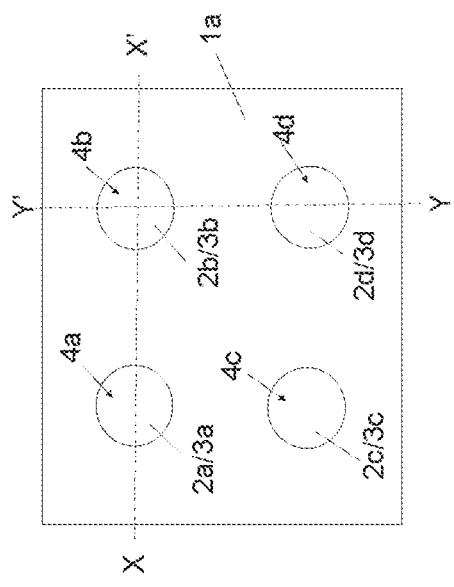
FIG. 2BA and FIGS. 2BB and 2BC are respectively a plan view and sectional structural views illustrating a vertical NAND-type flash memory device according to the first embodiment and a method for producing the device.
Figure 2B:
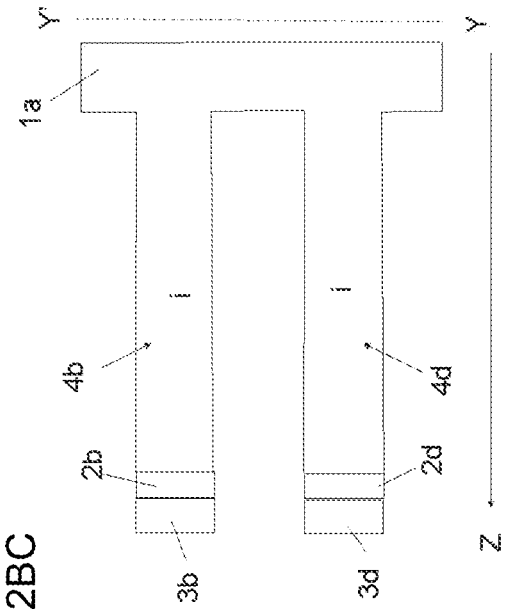
Figure 2B:
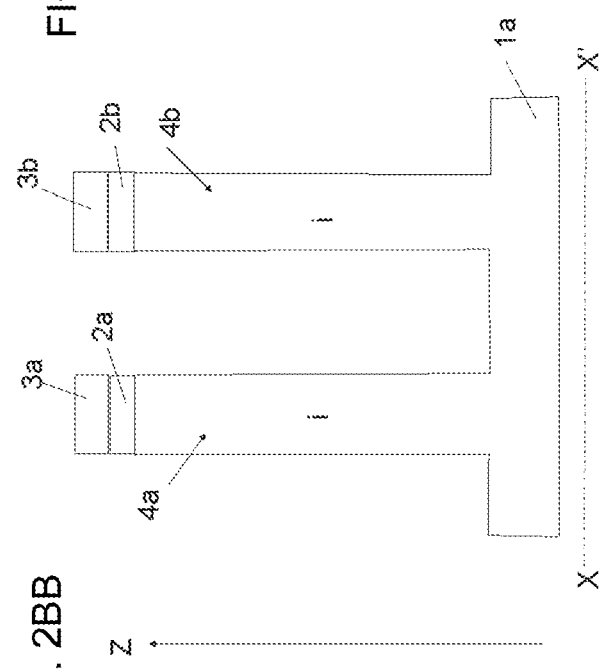

Next, as illustrated in FIGS. 2BA to 2BC, the i-layer substrate 1 is etched by, for example, an RIE method using the resist layers 3a, 3b, 3c, and 3d and the $Si_3N_4$ layers 2a, 2b, 2c, and 2d to form Si pillars 4a, 4b, 4c, and 4d, respectively. The resist layers 3a, 3b, 3c, and 3d are then removed.

Figure 2C:
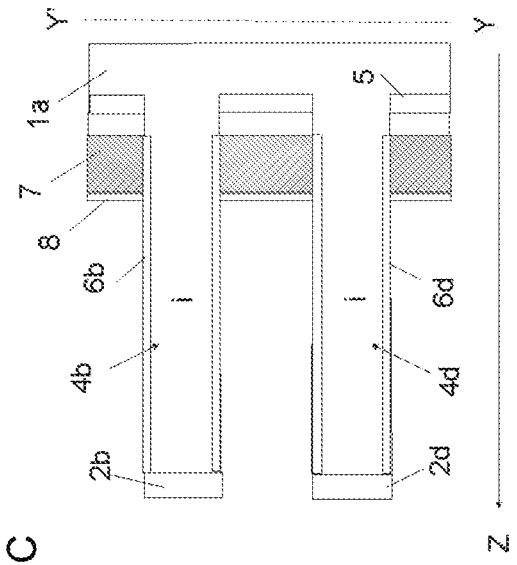
FIG. 2CA and FIGS. 2CB and 2CC are respectively a plan view and sectional structural views illustrating a vertical NAND-type flash memory device according to the first embodiment and a method for producing the device.
Figure 2C:
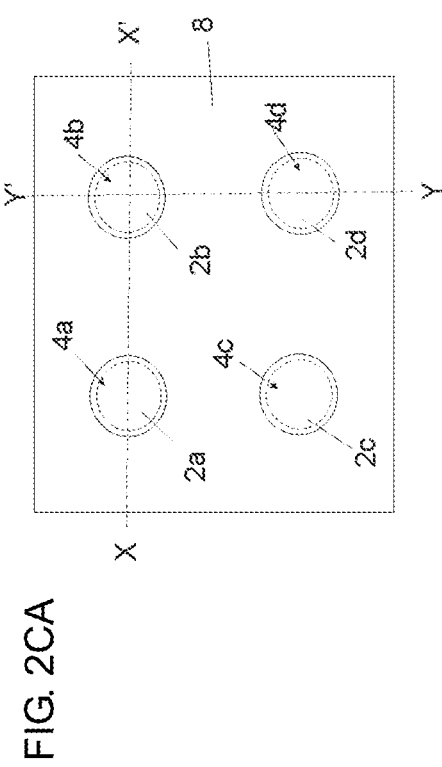
Figure 2C:
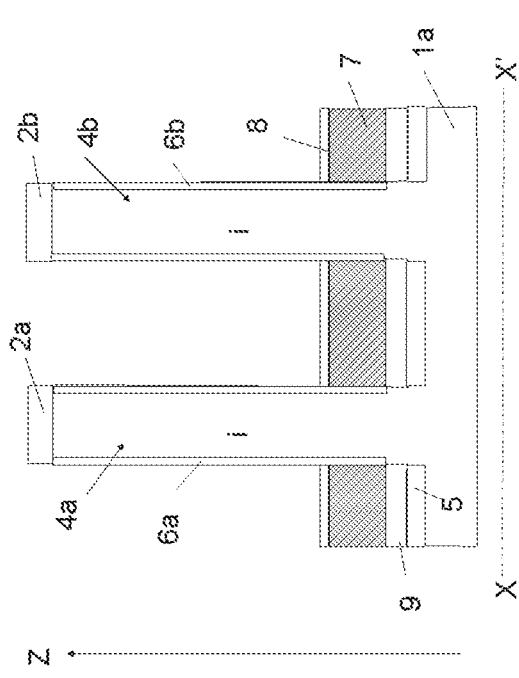

Next, as illustrated in FIGS. 2CA to 2CC, for example, an arsenic (As) ion is implanted into a surface layer of an i-layer substrate 1a disposed on outer peripheries of the Si pillars 4a, 4b, 4c, and 4d to form an $N^+$ layer 5. A $SiO_2$ layer 9 is formed on the i-layer substrate 1a disposed on the outer peripheries of the Si pillars 4a, 4b, 4c, and 4d. Furthermore, $SiO_2$ layers 6a, 6b, 6c, and 6d (the $SiO_2$ layer 6c is not shown in the figures) are formed by, for example, a thermal oxidation method in surface layers of side faces of the Si pillars 4a, 4b, 4c, and 4d. Subsequently, a doped Si layer 7 (hereinafter, a poly-Si layer containing an acceptor or donor impurity is referred to as "doped Si layer") is formed on the $SiO_2$ layer 9 disposed on the outer peripheries of the Si pillars 4a, 4b, 4c, and 4d. Subsequently, a $Si_3N_4$ layer 8 is formed on the doped Si layer 7.

Figure 2D:
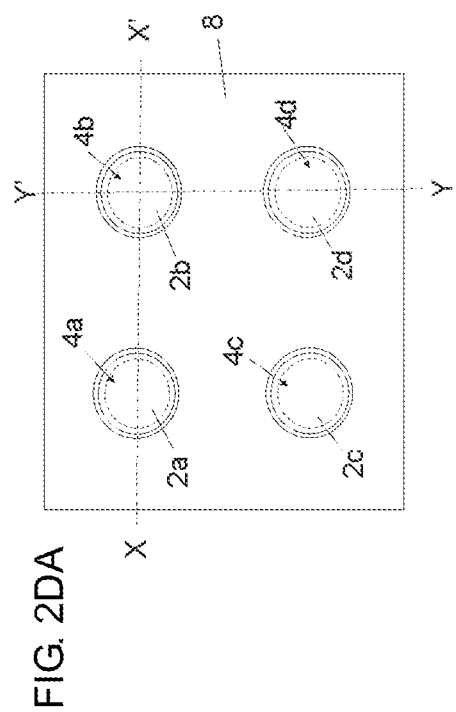
FIG. 2DA and FIGS. 2DB and 2DC are respectively a plan view and sectional structural views illustrating a vertical NAND-type flash memory device according to the first embodiment and a method for producing the device.
Figure 2D:
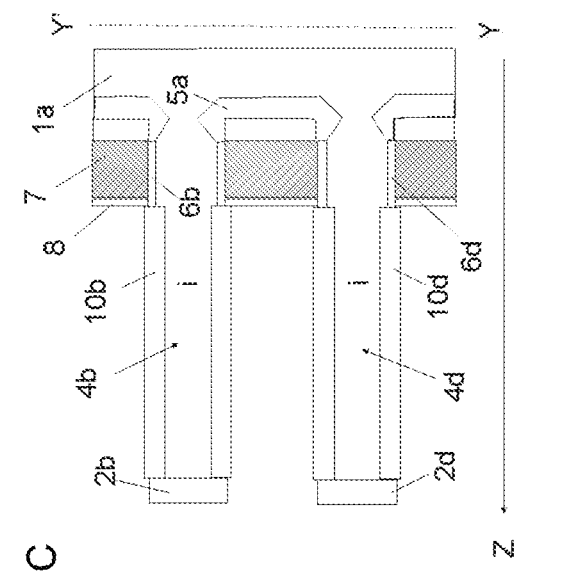
Figure 2D:

Next, as illustrated in FIGS. 2DA to 2DC, $SiO_2$ layers 10a, 10b, 10c, and 10d (the $SiO_2$ layer 10c is not shown in the figures) are formed by a thermal oxidation method so as to have a large thickness in surface layers of side faces of the Si pillars 4a, 4b, 4c, and 4d using the $Si_3N_4$ layers 2a, 2b, 2c, 2d, and 8 as a mask. Subsequently, the $SiO_2$ layers 10a, 10b, 10c, and 10d are removed. The $Si_3N_4$ layers 2a, 2b, 2c, 2d, and 8 are not oxidized by the thermal oxidation method. Therefore, when the $SiO_2$ layers 10a, 10b, 10c, and 10d are removed, the diameter of a cross section of each of the Si pillars 4a, 4b, 4c, and 4d becomes smaller than the diameter of a cross section of each of the $Si_3N_4$ layers 2a, 2b, 2c, and 2d.

Figure 2E:
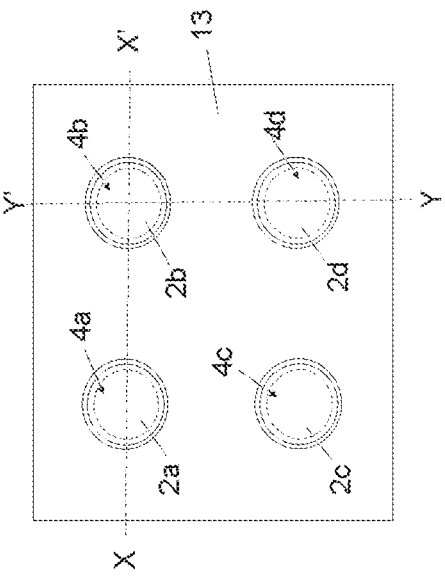
FIG. 2EA and FIGS. 2EB and 2EC are respectively a plan view and sectional structural views illustrating a vertical NAND-type flash memory device according to the first embodiment and a method for producing the device.
Figure 2E:
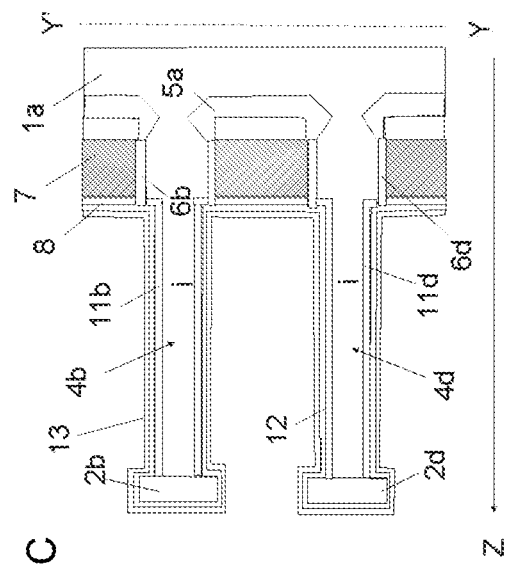
Figure 2E:
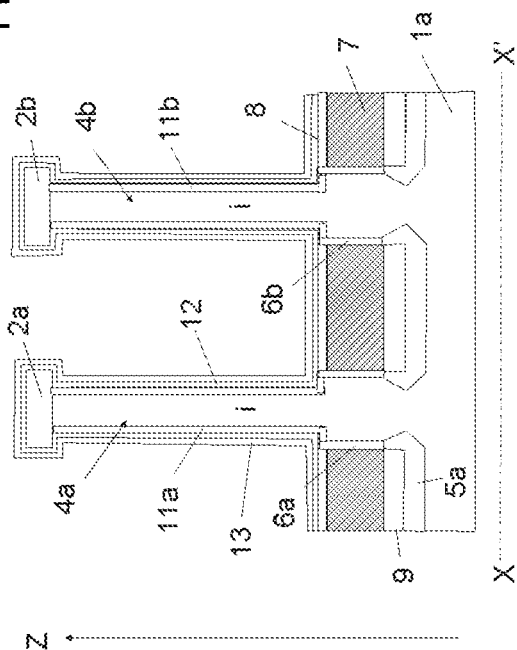

Next, as illustrated in FIGS. 2EA to 2EC, $SiO_2$ layers 11a, 11b, 11c, and 11d (the $SiO_2$ layer 11c is not shown in the figures) which are to become tunnel insulating layers are formed by, for example, a thermal oxidation method in surface layers of the side faces of the Si pillars 4a, 4b, 4c, and 4d. Subsequently, a $Si_3N_4$ layer 12 which is to become a data charge storage insulating layer and a $SiO_2$ layer 13 which is to become an interlayer insulating layer are formed so as to cover the whole.

Next, as illustrated in FIGS. 2FA to 2FC, a Si material that contains a donor or acceptor impurity and a $SiO_2$ material are incident from a direction perpendicular to a surface of the i-layer substrate 1a by using, for example, a bias sputtering method to form doped Si layers 14a1, 14a2, and 14an and $SiO_2$ layers 15a1, 15a2, and 15an on outer peripheries of the Si pillars 4a, 4b, 4c, and 4d. In this embodiment, doped Si layers 14b1, 14b2, 14bn, 14c1, 14c2, 14cn, 14d1, 14d2, 14dn, 14e1, 14e2, and 14en (the doped Si layers 14d1, 14d2, and 14dn are not shown in the figures) and $SiO_2$ layers 15b1, 15b2, 15bn, 15c1, 15c2, 15cn, 15d1, 15d2, 15dn, 15e1, 15e2, and 15en (the $SiO_2$ layers 15d1, 15d2, and 15dn are not shown in the figure) are stacked on the Si pillars 4a, 4b, 4c, and 4d. Subsequently, a TiN (titanium nitride) layer 16a and a $SiO_2$ layer 17a are similarly formed on the outer peripheries of the Si pillars 4a, 4b, 4c, and 4d by using, for example, a bias sputtering method. At the same time, TiN layers 16b, 16c, 16d, and 16e (the TiN layer 16d is not shown in the figures), and $SiO_2$ layers 17b, 17c, 17d, and 17e (the $SiO_2$ layer 17d is not shown in the figure) are stacked on the Si pillars 4a, 4b, 4c, and 4d, respectively. As described above, the Si material that contains a donor or acceptor impurity and the $SiO_2$ material are incident from a direction perpendicular to a surface of the i-layer substrate 1a. Therefore, the $Si_3N_4$ layers 2a, 2b, 2c, and 2d function as a mask, and gas layers (spaces, for example, air layers containing air) 18a, 18b, 18c, and 18d (the gas layer 18c is not shown in the figures) are formed between the side faces of the $SiO_2$ layer 13 formed on the side faces of the Si pillars 4a, 4b, 4c, and 4d and the side faces of the doped Si layers 14a1, 14a2, and 14an and the $SiO_2$ layers 15a1, 15a2, and 15an.

Next, as illustrated in FIGS. 2GA to 2GC, heat treatment is performed at, for example, 550° C. In this step, the $SiO_2$ layer 17a is used as a cap, and the TiN layer 16a is plastically deformed to extend in the horizontal direction of FIG. 2GB. Thus, a TiN layer 16aa that contacts the $SiO_2$ layer 13 is formed. Consequently, gaps of the top portions of the gas layers (spaces) 18a, 18b, 18c, and 18d are sealed with the TiN layer 16aa. Similarly, the TiN layers 16b, 16c, 16d, and 16e on the Si pillars 4a, 4b, 4c, and 4d are also plastically deformed using the $SiO_2$ layers 17b, 17c, 17d, and 17e as a cap, respectively, to extend in the horizontal direction of FIG. 2GB. Thus, TiN layers 16bb, 16cc, 16dd, and 16ee (the TiN layer 16dd is not shown in the figures) are formed.

Figure 2H:
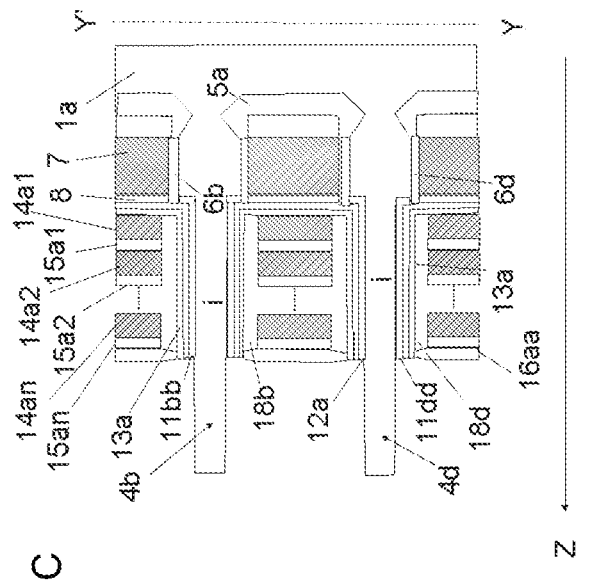
FIG. 2HA and FIGS. 2HB and 2HC are respectively a plan view and sectional structural views illustrating a vertical NAND-type flash memory device according to the first embodiment and a method for producing the device.
Figure 2H:
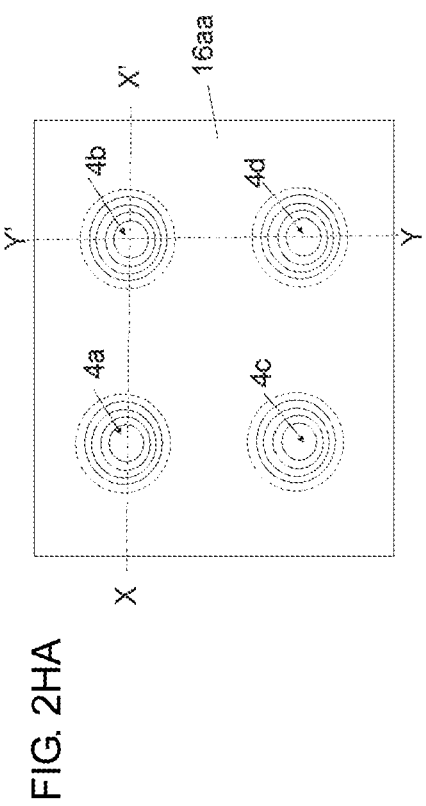
Figure 2H:
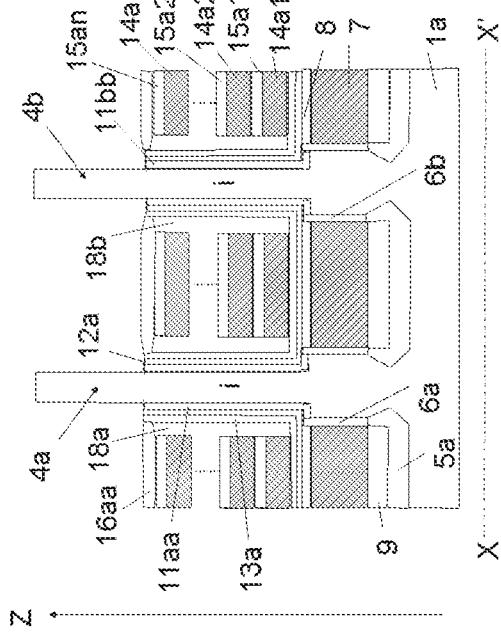
Figure 21A:
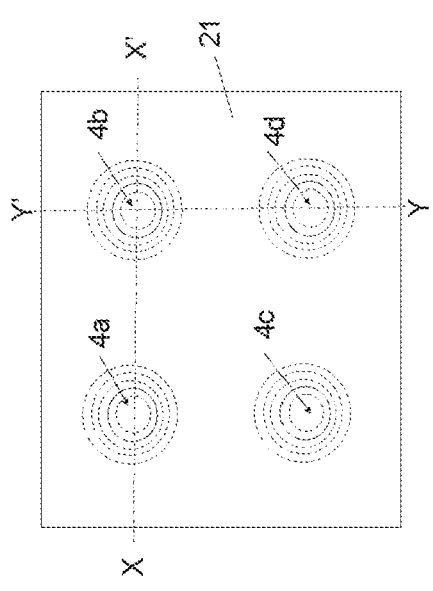
Figure 21C:
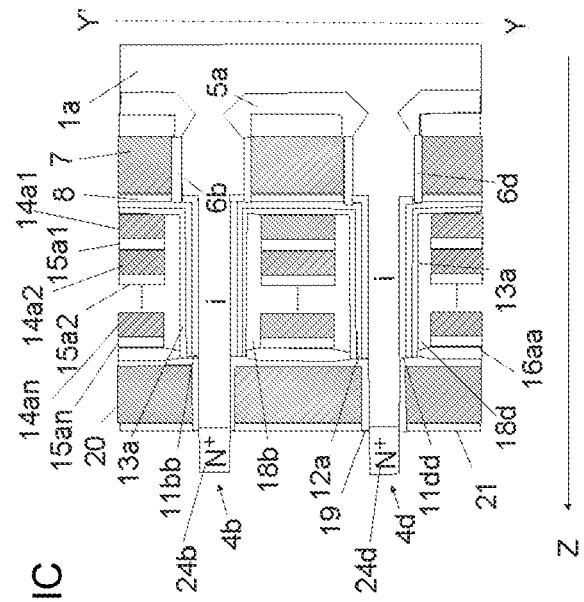
Figure 21B:
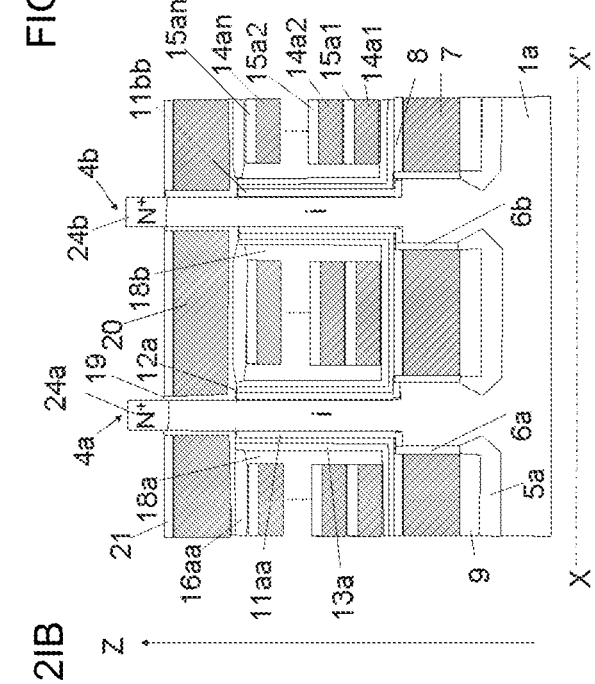

Next, as illustrated in FIGS. 2HA to 2HC, the doped Si layers 14b1, 14b2, 14bn, 14c1, 14c2, 14cn, 14d1, 14d2, 14dn, 14e1, 14e2, and 14en, the $SiO_2$ layers 15b1, 15b2, 15bn, 15c1, 15c2, 15cn, 15d1, 15d2, 15dn, 15e1, 15e2, and 15en, the TiN layers 16bb, 16cc, 16dd, and 16ee, and the $SiO_2$ layers 17b, 17c, 17d, and 17e on the Si pillars 4a, 4b, 4c, and 4d are removed. Subsequently, the $SiO_2$ layers 11a, 11b, 11c, and 11d, the $Si_3N_4$ layer 12, and the $SiO_2$ layer 13 that are disposed above the upper surface of the TiN layer 16aa and cover the Si pillars 4a, 4b, 4c, and 4d are removed to form $SiO_2$ layers 11aa, 11bb, 11cc, and 11dd (the $SiO_2$ layer 11cc is not shown in the figures), a $Si_3N_4$ layer 12a, and a $SiO_2$ layer 13a. Subsequently, the $Si_3N_4$ layers 2a, 2b, 2c, and 2d are removed.

Next, as illustrated in FIGS. 2IA to 2IC, a hafnium oxide layer (hereinafter, a hafnium oxide layer is referred to as "$HfO_2$ layer") 19 is formed so as to cover the TiN layer 16aa and exposed top portions of the Si pillars 4a, 4b, 4c, and 4d. Subsequently, a doped Si layer 20 and a $SiO_2$ layer 21 are formed by using, for example, a bias sputtering method. The doped Si layer 20 and $SiO_2$ layer 21 that are formed on the top portions of the Si pillars 4a, 4b, 4c, and 4d are then removed (the removal step is not shown). Furthermore, the $HfO_2$ layer 19 disposed on the top portions of the Si pillars 4a, 4b, 4c, and 4d is removed. Subsequently, $N^+$ layers 24a, 24b, 24c, and 24d (the $N^+$ layer 24c is not shown in the figures) are formed in the top portions of the Si pillars 4a, 4b, 4c, and 4d by, for example, an arsenic (As) ion implantation method.

Figure 2J:
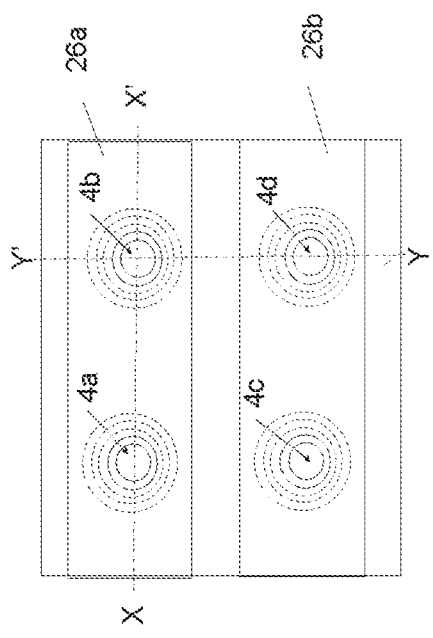
FIG. 2JA and FIGS. 2JB and 2JC are respectively a plan view and sectional structural views illustrating a vertical NAND-type flash memory device according to the first embodiment and a method for producing the device.
Figure 2J:
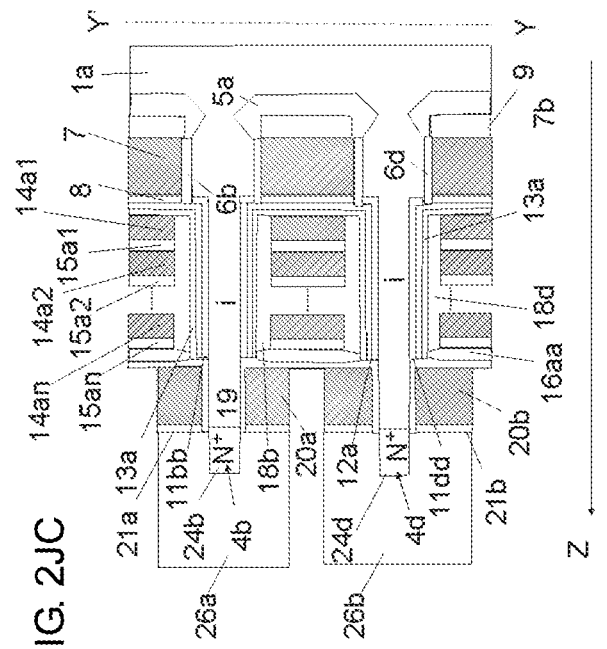
Figure 2J:
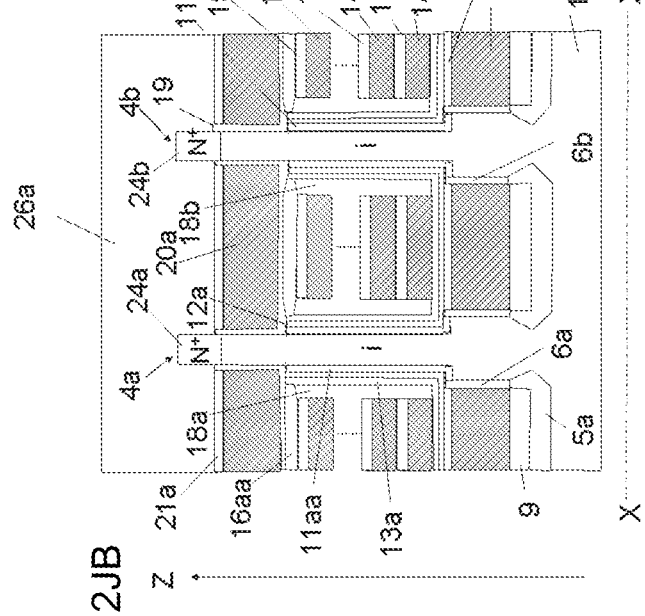

Next, as illustrated in FIGS. 2JA to 2JC, resist layers 26a and 26b that cover the Si pillars 4a, 4b, 4c, and 4d and that extend in the horizontal direction as illustrated in FIG. 2JA are formed. The resist layer 26a covers the Si pillars 4a and 4b and extends in the horizontal direction as illustrated in FIG. 2JA. The resist layer 26b covers the Si pillars 4c and 4d and extends in the horizontal direction as illustrated in FIG. 2JA. Subsequently, the $SiO_2$ layer 21 and the doped Si layer 20 are etched from the upper surface thereof by RIE using the resist layers 26a and 26b as a mask. As a result, a $SiO_2$ layer 21a and a doped Si layer 20a are formed under the resist layer 26a. At the same time, a $SiO_2$ layer 21b and a doped Si layer 20b are formed under the resist layer 26b. The resist layers 26a and 26b are then removed.

Figure 2K:
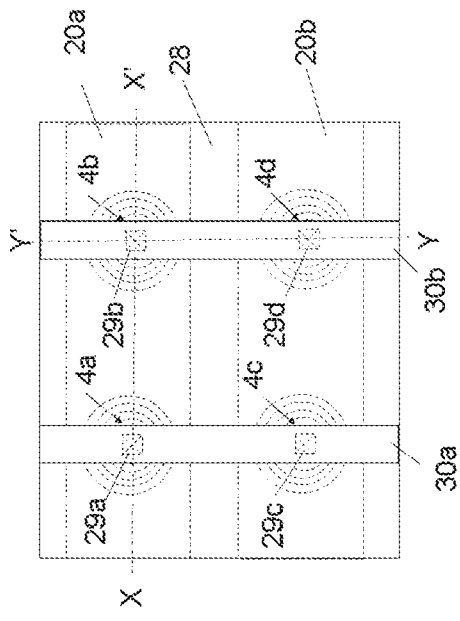
FIG. 2KA and FIGS. 2KB and 2KC are respectively a plan view and sectional structural views illustrating a vertical NAND-type flash memory device according to the first embodiment and a method for producing the device.
Figure 2K:
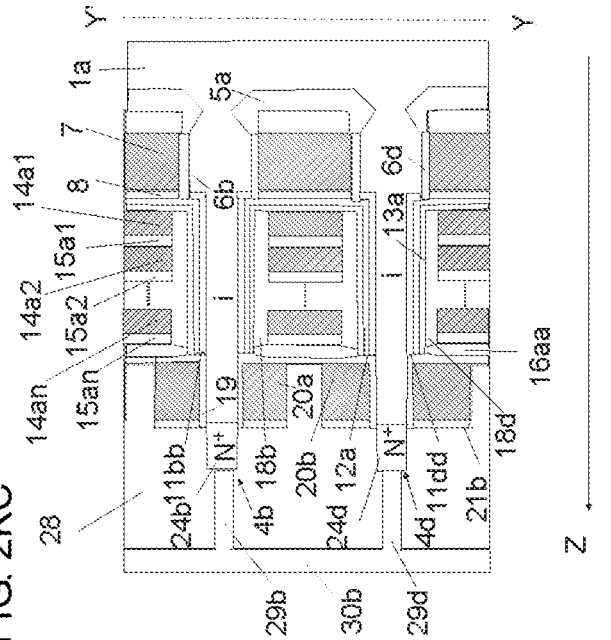
Figure 2K:
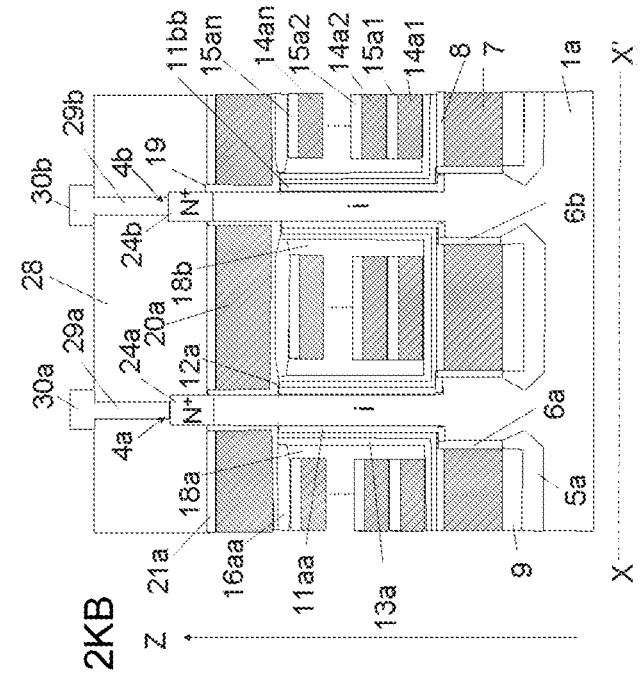

Next, as illustrated in FIGS. 2KA to 2KC, a $SiO_2$ layer 28 is deposited by a chemical vapor deposition (CVD) method over the entire surface, and contact holes 29a, 29b, 29c, and 29d are formed on the Si pillars 4a, 4b, 4c, and 4d, respectively. Subsequently, metal wiring layers 30a and 30b that are connected to the $N^-$ layers 24a, 24b, 24c, and 24d through the contact holes 29a, 29b, 29c, and 29d are formed so as to extend in the vertical direction of the FIG. 2KA. The metal wiring layer 30a is connected to the $N^-$ layers 24a and 24c (the $N^+$ layer 24c is not shown in the figures) that are respectively formed on the Si pillars 4a and 4c. The metal wiring layer 30b is connected to the $N^+$ layers 24b and 24d that are respectively formed on the Si pillars 4b and 4d. A vertical NAND-type flash memory is formed as described above.

In FIGS. 2KA to 2KC, the $N^+$ layer 5a functions as a common source, the doped Si layer 7 functions as a source-side selection line, the doped Si layers 14a1, 14a2, and 14an function as word lines, the doped Si layer 20a functions as a drain-side selection line, the $N^+$ layers 24a, 24b, 24c, and 24d function as drains, and the metal wiring layers 30a and 30b function as bit lines. The $SiO_2$ layers 11aa, 11bb, 11cc, and 11dd function as tunnel insulating layers. The $Si_3N_4$ layer 12a functions as a data charge storage insulating layer. The $SiO_2$ layer 13a functions as an interlayer insulating layer. During a data write operation and a data read-out operation, a voltage with which channels of the Si pillars 4a, 4b, 4c, and 4d turn to the on-state is preferably applied to the TiN layer 16aa.

According to the first embodiment, the following advantages are achieved.

1. In the vertical NAND-type flash memory formed to have the structure illustrated in FIGS. 2KA to 2KC, a stacked insulating layer that is formed so as to surround the Si pillars 4a, 4b, 4c, and 4d and that includes the $SiO_2$ layers 11aa, 11bb, 11cc, and 11dd functioning as tunnel insulating layers, the $Si_3N_4$ layer 12a functioning as a data charge storage insulating layer, and the $SiO_2$ layer 13a functioning as an interlayer insulating layer is formed to be isolated from the doped Si layers 14a1, 14a2, and 14an functioning as word lines and the $SiO_2$ layers 15a1, 15a2, and 15an functioning as interlayer insulating layers with the gas layers 18a, 18b, 18c, and 18d therebetween. With this structure, the transfer of a stress from the doped Si layers 14a1, 14a2, and 14an and the $SiO_2$ layers 15a1, 15a2, and 15an to the $SiO_2$ layers 11aa, 11bb, 11cc, and 11dd, the $Si_3N_4$ layer 12a, and the $SiO_2$ layer 13a is blocked. As a result, the generation of defects in the $SiO_2$ layers 11aa, 11bb, 11cc, and 11dd, the $Si_3N_4$ layer 12a, and the $SiO_2$ layer 13a can be suppressed to improve reliability of memory characteristics.

2. As illustrated in FIGS. 2FA to 2FC, the $SiO_2$ layers 11a, 11b, 11c, and 11d functioning as tunnel insulating layers, the $Si_3N_4$ layer 12 functioning as a data charge storage insulating layer, and the $SiO_2$ layer 13 functioning as an interlayer insulating layer are formed so as to surround the Si pillars 4a, 4b, 4c, and 4d. Subsequently, a Si material that contains a donor or acceptor impurity and a $SiO_2$ material are incident from a direction perpendicular to a surface of the i-layer substrate 1a by using a bias sputtering method to form the doped Si layers 14a1, 14a2, and 14an and the $SiO_2$ layers 15a1, 15a2, and 15an on outer peripheries of the Si pillars 4a, 4b, 4c, and 4d. In this case, since the $Si_3N_4$ layers 2a, 2b, 2c, and 2d function as a mask, atoms of the Si material that contains the donor or acceptor impurity and atoms of the $SiO_2$ material are not incident on the surface of the $SiO_2$ layer 13 disposed on the side faces of the Si pillars 4a, 4b, 4c, and 4d. Therefore, the $SiO_2$ layers 11a, 11b, 11c, and 11d functioning as tunnel insulating layers, the $Si_3N_4$ layer 12 functioning as a data charge storage insulating layer, and the $SiO_2$ layer 13 functioning as an interlayer insulating layer are not damaged by the incidence of atoms of the Si material and atoms of the $SiO_2$ material. As a result, the generation of defects in the $SiO_2$ layers 11a, 11b, 11c, and 11d, the $Si_3N_4$ layer 12, and the $SiO_2$ layer 13 can be suppressed to improve reliability of memory characteristics.

3. The gas layers 18a, 18b, 18c, and 18d are insulating layers that do not have a trap level. Therefore, degradation of data retention characteristics caused by charge injection from the doped Si layers 14a1, 14a2, and 14an functioning as word lines to the $Si_3N_4$ layer 12a functions as a data charge storage insulating layer through the trap level does not occur.

4. Upper portions of the gas layers 18a, 18b, 18c, and 18d are sealed with the TiN layer 16aa formed by the heat treatment in FIGS. 2GA to 2GC, and the Si pillars 4a, 4b, 4c, and 4d are supported by the TiN layer 16aa. With this structure, it is possible to prevent the occurrence of contamination defects due to a phenomenon in which, in a subsequent cleaning treatment step, lithography step, etc., a treatment liquid enters the gas layers 18a, 18b, 18c, and 18d, remains in the layers, and is not removed. Furthermore, with this structure, the occurrence of tilting or bending of the Si pillars 4a, 4b, 4c, and 4d can be prevented. In place of the TiN layer 16a, a laminate including a poly-Si layer and, for example, nickel (Ni) may be used. As a result of heat treatment, Ni atoms diffuse in the poly-Si layer to form a nickel silicide (NiSi) layer. As a result of the heat treatment, the volume of this NiSi layer becomes larger than that of the original poly-Si layer. In this case, since the $SiO_2$ layer 17a functioning as a cap layer is disposed on the NiSi, the NiSi layer mainly expands in the horizontal direction of the figure. Consequently, as in the case of the TiN layer 16aa, upper portions of the gas layers 18a, 18b, 18c, and 18d are sealed.

Second Embodiment

A method for producing a vertical NAND-type flash memory device according to a second embodiment of the present invention will be described with reference to FIGS. 3A to 3C. The method according to the second embodiment is the same as that of the first embodiment except for a step illustrated with reference to FIGS. 3A to 3C.

As illustrated in FIGS. 3A to 3C, as in FIGS. 2FA to 2FC, atoms of a Si material that contains a donor or acceptor impurity and atoms of a $SiO_2$ material are incident from a direction perpendicular to an upper surface of an i-layer substrate 1a by using, for example, a bias sputtering method to form doped Si layers 14a1, 14a2, and 14an and $SiO_2$ layers 15a1, 15a2, and 15an on outer peripheries of Si pillars 4a, 4b, 4c, and 4d. Subsequently, heat treatment is performed, for example, at 450° C. in an atmosphere containing hydrogen ($H_2$). This heat treatment is performed in a state in which hydrogen gas fills spaces from upper portions to bottom portions of gas layers 18a, 18b, 18c, and 18d. Subsequently, the steps illustrated in FIGS. 2GA to 2KC are performed.

According to the second embodiment, heat treatment is performed in a state in which hydrogen gas fills spaces from the upper portions to the bottom portions of the gas layers 18a, 18b, 18c, and 18d. Therefore, hydrogen ions easily diffuse in a $SiO_2$ layer 13 functioning as an interlayer insulating layer, and uncombined hands (dangling bonds) in the $SiO_2$ layer 13 are inactivated. Consequently, insulating properties of the $SiO_2$ layer 13 improve, and reliability of memory characteristics is improved. When a laminate including a poly-Si layer and, for example, nickel (Ni) is used instead of the TiN layer 16a, heat treatment in a hydrogen environment can be performed at a higher temperature, and thus reliability of memory characteristics further improves. Alternatively, when heat treatment in a hydrogen environment is performed before the formation of the TiN layer 16a, heat treatment in a hydrogen environment can be performed at a higher temperature, and thus reliability of memory characteristics further improves.

Third Embodiment

A method for producing a vertical NAND-type flash memory device according to a third embodiment of the present invention will be described with reference to FIGS. 4AA to 4BC. The method according to the third embodiment is the same as that of the first embodiment except for steps illustrated with reference to FIGS. 4AA to 4BC.

As illustrated in FIGS. 4AA to 4AC, atoms of a Si material that contains a donor or acceptor impurity and atoms of a $SiO_2$ material are incident from a direction perpendicular to a surface of an i-layer substrate 1a by using, for example, a bias sputtering method to form doped Si layers 14a1, 14a2, and 14an and $SiO_2$ layers 15a1, 15a2, and 15an on outer peripheries of Si pillars 4a, 4b, 4c, and 4d. Doped Si layers 14b1, 14b2, 14bn, 14c1, 14c2, 14cn, 14d1, 14d2, 14dn, 14e1, 14e2, and 14en, and $SiO_2$ layers 15b1, 15b2, 15bn, 15c1, 15c2, 15cn, 15d1, 15d2, 15dn, 15e1, 15e2, and 15en are stacked on the Si pillars 4a, 4b, 4c, and 4d, respectively. Subsequently, for example, in an atmosphere containing oxygen at 900° C., a $SiO_2$ layer 35a is formed in a surface layer of side faces of the doped Si layers 14a1, 14a2, and 14an. At the same time, a SiO$_2$ layer 35b is formed in a surface layer of sides of the doped Si layers 14b1, 14b2, 14bn, 14c1, 14c2, 14cn, 14d1, 14d2, 14dn, 14e1, 14e2, and 14en.

Figure 4B:
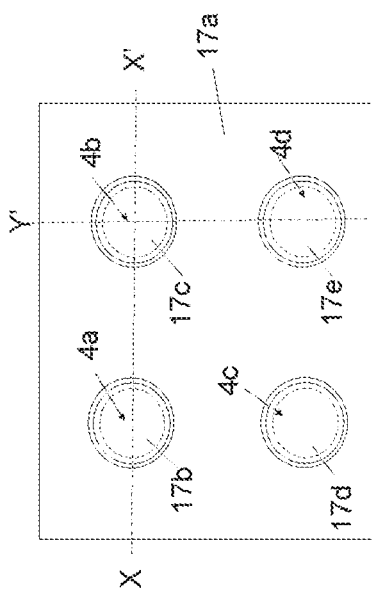
FIG. 4BA and FIGS. 4BB and 4BC are respectively a plan view and sectional structural views illustrating a vertical NAND-type flash memory device according to the third embodiment and a method for producing the device.
Figure 4B:
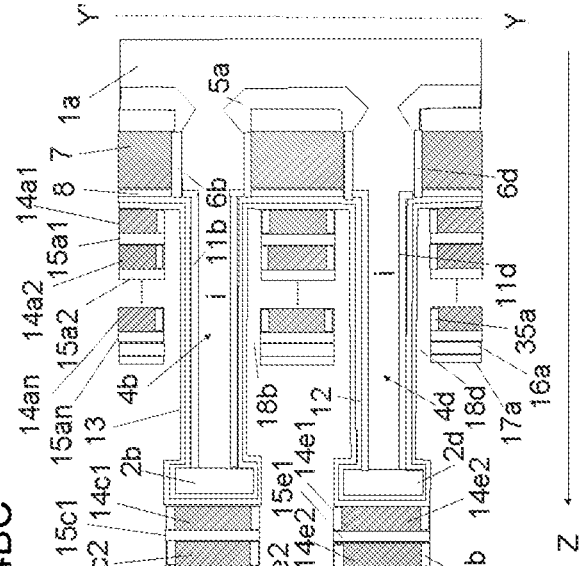
Figure 4B:
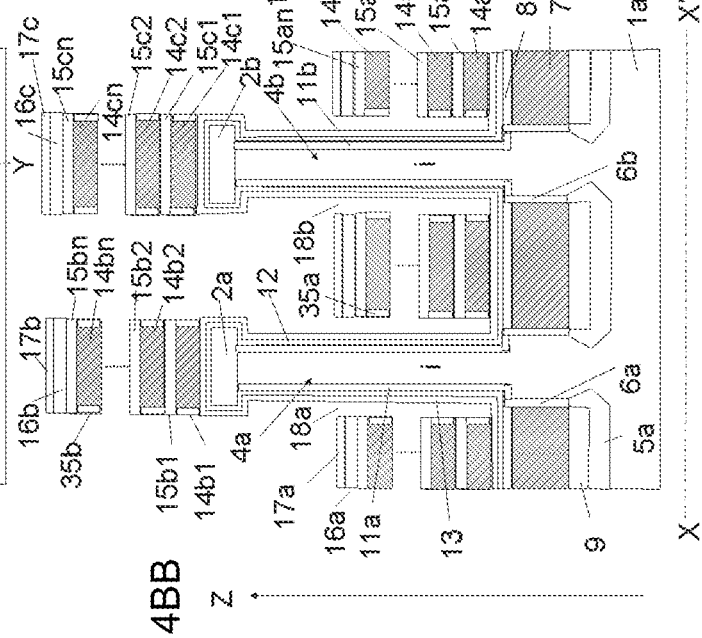

Next, as illustrated in FIGS. 4BA to 4BC, a TiN layer 16a and a SiO$_2$ layer 17a are formed on the outer peripheries of the Si pillars 4a, 4b, 4c, and 4d by using a bias sputtering method, and at the same time, TiN layers 16b, 16c, 16d, and 16e (the TiN layer 16d is not shown in the figures), and SiO$_2$ layers 17b, 17c, 17d, and 17e are stacked on the Si pillars 4a, 4b, 4c, and 4d, respectively. Subsequently, the steps illustrated in FIGS. 2GA to 2KC are performed. Thus, a vertical NAND-type flash memory device is formed.

According to the third embodiment, the SiO$_2$ layer 35a functioning as an interlayer insulating layer is formed in a surface layer of side faces of the doped Si layers 14a1, 14a2, and 14an functioning as word lines. Therefore, insulating properties between the Si$_3$N$_4$ layer 12a functions as a data charge storage insulating layer and the doped Si layers 14a1, 14a2, and 14an functioning as word lines improve, and reliability of memory characteristics is improved.

Fourth Embodiment

A method for producing a vertical NAND-type flash memory device according to a fourth embodiment of the present invention will be described with reference to FIGS. 5AA to 5CC. In the fourth embodiment, the shape of a material layer deposited by a bias sputtering method will also be described.

Figure 5A:
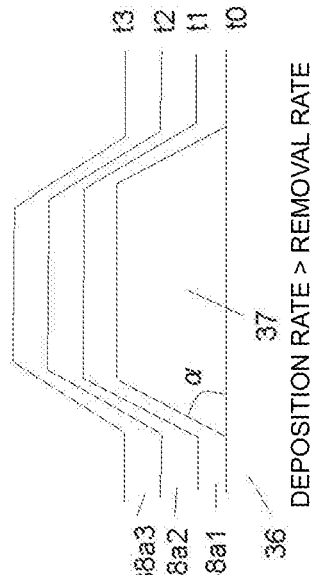
FIGS. 5AA to 5AD are views illustrating a deposited shape when material atoms are deposited on a pillar having a trapezoidal cross section and formed on a substrate by using a bias sputtering method, according to a fourth embodiment of the present invention.
Figure 5A:
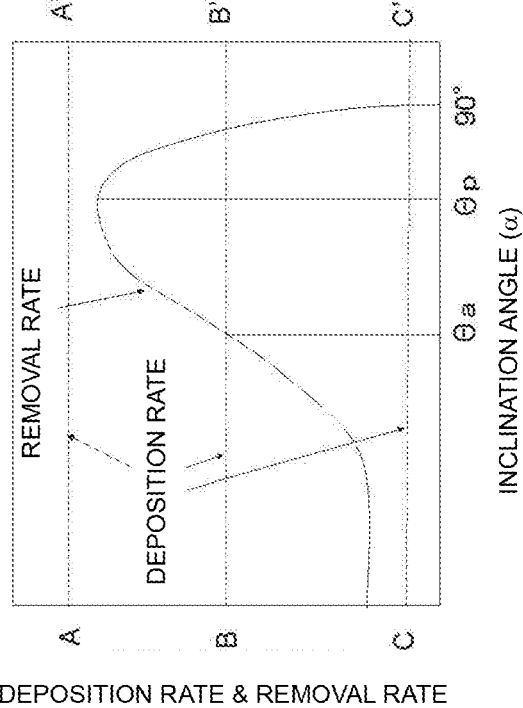
Figure 5A:
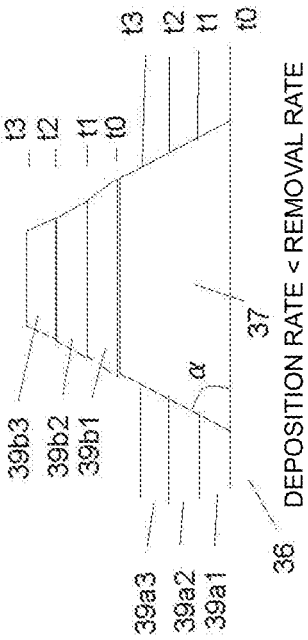
Figure 5A:
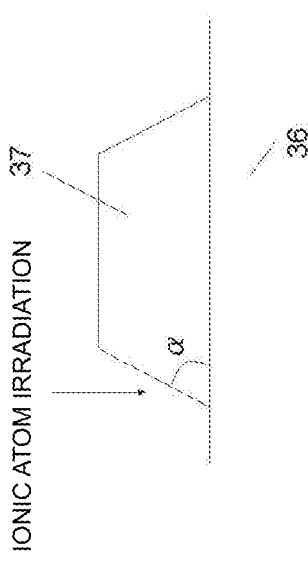

FIGS. 5AA to 5AD illustrate a change with time in a material layer deposited on a truncated cone-shaped pillar 37 formed on a substrate 36, and on the substrate 36 in the periphery of the truncated cone-shaped pillar 37, when ionic atoms are incident from a direction perpendicular to a surface of the substrate 36 using a bias sputtering method (refer to, for example, C. Y. Ting, V. J. Vivalda, and H. G. Schaefer: "Study of planarized sputter-deposited SiO$_2$", J. Vac. Sci. Technol. 15(3), p.p. 1105-1112, May/June (1978), and A. D. G. Stewart, and M. W. Thomson: "Microtopography of Surface Eroded by Ion-Bombardment, Journal of Material Science 4" p.p. 56-69 (1969)).

It is assumed that, on a truncated cone-shaped pillar 37 which is illustrated in FIG. 5AB and whose inclination angle formed by a substrate 36 and a side face thereof is α (°), ionic atoms are incident from a direction perpendicular to a surface of the substrate 36. In this case, the relationship between the inclination angle α of the side face of the truncated cone-shaped pillar 37 and a deposition rate of an incident ionic atom material layer on the side face of the truncated cone-shaped pillar 37, and the relationship between the inclination angle α and a removal rate of the incident ionic atom material layer will be described with reference to FIGS. 5AA to 5AD. The deposition rate depends on the voltage applied between an anode and a cathode in a bias sputtering apparatus and does not depend on the inclination angle α. With an increase in the voltage applied, the deposition rate increases. On the other hand, as illustrated in FIG. 5AA, with an increase in the inclination angle α, the removal rate increases, becomes maximum at an inclination angle α=θp, and then decreases. Here, the angle θp is 70° or more and 80° or less. The reason why the removal rate increases with an increase in the inclination angle α in this manner is as follows. With an increase in the inclination angle α, the length of a path through which an ionic atom enters a material layer that has already been deposited increases. In this increased entry path, the opportunity of collision between incident ionic atoms and atoms of the deposited material layer increases, and thus a larger number of atoms of the deposited material layer are released. In contrast, when the inclination angle α exceeds θp, it becomes difficult for ionic atoms to enter a material layer that has already been deposited, and a larger number of ionic atoms are reflected at a surface of the deposited material layer. Thus, the opportunity of collision between incident ionic atoms and atoms of the deposited material layer decreases, and the removal rate decreases. As illustrated in FIG. 5AA, in the case of a deposition rate of A-A', the deposition rate is higher than the removal rate without depending on the inclination angle α. In the case of a deposition rate of B-B', at an inclination angle α (α<θa) which is smaller than an inclination angle θa at which the deposition rate is equal to the removal rate, the deposition rate is higher than the removal rate, and at an inclination angle α (α>θa) which is larger than the inclination angle θa, the removal rate is higher than the deposition rate. In the case of a deposition rate of C-C', at almost all inclination angles α, the removal rate is higher than the deposition rate. As illustrated in FIG. 5AC, under a condition in which the deposition rate is higher than the removal rate, deposited material layers 38a1, 38a2, and 38a3 deposited on a truncated cone-shaped pillar 37 and on a substrate 36 located on the outer periphery of the truncated cone-shaped pillar 37 are formed on the substrate 36 and on side faces and a top surface of the truncated cone-shaped pillar 37 in a continuous manner with the lapse of time t0 (before the start of deposition), t1, t2, and t3. In contrast, as illustrated in FIG. 5AD, under a condition in which the deposition rate is lower than the removal rate, since the removal rate on the side faces is high, deposited material layers 39a1, 39a2, and 39a3 deposited on the substrate 36 and deposited material layers 39b1, 39b2, and 39b3 deposited on the truncated cone-shaped pillar 37 are formed to be separated from each other. In this manner, by variously changing the inclination angle α of a side face of the truncated cone-shaped pillar 37 and changing the setting of the deposition rate, the shape of a material layer deposited on the top surface of the truncated cone-shaped pillar 37 and on side faces thereof can be changed.

A method for producing a vertical NAND-type flash memory device according to the fourth embodiment will be described with reference to FIGS. 5BA to 5CC. The method according to the fourth embodiment is the same as that of the first embodiment except for steps illustrated with reference to FIGS. 5BA to 5CC.

Figure 5B:
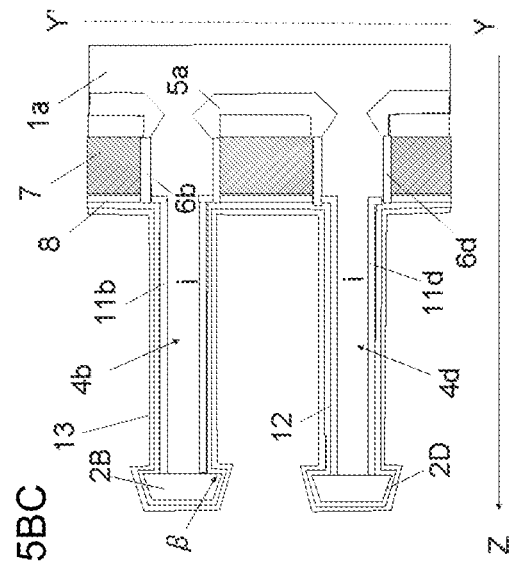
FIG. 5BA and FIGS. 5BB and 5BC are respectively a plan view and sectional structural views illustrating a vertical NAND-type flash memory device according to the fourth embodiment and a method for producing the device.
Figure 5B:
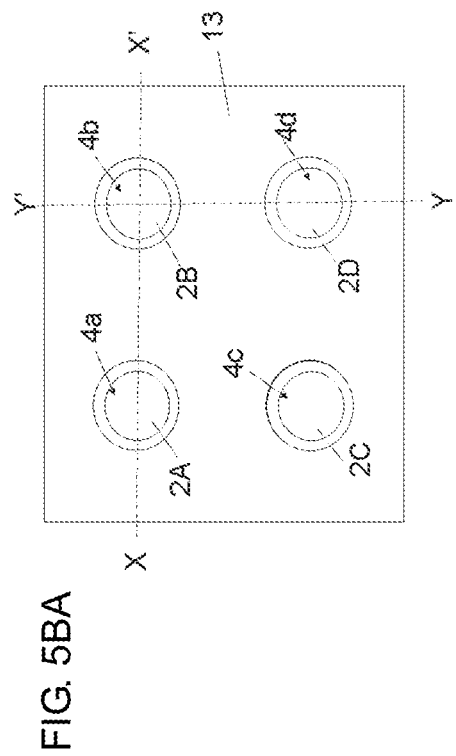
Figure 5B:
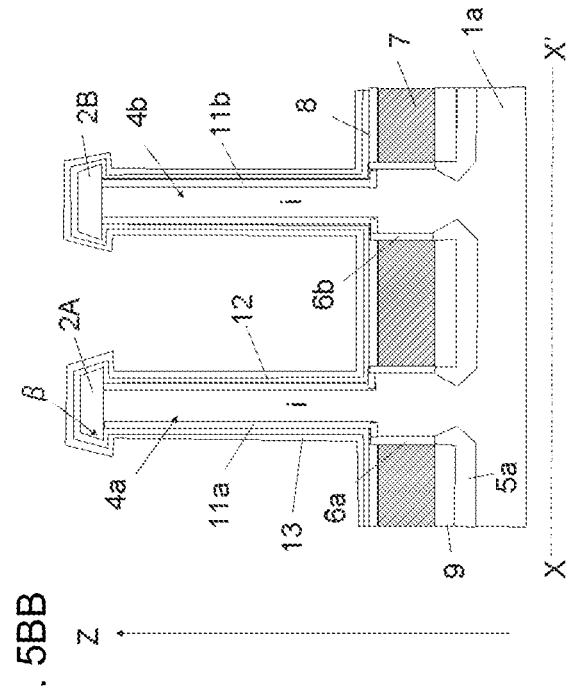

As illustrated in FIGS. 5BA to 5BC, truncated cone-shaped Si$_3$N$_4$ layers 2A, 2B, 2C, and 2D having a side face with an inclination angle of β are formed instead of the Si$_3$N$_4$ layers 2a, 2b, 2c, and 2d that are formed on the Si pillars 4a, 4b, 4c, and 4d, respectively, and illustrated in FIGS. 2EA to 2EC. Subsequently, SiO$_2$ layers 11a, 11b, 11c, and 11d (the SiO$_2$ layer 11c is not shown in the figures) which are to become tunnel insulating layers are formed in surface layers of side faces of Si pillars 4a, 4b, 4c, and 4d. A Si$_3$N$_4$ layer 12 which is to become a data charge storage insulating layer and a SiO$_2$ layer 13 which is to become an interlayer insulating layer are further formed so as to cover the whole.

Next, as illustrated in FIGS. 5CA to 5CC, atoms of a Si material that contains a donor or acceptor impurity and atoms of a SiO$_2$ material are incident from a direction perpendicular to a surface of an i-layer substrate 1a by using, for example, a bias sputtering method under a condition in which the deposition rate is lower than the removal rate with respect to the inclination angle β of the truncated cone-shaped $Si_3N_4$ layers 2A, 2B, 2C, and 2D as illustrated in FIG. 5AD. Consequently, doped Si layers 14a1, 14a2, and 14an and $SiO_2$ layers 15a1, 15a2, and 15an are formed on outer peripheries of the Si pillars 4a, 4b, 4c, and 4d, and a TiN layer 16a and a $SiO_2$ layer 17a are further formed thereon. At the same time, truncated cone-shaped stacked material layers 41a, 41b, 41c, and 41d each having a truncated cone shape and including doped Si layers and $SiO_2$ layers that form a laminated structure are formed on the Si pillars 4a, 4b, 4c, and 4d, respectively. After the shape of each of the truncated cone-shaped stacked material layers 41a, 41b, 41c, and 41d becomes a conical shape, the incident Si material and $SiO_2$ material are no longer deposited on the truncated cone-shaped stacked material layers 41a, 41b, 41c, and 41d. Accordingly, a height Lb of each of the truncated cone-shaped stacked material layers 41a, 41b, 41c, and 41d is smaller than a thickness La that is the total of the thicknesses of the doped Si layers 14a1, 14a2, and 14an and the $SiO_2$ layers 15a1, 15a2, and 15an, all of which are formed on the outer peripheries of the Si pillars 4a, 4b, 4c, and 4d. Subsequently, the steps illustrated in FIGS. 2GA to 2KC are performed.

In the first embodiment, the doped Si layers 14b1, 14b2, 14bn, 14c1, 14c2, 14cn, 14d1, 14d2, 14dn, 14e1, 14e2, and 14en, the $SiO_2$ layers 15b1, 15b2, 15bn, 15c1, 15c2, 15cn, 15d1, 15d2, 15dn, 15e1, 15e2, and 15en, the TiN layers 16bb, 16cc, 16dd, and 16ee, and the $SiO_2$ layers 17b, 17c, 17d, and 17e that have the same thickness as the thickness La of the total of the doped Si layers 14a1, 14a2, and 14an, the $SiO_2$ layers 15a1, 15a2, and 15an, the TiN layer 16a, and the $SiO_2$ layer 17a are formed on the Si pillars 4a, 4b, 4c, and 4d, respectively. In this case, defects such as falling and bending of the doped Si layers 14b1, 14b2, 14bn, 14c1, 14c2, 14cn, 14d1, 14d2, 14dn, 14e1, 14e2, and 14en, the $SiO_2$ layers 15b1, 15b2, 15bn, 15c1, 15c2, 15cn, 15d1, 15d2, 15dn, 15e1, 15e2, and 15en, the TiN layers 16bb, 16cc, 16dd, and 16ee, and the $SiO_2$ layers 17b, 17c, 17d, and 17e are easily generated by a subsequent cleaning step and the like. In contrast, according to the fourth embodiment, the height Lb of each of the truncated cone-shaped stacked material layers 41a, 41b, 41c, and 41d is smaller than the thickness La of the total of the doped Si layers 14a1, 14a2, and 14an and the $SiO_2$ layers 15a1, 15a2, and 15an, all of which are formed on the outer peripheries of the Si pillars 4a, 4b, 4c, and 4d. Accordingly, the occurrence of defects such as falling and bending of the truncated cone-shaped stacked material layers 41a, 41b, 41c, and 41d in a subsequent cleaning step and the like can be prevented.

Fifth Embodiment

A method for producing a vertical NAND-type flash memory device according to a fifth embodiment of the present invention will be described with reference to FIGS. 6A to 6C. The method according to the fifth embodiment is the same as that of the first embodiment except for a step illustrated in FIGS. 6A to 6C.

Figure 6C:
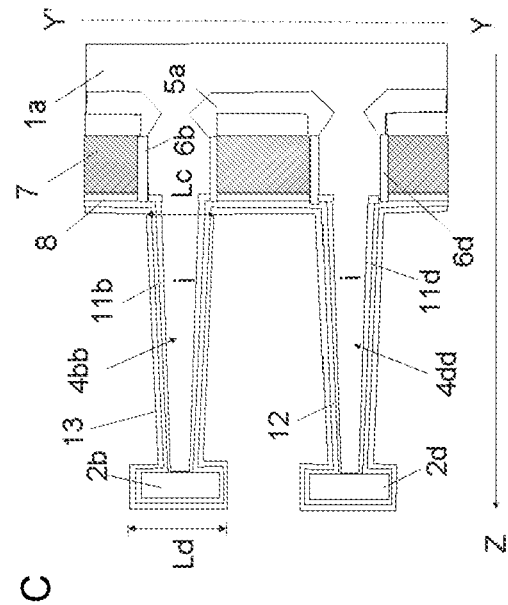
FIG. 6A and FIGS. 6B and 6C are respectively a plan view and sectional structural views illustrating a vertical NAND-type flash memory device according to a fifth embodiment of the present invention and a method for producing the device.
Figure 6A:
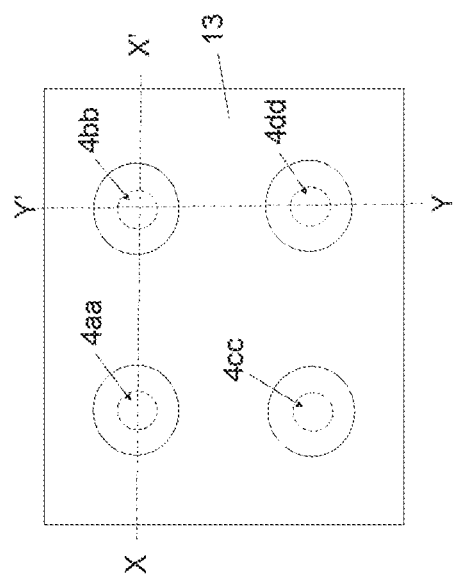
Figure 6B:
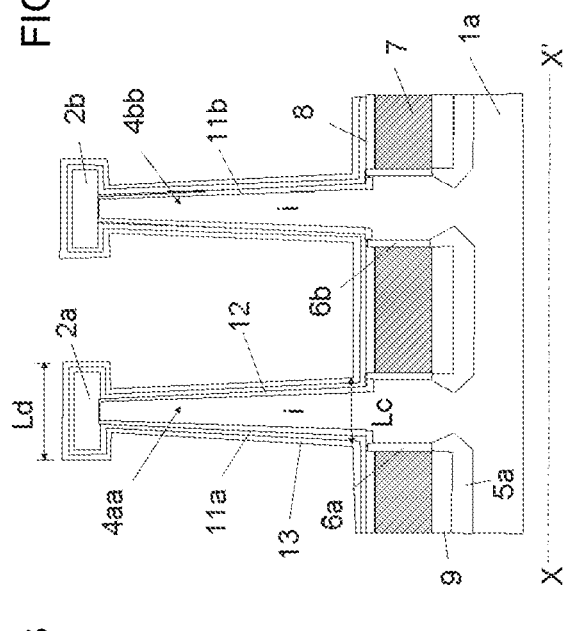

As illustrated in FIGS. 6A to 6C, truncated cone-shaped Si pillars 4aa, 4bb, 4cc, and 4dd having a truncated cone shape are respectively formed instead of the Si pillars 4a, 4b, 4c, and 4d each having a side face perpendicular to a surface of the i-layer substrate 1a. In each of the truncated cone-shaped Si pillars 4aa, 4bb, 4cc, and 4dd, the diameter of a bottom portion is larger than the diameter of a top portion. Next, $SiO_2$ layers 11a, 11b, 11c, and 11d (the $SiO_2$ layer 11c is not shown in the figures) which are to become tunnel insulating layers are formed by, for example, a thermal oxidation method in surface layers of the side faces of the truncated cone-shaped Si pillars 4aa, 4bb, 4cc, and 4dd. A $Si_3N_4$ layer 12 functioning as a data charge storage insulating layer and a $SiO_2$ layer 13 functioning as an interlayer insulating layer are formed so as to cover the whole. In this embodiment, the device is formed so that a diameter Lc of a bottom outer peripheral circle of the $SiO_2$ layer 13 formed on the peripheries of the bottom of the truncated cone-shaped Si pillars 4aa, 4bb, 4cc, and 4dd is smaller than a diameter Ld of a side-face outer peripheral circle of the $SiO_2$ layer 13 formed on the peripheries of the side faces of $Si_3N_4$ layers 2a, 2b, 2c, and 2d.

Atoms of a Si material that contains a donor or acceptor impurity and atoms of a $SiO_2$ material are incident from a direction perpendicular to an upper surface of the i-layer substrate 1a by using a bias sputtering method to form doped Si layers 14a1, 14a2, and 14an, and $SiO_2$ layers 15a1, 15a2, and 15an on outer peripheries of the truncated cone-shaped Si pillars 4aa, 4bb, 4cc, and 4dd. Subsequently, a TiN layer 16a and a $SiO_2$ layer 17a are formed on the outer peripheries of the truncated cone-shaped Si pillars 4aa, 4bb, 4cc, and 4dd. In the fifth embodiment, as in the gas layers (spaces) 18a, 18b, 18c, and 18d of the first embodiment, gas layers (spaces) are formed between the side faces of the truncated cone-shaped Si pillars 4aa, 4bb, 4cc, and 4dd and the side faces of the doped Si layers 14a1, 14a2, and 14an, the $SiO_2$ layers 15a1, 15a2, and 15an, the TiN layer 16a, and the $SiO_2$ layer 17a. With this structure, according to the fifth embodiment, the effects the same as those in the first embodiment are obtained. The shape of each of the Si pillars 4aa, 4bb, 4cc, and 4dd may not necessarily be a truncated cone shape as described above. The Si pillars may be barrel-shaped Si pillars in which the maximum diameter in a side-face outer peripheral circle of the $SiO_2$ layer 13 formed on the outer peripheries of the Si pillars 4aa, 4bb, 4cc, and 4dd is smaller than the diameter of the side-face outer peripheral circle of the $SiO_2$ layer 13 formed on the outer peripheries of the $Si_3N_4$ layers 2a, 2b, 2c, and 2d. Also in this case, the effects the same as those in the first embodiment are obtained. In FIGS. 6A to 6C, outer peripheral edges of the Si pillars 4aa, 4bb, 4cc, and 4dd are respectively located inside outer peripheral edges of gas layers 18a, 18b, 18c, and 18d in plan view.

Sixth Embodiment

A method for producing a vertical NAND-type flash memory device according to a sixth embodiment of the present invention will be described with reference to FIGS. 7AA to 7HB. In FIGS. 7AA to 7HB, the drawings whose last reference character is A are plan views, and the drawings whose last reference character is B are sectional structural views taken along line X-X' in the drawings whose last reference character is A. Si pillars 4a and 4b correspond to the Si pillars 4a and 4b in FIGS. 2BA to 2KC.

As illustrated in FIGS. 7AA and 7AB, on an outer periphery of a memory element region 42 in which the Si pillars 4a and 4b are formed, outer peripheral i-layers 43a and 43b (the outer peripheral i-layers 43a and 43b are connected to each other in the outer periphery of the memory element region 42) which are inclined at an inclination angle θk with respect to an i-layer substrate 1a are formed. Subsequently, the steps illustrated in FIGS. 2CA to 2HC are performed to form an $N^+$ layer 5a, $SiO_2$ layers 9, 6a, and 6b, a doped Si layer 7, $SiO_2$ layers 11aa and 11bb, a $Si_3N_4$ layer 12a, a $SiO_2$ layer 13a, doped Si layers 14a1, 14a2, and 14an, SiO$_2$ layers 15$a$1, 15$a$2, and 15$an$, and a TiN layer 16$aa$. Silicon nitride (Si$_3$N$_4$) layers 2$a$ and 2$b$ are left on the Si pillars 4$a$ and 4$b$, respectively. The SiO$_2$ layer 9, the doped Si layer 7, the doped Si layers 14$a$1, 14$a$2, and 14$an$, the SiO$_2$ layers 15$a$1, 15$a$2, and 15$an$, and the TiN layer 16$a$ are formed using, for example, a bias sputtering method by allowing material atoms to be incident from a direction perpendicular to an upper surface of the i-layer substrate 1$a$. The deposition of each of the layers by the bias sputtering method is performed under the condition in which the deposition rate is higher than the removal rate at the inclination angle θk of the outer peripheral i-layers 43$a$ and 43$b$, as described with reference to FIG. 5AC. The SiO$_2$ layers 11$aa$ and 11$bb$, the Si$_3$N$_4$ layer 12$a$, and the SiO$_2$ layer 13$a$ are formed by using an atomic layer deposition (ALD) method. Consequently, the SiO$_2$ layer 9, the doped Si layer 7, the Si$_3$N$_4$ layer 12$a$, the SiO$_2$ layer 13$a$, the doped Si layers 14$a$1, 14$a$2, and 14$an$, the SiO$_2$ layers 15$a$1, 15$a$2, and 15$an$ are formed in a continuous manner on the outer peripheral i-layers 43$a$ and 43$b$ in outer peripheries of gas layers (spaces) 18$a$, 18$b$ on outer peripheries of the Si pillars 4$a$ and 4$b$. The TiN layer 16$aa$ is formed by allowing TiN material atoms to be incident from a direction perpendicular to an upper surface of the i-layer substrate 1$a$ using, for example, a bias sputtering method, and subsequently, for example, performing heat treatment at 550° C. to cause plastic deformation for extending the deposited TiN layer in the horizontal direction. The TiN layer 16$aa$ is formed to be in contact with the SiO$_2$ layer 13$a$ and to extend on the outer peripheral i-layers 43$a$ and 43$b$ in a continuous manner.

Next, as illustrated in FIGS. 7BA and 7BB, the doped Si layer 7, the Si$_3$N$_4$ layer 12$a$, the SiO$_2$ layer 13$a$, the doped Si layers 14$a$1, 14$a$2, and 14$an$, the SiO$_2$ layers 15$a$1, 15$a$2, and 15$an$, and the TiN layer 16$aa$ that include the Si pillars 4$a$ and 4$b$ and extend between the Si pillars 4$a$ and 4$b$ and over the outer peripheral i-layer 43$b$ in a continuous manner are formed by using a lithographic method and an RIE method.

Figure 7C:
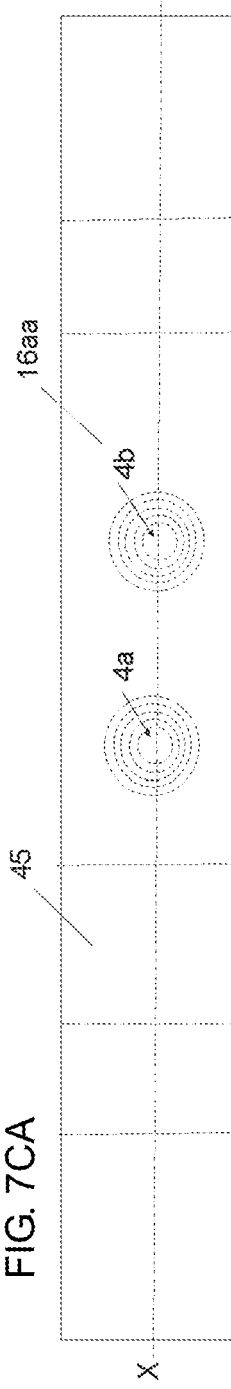
FIG. 7CA and FIG. 7CB are respectively a plan view and a sectional structural view illustrating a vertical NAND-type flash memory device according to the sixth embodiment and a method for producing the device.
Figure 7C:
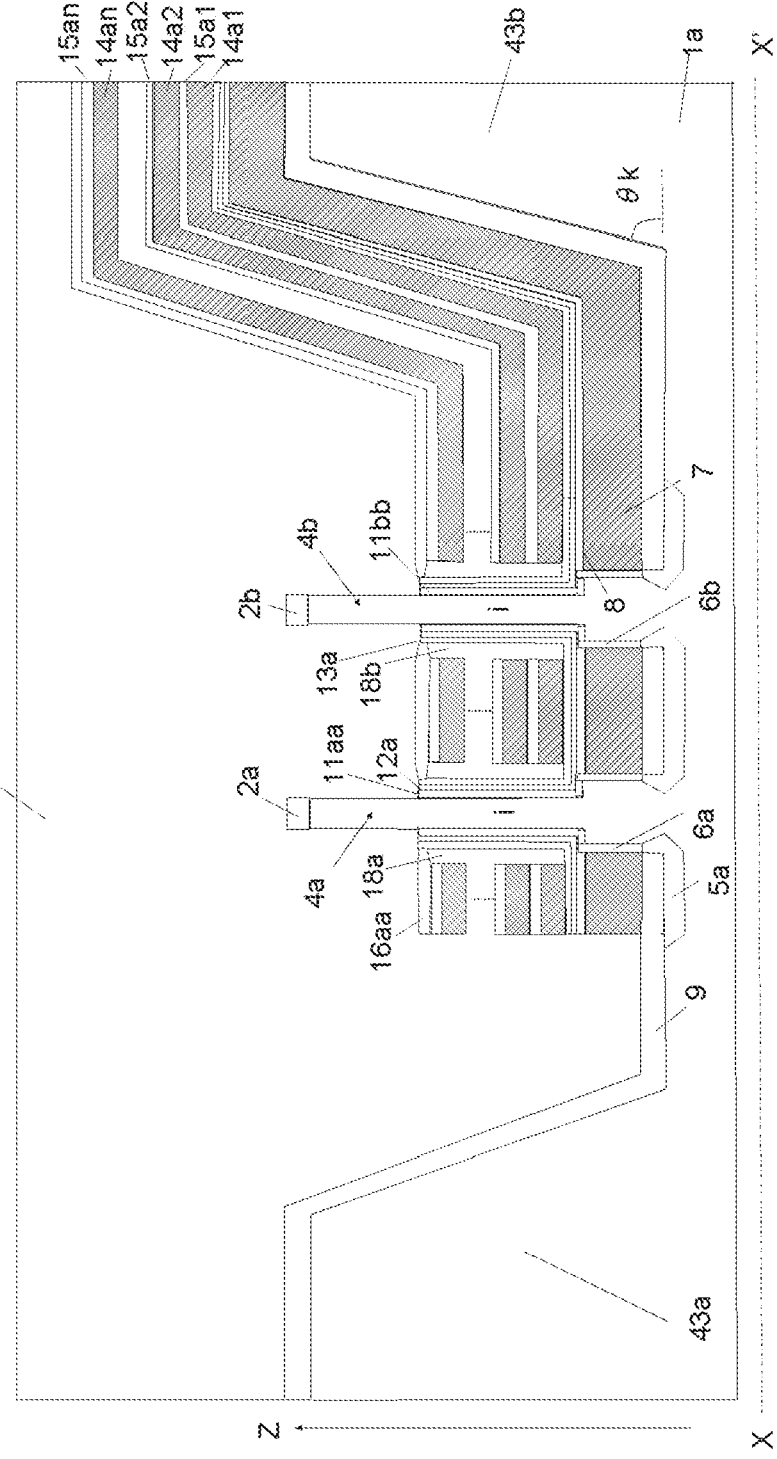

Next, as illustrated in FIGS. 7CA and 7CB, SiO$_2$ is deposited by a CVD method. The resulting SiO$_2$ layer is then planarized by a chemical mechanical polishing (CMP) method to form a SiO$_2$ layer 45 whose surface is located higher than an upper surface of the TiN layer 16$aa$ on the outer peripheral i-layer 43$b$.

Figure 7D:
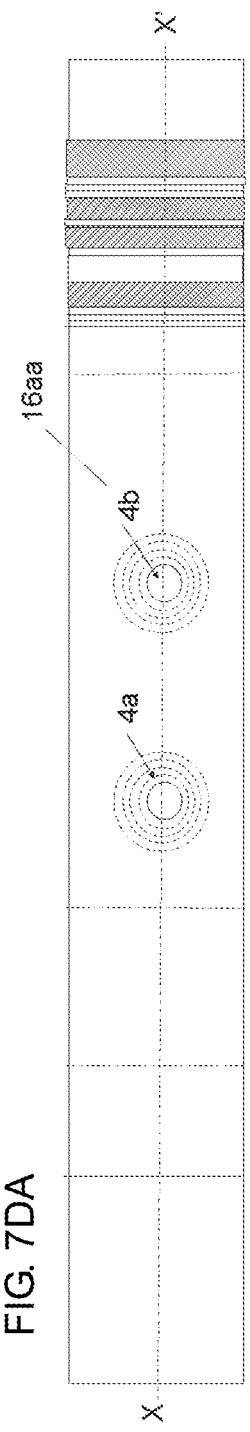
FIG. 7DA and FIG. 7DB are respectively a plan view and a sectional structural view illustrating a vertical NAND-type flash memory device according to the sixth embodiment and a method for producing the device.
Figure 7D:
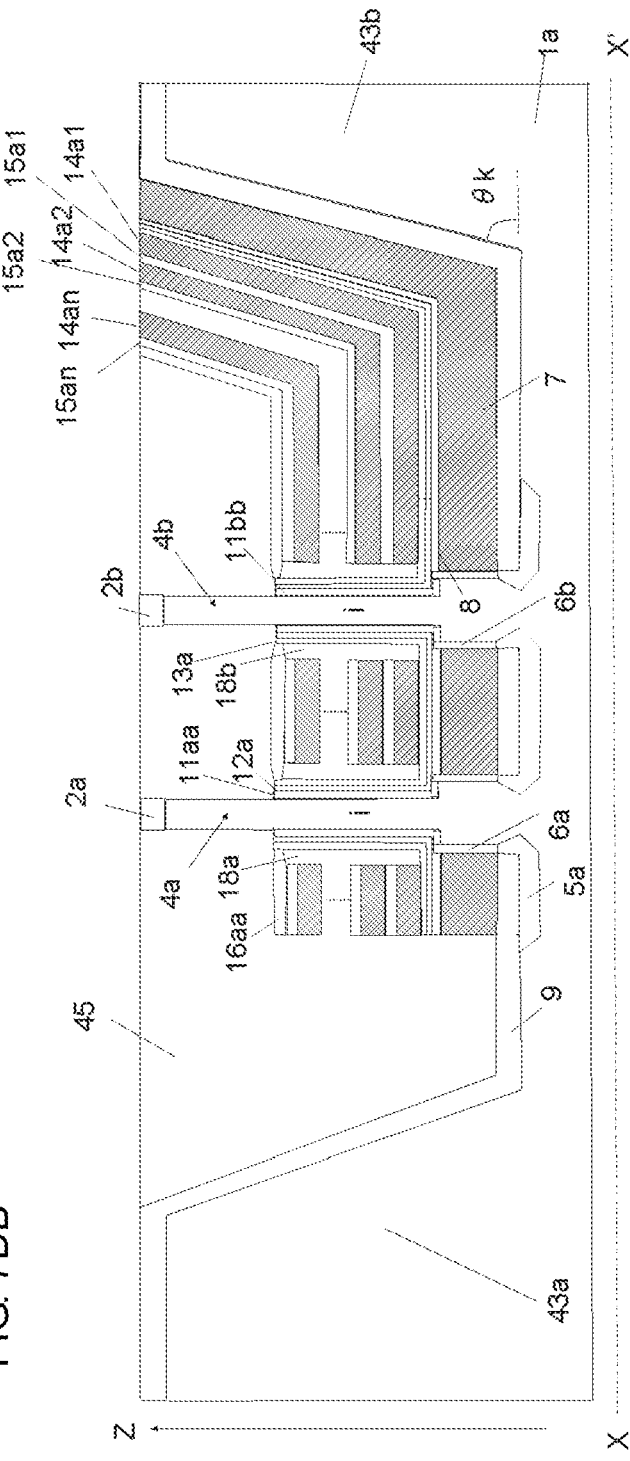

Next, as illustrated in FIGS. 7DA and 7DB, the SiO$_2$ layer 45, the doped Si layer 7, the Si$_3$N$_4$ layer 12$a$, the SiO$_2$ layer 13$a$, the doped Si layers 14$a$1, 14$a$2, and 14$an$, the SiO$_2$ layers 15$a$1, 15$a$2, and 15$an$, and the TiN layer 16$aa$ are etched using a CMP method such that an upper surface thereof has a height substantially equal to that of an upper surface of the SiO$_2$ layer 9 on the outer peripheral i-layers 43$a$ and 43$b$.

Figure 7E:
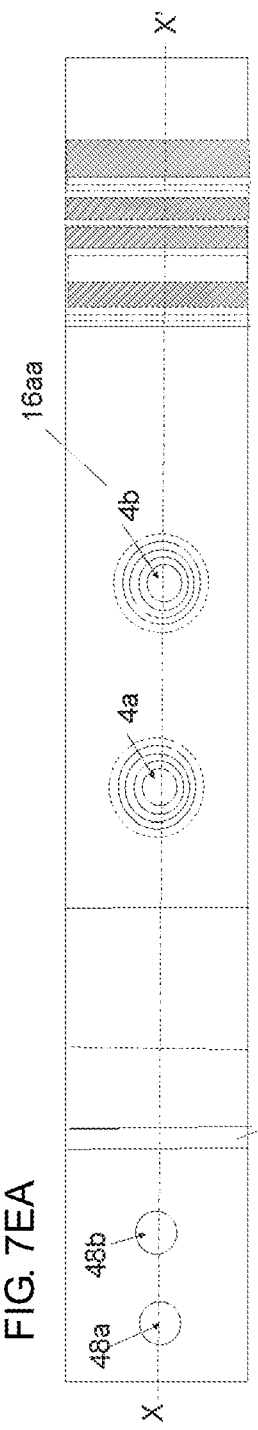
FIG. 7EA and FIG. 7EB are respectively a plan view and a sectional structural view illustrating a vertical NAND-type flash memory device according to the sixth embodiment and a method for producing the device.
Figure 7E:
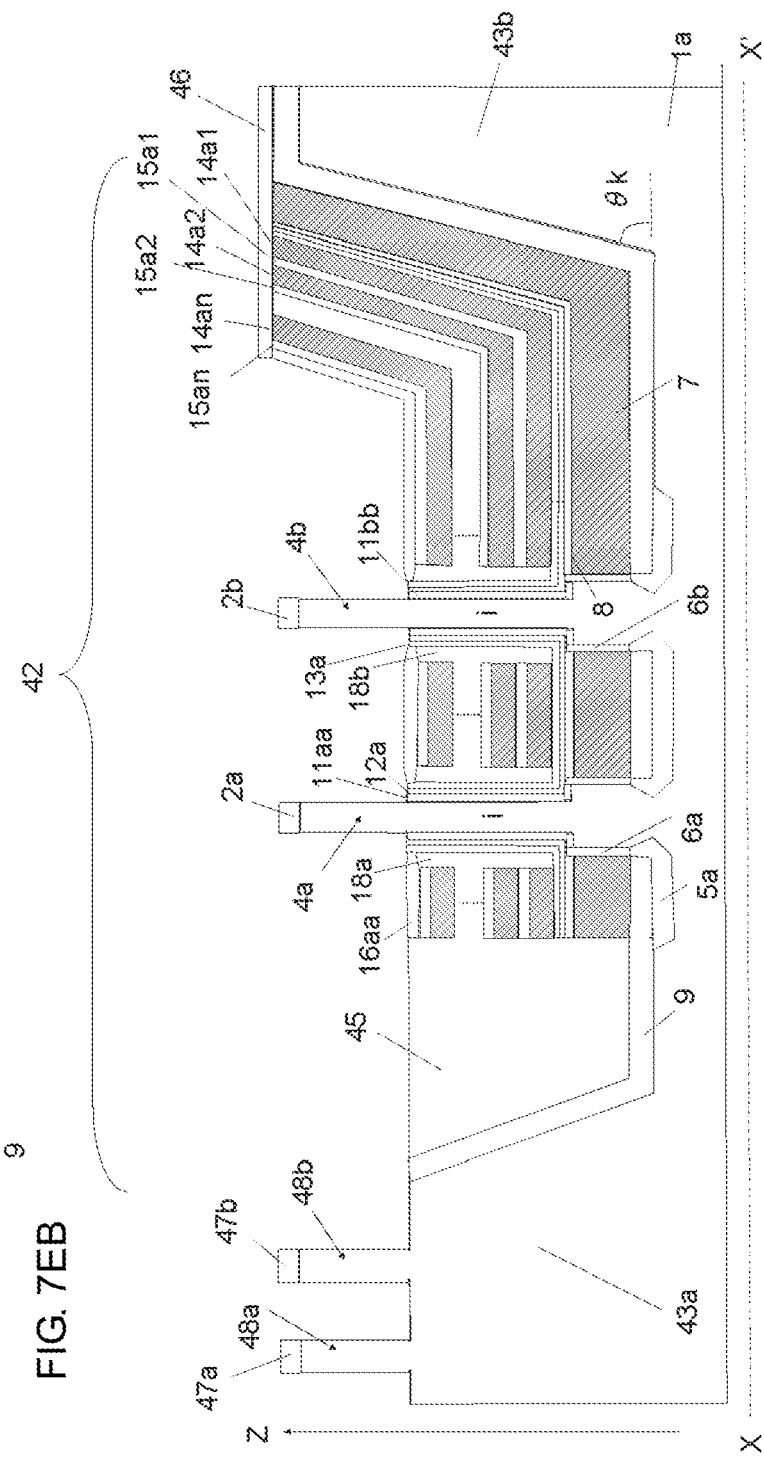

Next, as illustrated in FIGS. 7EA and 7EB, a Si$_3$N$_4$ layer 46 which is an insulating layer is formed on the doped Si layer 7, the Si$_3$N$_4$ layer 12$a$, the SiO$_2$ layer 13$a$, the doped Si layers 14$a$1, 14$a$2, and 14$an$, the SiO$_2$ layers 15$a$1, 15$a$2, and 15$an$, and the TiN layer 16$aa$ whose upper surfaces are exposed on the outer peripheral i-layer 43$b$. Subsequently, the SiO$_2$ layer 9 is etched by using a lithographic method and an RIE method to form SiO$_2$ layers 47$a$ and 47$b$. Subsequently, the outer peripheral i-layer 43$a$ is etched by using, for example, an RIE method using the SiO$_2$ layers 47$a$ and 47$b$ as a mask to form Si pillars 48$a$ and 48$b$, respectively, such that bottom surfaces of the Si pillars 48$a$ and 48$b$ have a height substantially equal to that of the upper surface of the TiN layer 16$aa$. Subsequently, the SiO$_2$ layers 45 and 9 on the memory element region 42 are etched by using, for example, an etch-back method such that the upper surfaces thereof have a height substantially equal to that of the upper surface of the TiN layer 16$aa$.

Figure 7F:
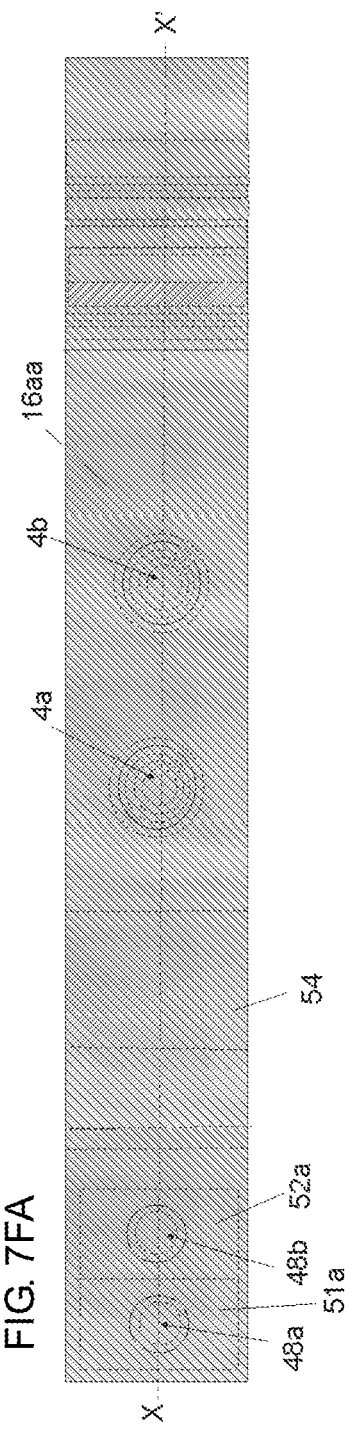
FIG. 7FA and FIG. 7FB are respectively a plan view and a sectional structural view illustrating a vertical NAND-type flash memory device according to the sixth embodiment and a method for producing the device.
Figure 7F:
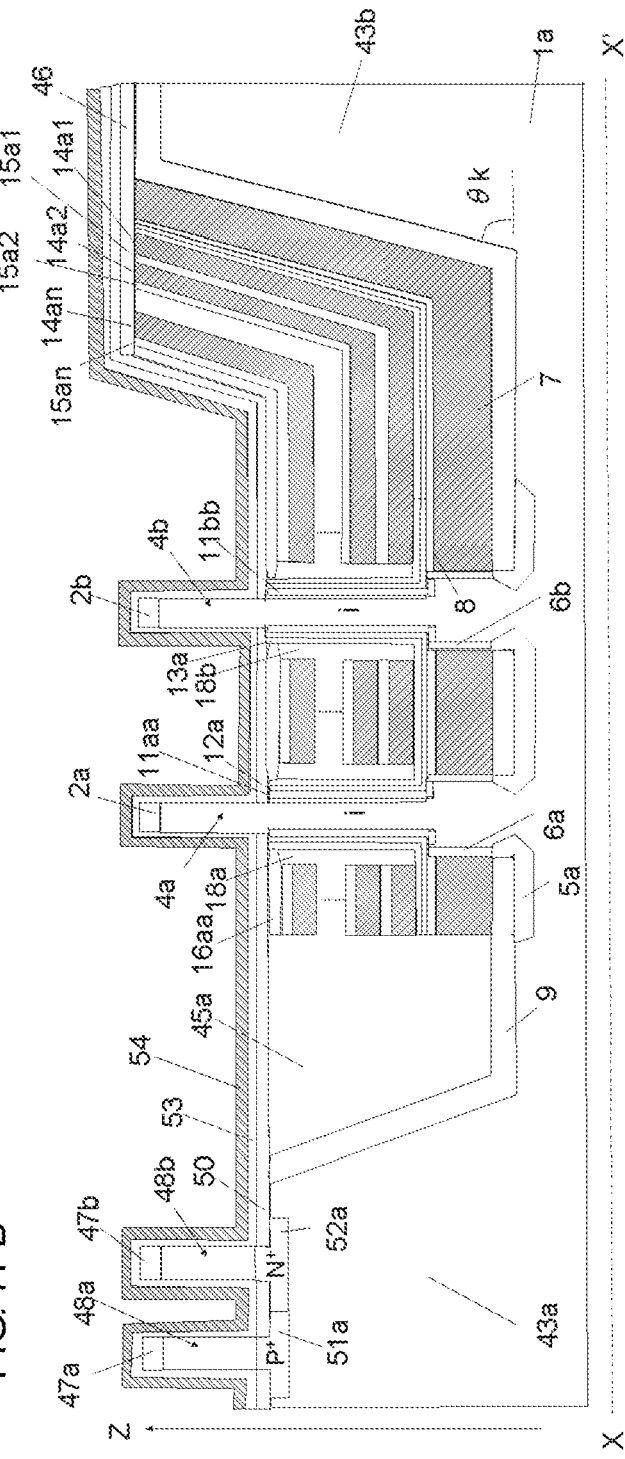

Next, as illustrated in FIGS. 7FA and 7FB, a P$^+$ layer 51$a$ is formed in a bottom portion of the Si pillar 48$a$ by using a lithographic method, an acceptor impurity ion implantation method, and a thermal diffusion method. Similarly, an N$^+$ layer 52$a$ is formed in a bottom portion of the Si pillar 48$b$ by using a lithographic method, a donor impurity ion implantation method, and a thermal diffusion method. Subsequently, a SiO$_2$ layer 50 is formed over the outer peripheries of the Si pillars 4$a$, 4$b$, 48$a$, and 48$b$. Subsequently, a HfO$_2$ layer 53 and a TiN layer 54 are deposited by an ALD method over the entire surface so as to cover the Si pillars 4$a$, 4$b$, 48$a$, and 48$b$.

Figure 7G:
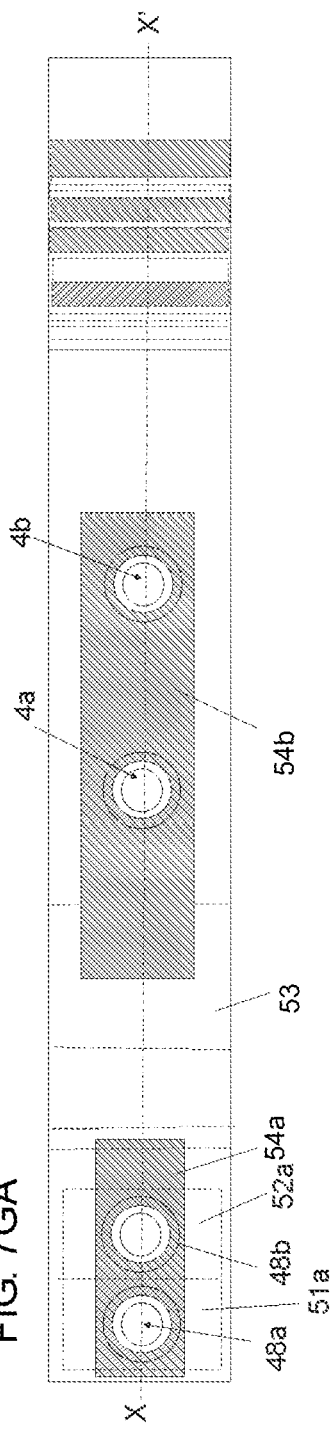
FIG. 7GA and FIG. 7GB are respectively a plan view and a sectional structural view illustrating a vertical NAND-type flash memory device according to the sixth embodiment and a method for producing the device.
Figure 7G:
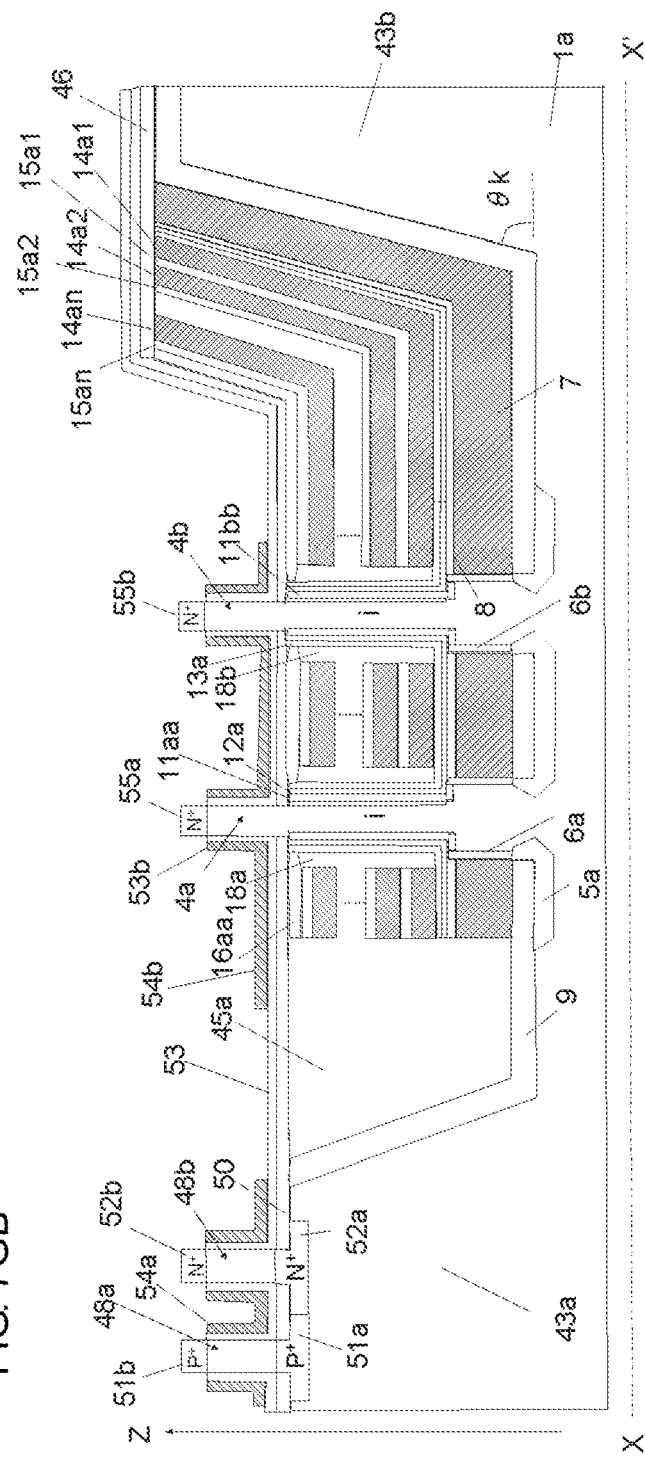

Next, as illustrated in FIGS. 7GA and 7GB, the TiN layer 54 is etched by using a lithographic method and an RIE method to form a TiN layer 54$a$ that surrounds the Si pillars 48$a$ and 48$b$ and that is connected to the Si pillars 48$a$, and 48$b$. At the same time, a TiN layer 54$b$ that surrounds the Si pillars 4$a$ and 4$b$ and that is connected to the Si pillars 4$a$, and 4$b$ is formed. Subsequently, parts of the HfO$_2$ layer 53 and the TiN layers 54$a$ and 54$b$ disposed on top portions of the Si pillars 4$a$, 4$b$, 48$a$, and 48$b$ are removed. Subsequently, by using a lithographic method and an ion implantation method, a P$^-$ layer 51$b$ is formed in a top portion of the Si pillar 48$a$, and N$^-$ layers 52$b$, 55$a$, and 55$b$ are respectively formed in top portions of the Si pillars 48$b$, 4$a$, and 4$b$.

Figure 7H:
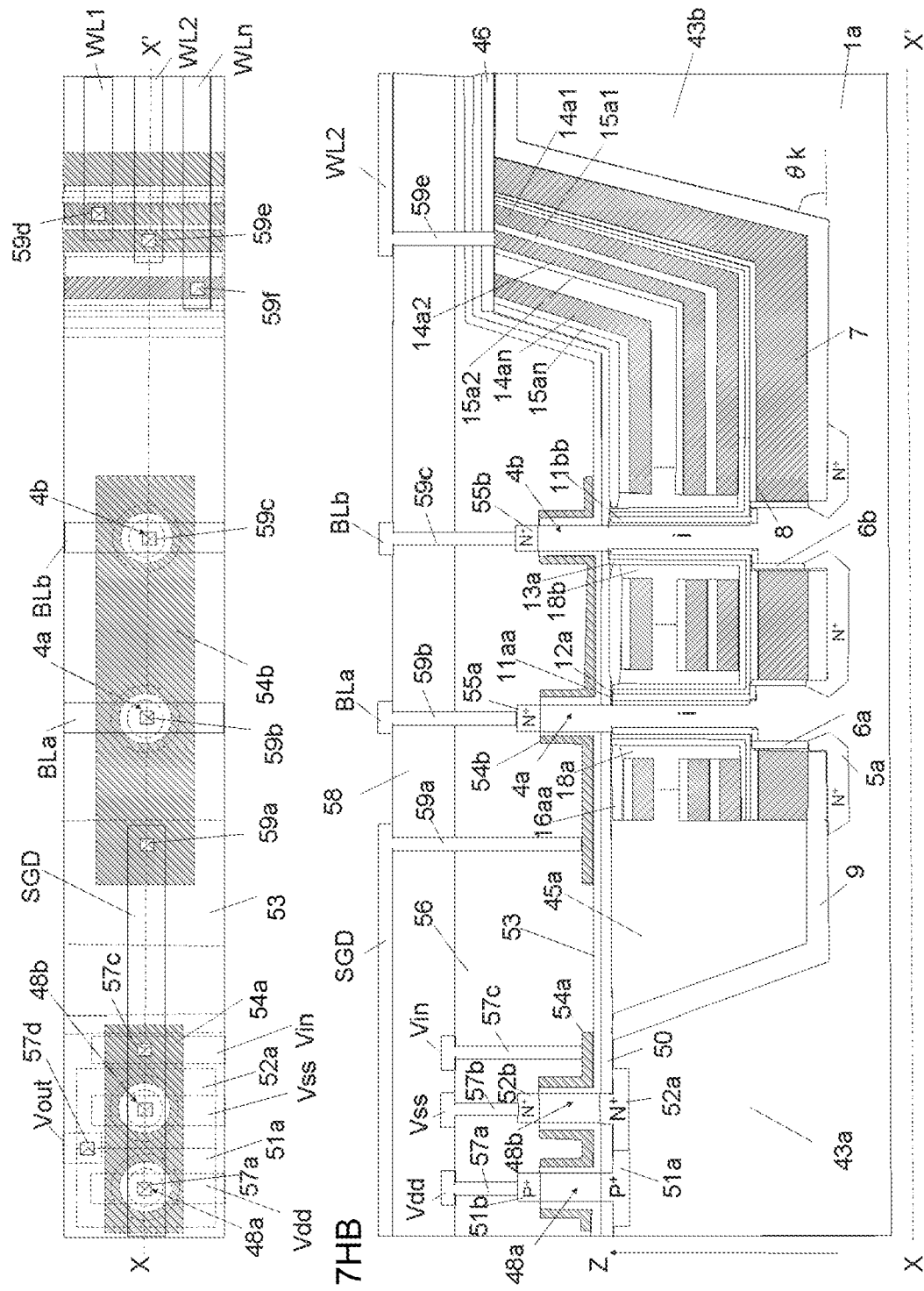
FIG. 7HA and FIG. 7HB are respectively a plan view and a sectional structural view illustrating a vertical NAND-type flash memory device according to the sixth embodiment and a method for producing the device.

Next, as illustrated in FIGS. 7HA and 7HB, SiO$_2$ is deposited by a CVD method, and a SiO$_2$ layer 56 whose surface is smoothly polished is formed by a CMP method such that the surface of the SiO$_2$ layer 56 is located higher than the upper surface of the outer peripheral i-layer 43$b$. Subsequently, a contact hole 57$a$ is formed on the Si pillar 48$a$. A contact hole 57$b$ is formed on the Si pillar 48$b$. A contact hole 57$c$ is formed on the TiN layer 54$a$. A contact hole 57$d$ is formed on a boundary line between the P$^+$ layer 51$a$ and the N$^+$ layer 52$a$ that are formed in a surface layer of the outer peripheral i-layer 43$a$. Subsequently, a power supply wiring metal layer Vdd connected to the P$^+$ layer 51$b$ through the contact hole 57$a$, a ground wiring metal layer Vss connected to the N$^+$ layer 52$b$ through the contact hole 57$b$, an input wiring metal layer Vin connected to the TiN layer 54$a$ through the contact hole 57$c$, and an output wiring metal layer Vout connected to the P$^+$ layer 51$a$ and the N$^+$ layer 52$a$ through the contact hole 57$d$ are formed. Subsequently, a SiO$_2$ layer 58 having a smooth surface is formed so as to cover the whole by using a CVD method and a CMP method. Subsequently, a contact hole 59$a$ is formed on the TiN layer 54$b$. A contact hole 59$b$ is formed on the Si pillar 4$a$. A contact hole 59$c$ is formed on the Si pillar 4$b$. A contact hole 59$d$ is formed on the doped Si layer 14$a$1 extending to the top of the outer peripheral i-layer 43$b$. A contact hole 59$e$ is formed on the doped Si layer 14$a$2 extending to the top of the outer peripheral i-layer 43$b$. A contact hole 59$f$ is formed on the doped Si layer 14$an$ extending to the top of the outer peripheral i-layer 43$b$. Subsequently, a drain-side selection gate wiring metal layer SGD connected to the TiN layer 54$b$ through the contact hole 59$a$, a bit-line wiring metal layer BLa connected to the N$^+$ layer 55$a$ through the contact hole 59$b$, a bit-line wiring metal layer BLb connected to the N$^+$ layer 55$b$ through the contact hole 59$c$, a word-line wiring metal layer WL1 connected to the doped Si layer 14$a$1 through the contact hole 59$d$, a word-line wiring metal layer WL2 connected to the doped Si layer 14$a$2 through the contact hole 59$e$, and word-line wiring metal layer WLn connected to the doped Si layer 14an through the contact hole 59f are formed. Similarly, the N⁺ layer 5a is connected to a common source wiring layer, and the doped Si layer 7 is connected to a source-side selection gate wiring layer (the common source wiring layer and the source-side selection gate wiring layer are not shown in the figures).

As illustrated in FIGS. 7HA and 7HB, a P-channel surrounding gate MOS transistor (SGT) and an N-channel SGT are formed on the outer peripheral i-layer 43a (regarding an SGT, refer to, for example, Japanese Unexamined Patent Application Publication No. 2-188966). In the P-channel SGT, the P⁻ layer 51a functions as a source, the P⁺ layer 51b functions as a drain, the Si pillar 48a disposed between the P⁺ layers 51a and 51b functions as a channel, and the TiN layer 54a functions as a gate. In the N-channel SGT, the N⁺ layer 52a functions as a source, the N⁺ layer 52b functions as a drain, the Si pillar 48b disposed between the N⁻ layers 52a and 52b functions as a channel, and the TiN layer 54a functions as a gate. The P-channel SGT and the N-channel SGT that are respectively formed in the Si pillars 48a and 48b form a CMOS inverter circuit. A vertical NAND-type flash memory device, as illustrated in FIG. 1, in which memory cell-transistors are connected in series in n stages is formed around the Si pillars 4a and 4b in the memory element region 42.

According to the sixth embodiment, the following advantages are achieved.

1. The P-channel SGT formed in the Si pillar 48a, the N-channel SGT formed in the Si pillar 48b, and drain-side selection transistors of the vertical NAND-type flash memory device formed in top portions of the Si pillars 4a and 4b are formed so as to have heights that are equal to each other. Accordingly, the HfO₂ layer 53 which is gate insulating layers of the P-channel SGT, the N-channel SGT, and the drain-side selection transistor can be formed at the same time. Similarly, the TiN layer 54 which is gate conductor layers of the P-channel SGT, the N-channel SGT, and the drain-side selection transistor can be formed at the same time. Similarly, the N⁺ layer 52b of the N-channel SGT, and the N⁺ layers 55a and 55b of the vertical NAND-type flash memory device can be formed at the same time. In this manner, many steps necessary for forming a peripheral circuit formed of the P-channel SGT and the N-channel SGT that are disposed on the outer peripheral i-layer 43a and many steps necessary for forming the drain-side selection transistor of the vertical NAND-type flash memory device can be performed in common. Therefore, a reduction in the cost of the NAND-type flash memory device produced can be realized.

2. In the vertical NAND-type flash memory device, the doped Si layers 14a1, 14a2, and 14an functioning as word-line conductor layers and the SiO₂ layers 15a1, 15a2, and 15an for insulating the doped Si layers 14a1, 14a2, and 14an from each other are formed by allowing material atoms to be incident from a direction perpendicular to a surface of the i-layer substrate 1a using a bias sputtering method. In the Si pillars 4a and 4b, these material layers are deposited by using the Si₃N₄ layers 2a and 2b as a mask under the condition in which the deposition rate of the bias sputtering is higher than the removal rate with respect to the inclination angle θk of the outer peripheral i-layers 43a and 43b. Accordingly, gas layers (spaces) 18a and 18b can be formed on the outer peripheries of the Si pillars 4a and 4b, respectively. In addition, the doped Si layers 14a1, 14a2, and 14an and the SiO₂ layers 15a1, 15a2, and 15an are formed on a side face of the outer peripheral i-layer 43b in a continuous manner. As a result, the word-line wiring metal layers WL1, WL2, and WLn can be respectively formed through the contact holes 59d, 59e, and 59f, whose bottom surfaces have heights equal to each other. Therefore, the steps of forming the word-line wiring metal layers WL1, WL2, and WLn are simplified to realize a reduction in the production cost of the NAND-type flash memory device.

Seventh Embodiment

A method for producing a vertical NAND-type flash memory device according to a seventh embodiment of the present invention will be described with reference to FIGS. 8AA to 8BC. FIG. 8AA is a plan view, FIG. 8AB is a sectional view taken along line X-X' in FIG. 8AA, and FIG. 8AC is a sectional view taken along line Y-Y' in FIG. 8AA. FIG. 8BA is a plan view, FIG. 8BB is a sectional view taken along line X-X' in FIG. 8BA, and FIG. 8BC is a sectional view taken along line Y-Y' in FIG. 8BA.

As illustrated in FIGS. 8AA to 8AC, a SiGe layer 13a which is to become a protective layer is formed instead of the SiO₂ layer 13 which is to become an interlayer insulating layer in FIGS. 2FA to 2FC. Subsequently, as in FIGS. 2FA to 2FC, a Si material that contains a donor or acceptor impurity and a SiO₂ material are incident from a direction perpendicular to a surface of an i-layer substrate 1a to form doped Si layers 14a1, 14a2, and 14an and SiO₂ layers 15a1, 15a2, and 15an on outer peripheries of Si pillars 4a, 4b, 4c, and 4d. In this embodiment, doped Si layers 14b1, 14b2, 14bn, 14c1, 14c2, 14cn, 14d1, 14d2, 14dn, 14e1, 14e2, and 14en (the doped Si layers 14d1, 14d2, and 14dn are not shown in the figures) and SiO₂ layers 15b1, 15b2, 15bn, 15c1, 15c2, 15cn, 15d1, 15d2, 15dn, 15e1, 15e2, and 15en (the SiO₂ layers 15d1, 15d2, and 15dn are not shown in the figure) are stacked on the Si pillars 4a, 4b, 4c, and 4d. Subsequently, a TiN (titanium nitride) layer 16a and a SiO₂ layer 17a are similarly formed on the outer peripheries of the Si pillars 4a, 4b, 4c, and 4d by using, for example, a bias sputtering method. At the same time, TiN layers 16b, 16c, 16d, and 16e (the TiN layer 16d is not shown in the figures), and SiO₂ layers 17b, 17c, 17d, and 17e (the SiO₂ layer 17d is not shown in the figure) are stacked on the Si pillars 4a, 4b, 4c, and 4d, respectively.

Next, as illustrated in FIGS. 8BA to 8BC, the SiGe layer 13a exposed on the outside of the Si pillars 4a, 4b, 4c, and 4d is removed. In this case, SiGe layers 13b, 13ca, 13cb, 13cc (not shown), and 13cd are left under the doped Si layers 14a1, 14b1, 14c1, 14d1, and 14e1, respectively. Subsequently, the steps illustrated in FIGS. 2GA to 2KC are performed. As a result, a vertical NAND-type flash memory device in which memory cell-transistors are connected in series in n stages is formed on the i-layer substrate 1a.

According to the seventh embodiment, the following advantages are achieved. As in the first embodiment, a Si material that contains a donor or acceptor impurity and a SiO₂ material are incident from a direction perpendicular to a surface of the i-layer substrate 1a by using a bias sputtering method to form the doped Si layers 14a1, 14a2, and 14an and the SiO₂ layers 15a1, 15a2, and 15an on outer peripheries of the Si pillars 4a, 4b, 4c, and 4d. In the first embodiment, during bias sputtering, argon atoms, Si atoms, and SiO₂ particles that are rebounded from a deposited surface collide against the SiO₂ layer 13, which is an interlayer insulating layer, with high energy. As a result, defects generated in the SiO₂ layer 13, and the Si atoms and SiO₂ particles adhering to the surface of the SiO₂ layer 13 cause variations in characteristics of the NAND-type flash memory-cell. In contrast, in this embodiment, the SiGe layer 13a, which may cause variations in characteristics of the NAND-type flash memory-cell, is removed after the formation of the doped Si layers 14a1, 14a2, and 14an and the SiO₂ layers 15a1, 15a2, and 15an by bias sputtering. Thus, the above-described variations in characteristics of the NAND-type flash memory-cell can be prevented. Although this cell structure does not include the SiO₂ layer 13a, which is to become an interlayer insulating layer in the first embodiment, the space between the doped Si layers 14a1, 14a2, and 14an and the SiO₂ layers 15a1, 15a2, and 15an, and a Si₃N₄ layer 12a functioning as a data charge storage insulating layer serves as an interlayer insulating layer.

Eighth Embodiment

Figure 9A:
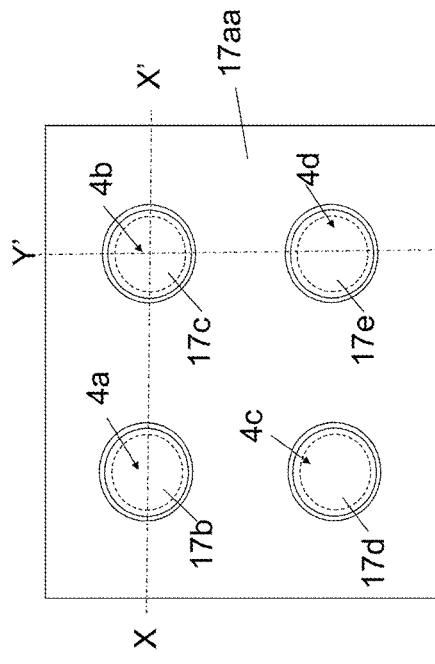
FIG. 9A and FIGS. 9B and 9C are respectively a plan view and sectional structural views illustrating a vertical NAND-type flash memory device according to an eighth embodiment of the present invention and a method for producing the device.

A method for producing a vertical NAND-type flash memory device according to an eighth embodiment of the present invention will be described with reference to FIGS. 9A to 9C. FIG. 9A is a plan view, FIG. 9B is a sectional view taken along line X-X' in FIG. 9A, and FIG. 9C is a sectional view taken along line Y-Y' in FIG. 9A.

Figure 9B:
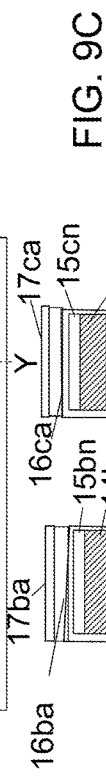
Figure 9C:
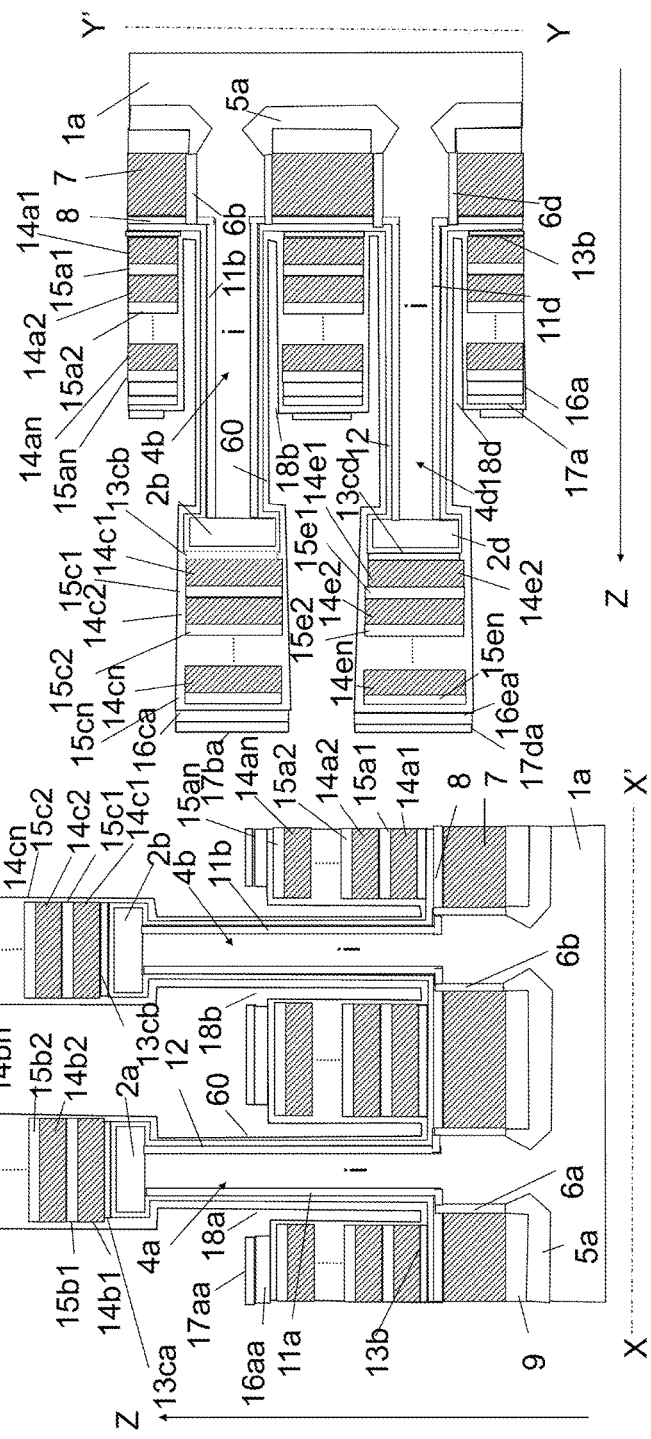

As illustrated in FIGS. 9A to 9C, the removal of the SiGe layer 13a illustrated in FIGS. 8BA to 8BC is performed before a TiN layer 16a and a SiO₂ layer 17a are formed on outer peripheries of Si pillars 4a, 4b, 4c, and 4d. Subsequently a SiO₂ layer 60 which is to become an interlayer insulating layer is formed over the entire surface by an ALD method. In this case, the SiO₂ layer 60 is formed also in gas layers (spaces, for example, air layers containing air) 18a, 18b, 18c, and 18d. Subsequently, a TiN layer 16a and a SiO₂ layer 17a are formed. Subsequently, the steps illustrated in FIGS. 2GA to 2KC are performed. As a result, a vertical NAND-type flash memory device in which memory cell-transistors are connected in series in n stages is formed on an i-layer substrate 1a.

According to the eighth embodiment, the following advantages are achieved. According to this embodiment, two SiO₂ layers 60 each of which is to become an interlayer insulating layer can be provided between a Si₃N₄ layer 12a functioning as a data charge storage insulating layer and the doped Si layers 14a1, 14a2, and 14an functioning as word-line conductor layers and the SiO₂ layers 15a1, 15a2, and 15an. The SiO₂ layer 60 can have a function of protecting the side faces of the Si₃N₄ layer 12a and the doped Si layers 14a1, 14a2, and 14an. Thus, it is possible to realize a NAND-type flash memory-cell whose characteristic variations are prevented.

Ninth Embodiment

A method for producing a vertical NAND-type flash memory device according to a ninth embodiment of the present invention will be described with reference to FIGS. 10A to 10C. FIG. 10A is a plan view, FIG. 10B is a sectional view taken along line X-X' in FIG. 10A, and FIG. 10C is a sectional view taken along line Y-Y' in FIG. 10A.

As illustrated in FIGS. 10A to 10C, a SiO₂ layer 60a is formed over the entire surface by an ALD method as in FIGS. 9A to 9C. In this case, the SiO₂ layer 60a is formed so as to fill the whole gas layers 18a, 18b, 18c, and 18d. Since the SiO₂ layer 60a fills the whole gas layers 18a, 18b, 18c, and 18d, it is not necessary to form any of the TiN layer 16aa and the SiO₂ layer 17aa on the SiO₂ layer 15an, and the TiN layers 16ba, 16ca, 16da, and 16ea and the SiO₂ layers 17ba, 17ca, 17da, and 17ea that are respectively disposed on the SiO₂ layers 15bn, 15cn, 15dn, and 15en in FIGS. 9A to 9C. Subsequently, the steps illustrated in FIGS. 2GA to 2KC are performed. As a result, a vertical NAND-type flash memory device in which memory cell-transistors are connected in series in n stages is formed on an i-layer substrate 1a.

According to the ninth embodiment, the following advantages are achieved. In this embodiment, since the SiO₂ layer 60a fills the whole gas layers 18a, 18b, 18c, and 18d, it is not necessary to form any of the TiN layer 16aa and the SiO₂ layer 17aa on the SiO₂ layer 15an, and the TiN layers 16ba, 16ca, 16da, and 16ea and the SiO₂ layers 17ba, 17ca, 17da, and 17ea that are respectively disposed on the SiO₂ layers 15bn, 15cn, 15dn, and 15en in FIGS. 9A to 9C. Accordingly, the production process can be simplified.

Tenth Embodiment

Figure 11A:
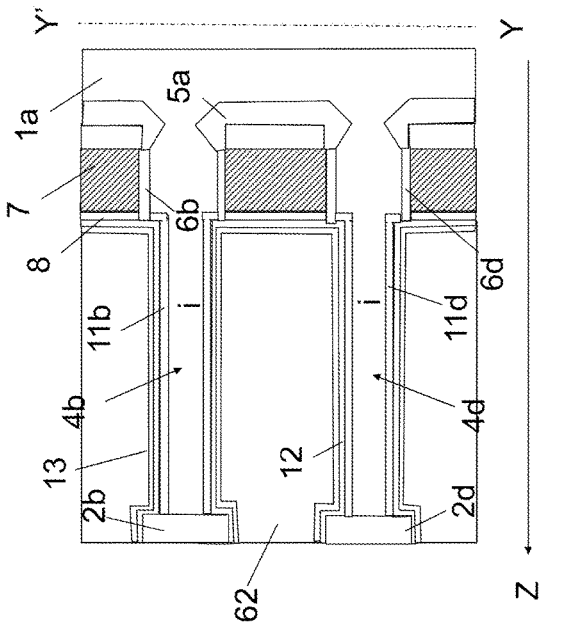
FIG. 11AA and FIGS. 11AB and 11AC are respectively a plan view and sectional structural views illustrating a vertical NAND-type flash memory device according to a tenth embodiment of the present invention and a method for producing the device.
Figure 11A:
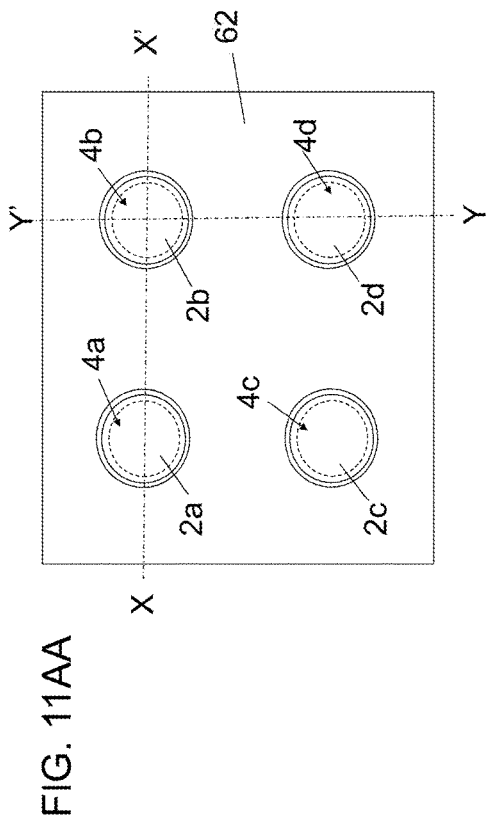
Figure 11A:
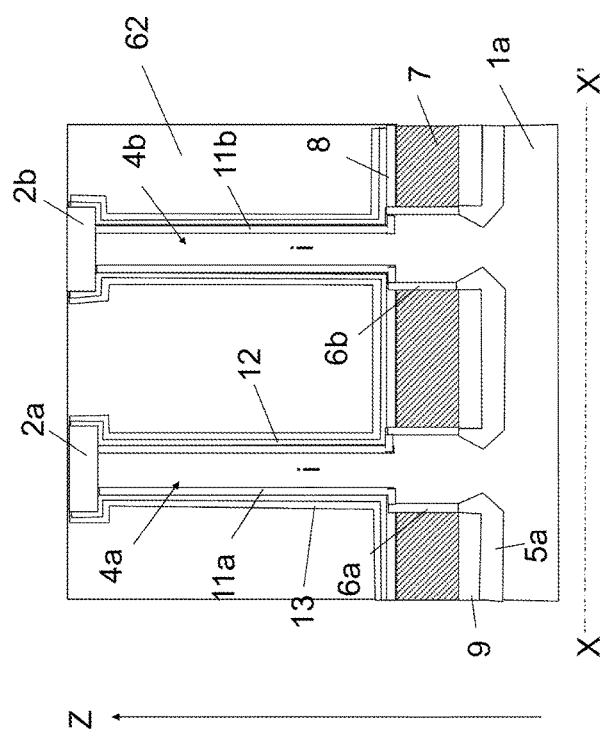

A method for producing a vertical NAND-type flash memory device according to a tenth embodiment of the present invention will be described with reference to FIGS. 11AA to 11DC. In FIGS. 11AA to 11DC, the drawings whose last reference character is A are plan views, the drawings whose last reference character is B are sectional views taken along line X-X' in the drawings whose last reference character is A, and the drawings whose last reference character is C are sectional views taken along line Y-Y' in the drawings whose last reference character is A.

After the steps illustrated in FIGS. 2AA to 2EC are performed, a SiGe layer (not shown) is deposited over the entire surface. Subsequently, as illustrated in FIGS. 11AA to 11AC, the SiGe layer is polished by a CMP method so that the upper surface of the SiGe layer becomes flush with the upper surfaces of Si₃N₄ layers 2a to 2d to form a SiGe layer 62.

Figure 11B:
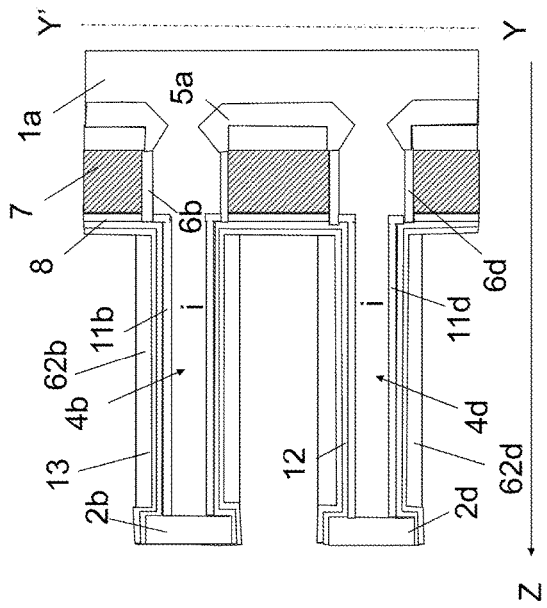
FIG. 11BA and FIGS. 11BB and 11BC are respectively a plan view and sectional structural views illustrating a vertical NAND-type flash memory device according to the tenth embodiment and a method for producing the device.
Figure 11B:
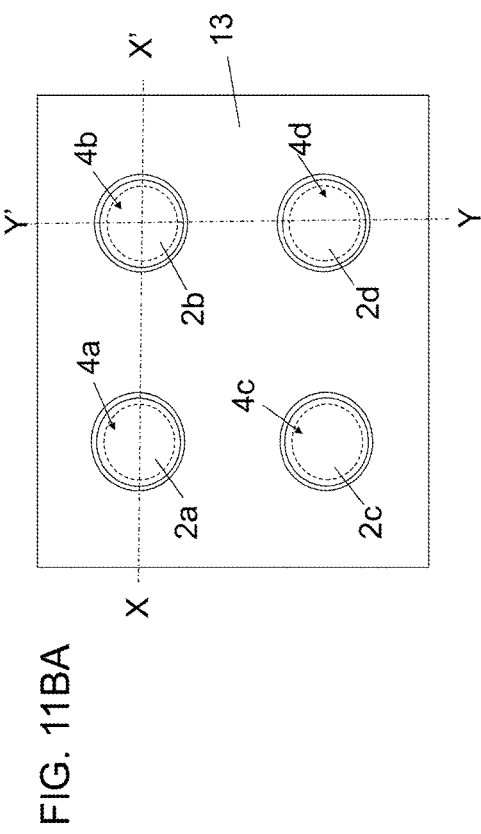
Figure 11B:
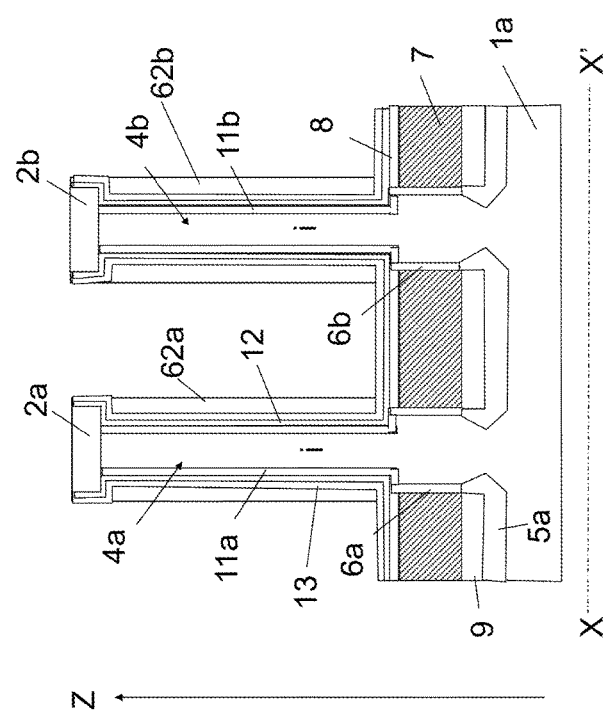
Figure 13:
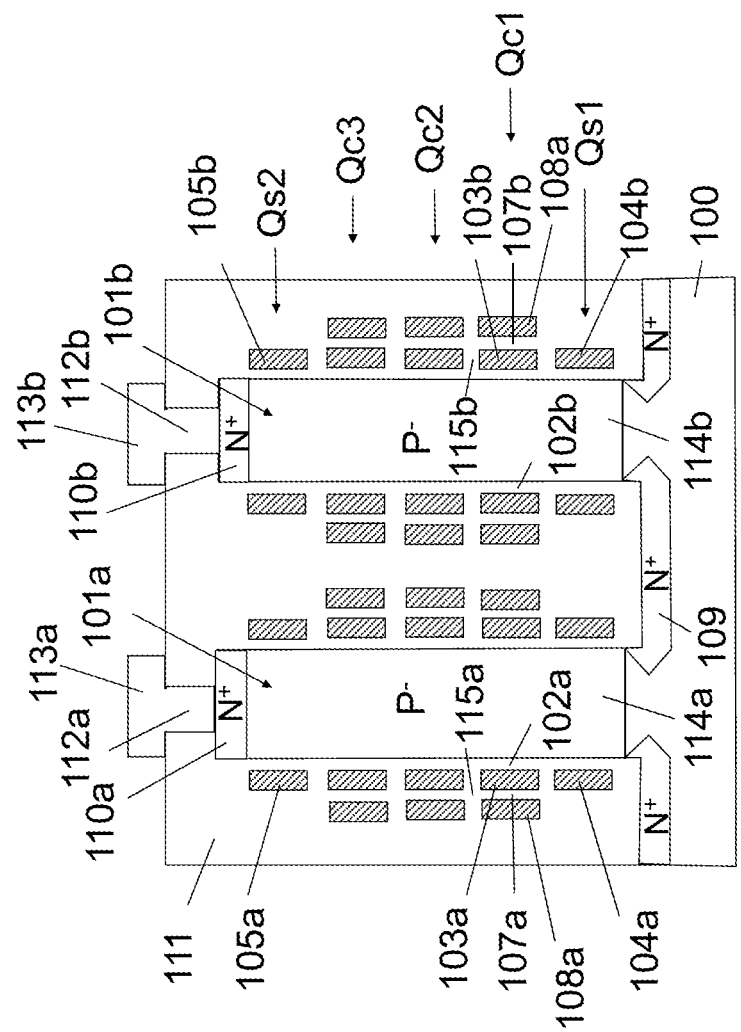
FIG. 13 is a sectional structural view of an example of a vertical NAND-type flash memory device in the related art.

Next, as illustrated in FIGS. 11BA to 11BC, the SiGe layer 62 is etched by an RIE method using the Si₃N₄ layers 2a, 2b, 2c, and 2d as a mask to form SiGe layers 62a, 62b, 62c (not shown), and 62d on the outside of Si pillars 4a, 4b, 4c, and 4d, respectively.

Next, as illustrated in FIGS. 11CA to 11CC, doped Si layers 14a1, 14a2, and 14an and SiO₂ layers 15a1, 15a2, and 15an are formed on the outer peripheries of the SiGe layers 62a to 62d by using a bias sputtering method as in the step illustrated in FIGS. 2FA to 2FC. At the same time, doped Si layers 14b1, 14b2, 14bn, 14c1, 14c2, 14cn, 14d1, 14d2, 14dn, 14e1, 14e2, and 14en (the doped Si layers 14d1, 14d2, and 14dn are not shown in the figures) and SiO₂ layers 15b1, 15b2, 15bn, 15c1, 15c2, 15cn, 15d1, 15d2, 15dn, 15e1, 15e2, and 15en (the SiO₂ layers 15d1, 15d2, and 15dn are not shown in the figure) are stacked on the Si pillars 4a, 4b, 4c, and 4d. Subsequently, a TiN (titanium nitride) layer 16a and a SiO₂ layer 17a are similarly formed on the outer peripheries of the Si pillars 4a, 4b, 4c, and 4d by using, for example, a bias sputtering method. At the same time, TiN layers 16b, 16c, 16d, and 16e and SiO₂ layers 17b, 17c, 17d, and 17e are stacked on the Si pillars 4a, 4b, 4c, and 4d, respectively.

Next, as illustrated in FIGS. 11DA to 11DC, the SiGe layers 62a to 62d are removed. Gas layers 63a, 63b, 63c (not shown), and 64d are formed between a SiO₂ layer 13, which is an interlayer insulating layer, and the doped Si layers 14a1, 14a2, and 14an and the SiO₂ layers 15a1, 15a2, and 15an. Subsequently, the steps illustrated in FIGS. 2GA to 2KC are performed. As a result, a vertical NAND-type flash memory device in which memory cell-transistors are connected in series in n stages is formed on an i-layer substrate 1a.

According to the tenth embodiment, the following advantages are achieved. In this embodiment, due to the presence of the SiGe layers 62a, 62b, 62c, and 62d, it is possible to prevent, during bias sputtering, argon atoms, Si atoms, and SiO$_2$ particles that are rebounded from a deposited surface from colliding against the SiO$_2$ layer 13, which is an interlayer insulating layer, with high energy, as in the seventh embodiment. In addition, since the thickness of each of the SiGe layers 62a, 62b, 62c, and 62d can be made larger than that of the SiGe layer 13a in the seventh embodiment, the damage prevention effect is also higher than that in the seventh embodiment. In this embodiment, the SiGe layers 62a, 62b, 62c, and 62d are removed after the doped Si layers 14a1, 14a2, and 14an and the SiO$_2$ layers 15a1, 15a2, and 15an are similarly formed by using a bias sputtering method, as in the seventh embodiment. Accordingly, the variations in characteristics of the NAND-type flash memory-cell can be prevented.

Eleventh Embodiment

A method for producing a vertical NAND-type flash memory device according to an eleventh embodiment of the present invention will be described with reference to FIGS. 12A to 12C. FIG. 12A is a plan view, FIG. 12B is a sectional view taken along line X-X' in FIG. 12A, and FIG. 12C is a sectional view taken along line Y-Y' in FIG. 12A.

Instead of the SiGe layer 62 in FIGS. 11AA to 11AC, for example, an aluminum oxide (AlO) layer (not shown) is formed. Subsequently, the steps illustrated in FIGS. 11BA to 11CC are performed. In this case, neither the formation of the TiN layer 16a and the SiO$_2$ layer 17a on the outer peripheries of the Si pillars 4a, 4b, 4c, and 4d nor the formation of the TiN layers 16b, 16c, 16d, and 16e and the SiO$_2$ layers 17b, 17c, 17d, and 17e on the Si pillars 4a, 4b, 4c, and 4d, respectively, illustrated in FIGS. 11CA to 11CC is performed. Subsequently, as illustrated in FIGS. 12A to 12C, part of the AlO layer disposed above the upper surface of a SiO$_2$ layer 15an is removed. Thus, AlO layers 64a, 64b, 64c (not shown), and 64d which are interlayer insulating layers are formed between a side face of a SiO$_2$ layer 13 and side faces of doped Si layers 14a1, 14a2, and 14an and SiO$_2$ layers 15a1, 15a2, and 15an. Subsequently, the steps illustrated in FIGS. 2HA to 2KC are performed. As a result, a vertical NAND-type flash memory device in which memory cell-transistors are connected in series in n stages is formed on an i-layer substrate 1a.

According to the eleventh embodiment, the following advantages are achieved. If damage to the AlO layers 64a, 64b, 64c, and 64d can be sufficiently prevented during the formation of the doped Si layers 14a1, 14a2, and 14an and the SiO$_2$ layers 15a1, 15a2, and 15an, the AlO layers 64a, 64b, 64c, and 64d can be used as interlayer insulating layers of the memory cells. As a result, the production process can be simplified.

In the first embodiment, a description has been made of a case in which when a doped Si layer 14a1 and a SiO$_2$ layer 15a1 form one set, at least three sets of the doped Si layers 14a1, 14a2, and 14an and the SiO$_2$ layers 15a1, 15a2, and 15an are used in a vertical NAND-type flash memory. However, the structure in the first embodiment is applicable to other electrically erasable programmable read only memories (EEPROM) such as a NOR-type memory including one set of the doped Si layer 14a1 and the SiO$_2$ layer 15a1. This is also similarly applicable to other embodiments of the present invention.

In the first embodiment, atoms of a Si material that contains a donor or acceptor impurity and atoms of a SiO$_2$ material are incident from a direction perpendicular to an upper surface of the i-layer substrate 1a by using a bias sputtering method to form the doped Si layers 14a1, 14a2, and 14an and the SiO$_2$ layers 15a1, 15a2, and 15an on outer peripheries of the Si pillars 4a, 4b, 4c, and 4d. Alternatively, other methods may be used as long as the doped Si layers 14a1, 14a2, and 14an and the SiO$_2$ layers 15a1, 15a2, and 15an can be formed by allowing a Si material that contains a donor or acceptor impurity and a SiO$_2$ material to be incident from a direction perpendicular to an upper surface of the i-layer substrate 1a. This is also similarly applicable to other embodiments of the present invention.

The doped Si layers 14a1, 14a2, and 14an in the first embodiment may be formed of amorphous silicon or polysilicon. This is also similarly applicable to other embodiments of the present invention.

The doped Si layers 14a1, 14a2, and 14an in the first embodiment may each be a single layer or multiple layers formed of at least one material having electrical conductivity. This is also similarly applicable to other embodiments of the present invention.

The SiO$_2$ layers 11aa, 11bb, 11cc, and 11dd functioning as tunnel insulating layers, the Si$_3$N$_4$ layer 12a functioning as a data charge storage insulating layer, and the SiO$_2$ layer 13a functioning as an interlayer insulating layer in the first embodiment may each be a single layer or multiple layers formed of at least one other material as long as the functions of these layers can be achieved. This is also similarly applicable to other embodiments of the present invention.

In the first embodiment, the TiN layer 16a or a laminate including a poly-Si layer and nickel (Ni) is used. The TiN layer 16a or a NiSi layer expands in the horizontal direction of the drawing as a result of plastic deformation or volume expansion caused by heat treatment, so that the upper portions of the gas layers (spaces) 18a, 18b, 18c, and 18d are sealed. Alternatively, a layer formed of other materials may be used as long as the upper portions of the gas layers 18a, 18b, 18c, and 18d are sealed as in the case where such a TiN layer or a NiSi layer is used. This is also similarly applicable to other embodiments of the present invention.

In the description of the first embodiment, the doped Si layer 7 is used as an example of the source-side selection gate wiring metal layer (conductor layer) and the doped Si layer 20a is used as an example of the drain-side selection gate wiring metal layer (conductor layer). However, the layers are not limited thereto. Alternatively, conductor layers formed of other materials may be used. This is also similarly applicable to other embodiments of the present invention.

In the first embodiment, a NAND-type flash memory device is formed around the Si pillars 4a, 4b, 4c, and 4d. However, the structure is not limited thereto. The NAND-type flash memory device may be formed around other semiconductor pillars. This is also similarly applicable to other embodiments of the present invention.

In the first embodiment, a Si$_3$N$_4$ layer is etched by using, as a mask, resist layers 3a, 3b, 3c, and 3d each having a perfect circular shape using, for example, a reactive ion etching (RIE) method to form the Si$_3$N$_4$ layers 2a, 2b, 2c, and 2d, respectively. However, the shapes of these layers are not limited thereto. The shapes of the resist layers 3a, 3b, 3c, and 3d and the Si$_3$N$_4$ layers 2a, 2b, 2c, and 2d in plan view may be, for example, an ellipse. This is also similarly applicable to other embodiments of the present invention.

In the first embodiment, the i-layer substrate 1 is etched by using, as a mask, the resist layers 3a, 3b, 3c, and 3d and the Si$_3$N$_4$ layers 2a, 2b, 2c, and 2d using, for example, an RIE method to form the Si pillars 4a, 4b, 4c, and 4d, respectively. However, the method is not limited thereto. The i-layer substrate 1 may be etched by using the resist layers 3a, 3b, 3c, and 3d or the Si$_3$N$_4$ layers 2a, 2b, 2c, and 2d without using all the resist layers 3a, 3b, 3c, and 3d and the Si$_3$N$_4$ layers 2a, 2b, 2c, and 2d. Alternatively, the resist layers 3a, 3b, 3c, and 3d and Si$_3$N$_4$ layers 2a, 2b, 2c, and 2d may each be a single layer or multiple layers formed of at least one other material as long as the functions of these layers can be achieved. This is also similarly applicable to other embodiments of the present invention.

In the first embodiment, the doped Si layers 14a1, 14a2, and 14an which are to become word lines, and the doped Si layer 7 which is to become a source-side selection line have been described using a structure in which these layers are formed on outer peripheries of the Si pillars 4a, 4b, 4c, and 4d in a continuous manner. However, the structure is not limited thereto. In accordance with the specification of the device operation, as in the structure of the doped Si layers 20a and 20b which are to become drain-side selection lines, the doped Si layers 14a1, 14a2, and 14an and the doped Si layer 7 may have a separated structure including doped Si layers formed on outer peripheries of the Si pillars 4a and 4b in a continuous manner and doped Si layers formed on outer peripheries of the Si pillars 4c and 4d in a continuous manner. This structure is also within the technical idea of the present invention. This is also similarly applicable to other embodiments of the present invention.

In the first embodiment, a description has been made using a structure in which the Si pillars 4a, 4b, 4c, and 4d have the N$^+$ layer 5a functioning as a common source in a bottom portion thereof and the N$^+$ layers 24a, 24b, 24c, and 24d functioning as drains in top portions thereof. The technical idea of the present invention is also applicable to a vertical NAND-type flash memory device (refer to, for example, the specification of U.S. Pat. No. 8,189,371) in which two Si pillars form a single NAND-type flash memory device. In this case, the common source N$^+$ layer 5a and the drain N$^-$ layers 24a, 24b, 24c, and 24d are formed in top portions of the Si pillars 4a, 4b, 4c, and 4d. The channels of the NAND-type flash memory device include a channel of a Si pillar connected to the common source N$^+$ layer and a channel of a Si pillar connected to one drain N$^+$ layer connected to the channel. This is also similarly applicable to other embodiments of the present invention.

The hydrogen heat treatment in the second embodiment has been described using the first embodiment as an example. This is also similarly applicable to other embodiments of the present invention.

The content described in the fourth embodiment is also applicable to other embodiments of the present invention.

In the fourth embodiment, the truncated cone-shaped Si$_3$N$_4$ layers 2A, 2B, 2C, and 2D are formed instead of the Si$_3$N$_4$ layers 2a, 2b, 2c, and 2d. The truncated cone-shaped stacked material layers 41a, 41b, 41c, and 41d are formed on the truncated cone-shaped Si$_3$N$_4$ layers 2A, 2B, 2C, and 2D, respectively. The shape of each of the truncated cone-shaped stacked material layers 41a, 41b, 41c, and 41d is not limited to such a truncated cone shape but may be any tapered shape. This is also similarly applicable to other embodiments of the present invention.

In the sixth embodiment, the Si pillars 48a and 48b are formed such that the bottom surfaces of the Si pillars 48a and 48b have a height substantially equal to that of the upper surface of the TiN layer 16aa. However, the structure is not limited thereto. The height of the bottom surfaces of the Si pillars 48a and 48b may be in the vicinity of the height of the surface of the TiN layer 16aa as long as the SGTs are formed in the Si pillars 48a and 48b.

In the sixth embodiment, a single-layered TiN layer 54 is used. However, the layer is not limited thereto. Instead of the single-layered TiN layer 54, for example, a layer having a two-layer structure including a poly-Si layer, or a layer formed of another material may also be used.

In the sixth embodiment, the contact holes 59d, 59e, and 59f are formed in the vicinity of the center line X-X' of the Si pillars 4a and 4b in which a NAND-type flash memory device is formed. However, the structure is not limited thereto. Since the doped Si layers 14a1, 14a2, and 14an are formed over the entire memory element region 42 in a continuous manner, the contact holes 59d, 59e, and 59f need not be necessarily formed so as to gather in the vicinity of the line X-X' as illustrated in FIGS. 7HA and 7HB.

In the sixth embodiment, a description has been made of an example in which a CMOS inverter circuit including the P-channel SGT and the N-channel SGT is formed in the Si pillars 48a and 48b on the outer peripheral i-layer 43a. Also in the case where a circuit using other SGTs is formed, the technical idea of the present invention is applicable.

The Si$_3$N$_4$ layers 2a, 2b, 2c, and 2d used as mask material layers in the first embodiment may each be a single layer or multiple layers formed of at least one other material as long as the single layer or the multiple layers have a function of a mask material layer required in the present invention. The mask material layer is not limited to an insulating layer and may be formed by a conductor layer, a semiconductor layer, or an organic material layer as long as the layer has a function of a mask material layer required in the present invention. This is also similarly applicable to other embodiments of the present invention.

In the first embodiment, the SiO$_2$ layer 13 which is to become an interlayer insulating layer is formed. However, the formation of the SiO$_2$ layer 13 may be omitted. In this case, a space between the side faces of the doped Si layers 14a1, 14a2, and 14an and the SiO$_2$ layers 15a1, 15a2, and 15an and the side face of the Si$_3$N$_4$ layer 12 which is to become a data charge storage insulating layer functions as an interlayer insulating layer. This is also similarly applicable to other embodiments of the present invention.

In the first embodiment, the source-side selection transistors STS1 and STS2 which are SGTs are formed in bottom portions of the Si pillars 4a to 4d. Alternatively, other transistors, such as planar MOS transistors or fin transistors may be used as the source-side selection transistors STS1 and STS2. This is also similarly applicable to other embodiments of the present invention.

In the first embodiment, as illustrated in FIGS. 2FA to 2FC, a deposition mask for forming the doped Si layers 14a1, 14a2, and 14an and the SiO$_2$ layers 15a1, 15a2, and 15an is formed by the Si$_3$N$_4$ layers 2a, 2b, 2c, and 2d, and the SiO$_2$ layer 13 and the Si$_3$N$_4$ layer 12 that surround the side faces of the Si$_3$N$_4$ layers 2a, 2b, 2c, and 2d. In this manner, any material layer formed on the Si pillars 4a to 4d so as to have an outer peripheral edge outside each of the outer peripheral edges of the Si pillars 4a to 4d in plan view can be used as a mask material layer. In addition, the SiGe layers 62a, 62b, 62c, and 62d covering the side face of the SiO$_2$ layer 13 and described in the tenth embodiment also function as a deposition mask. This is also similarly applicable to other embodiments of the present invention.

The SiGe layer 13a in the seventh embodiment, the SiGe layer 62 in the tenth embodiment, the SiO$_2$ layer 60 in the eighth embodiment, the SiO$_2$ layer 60a in the ninth embodiment, and the AlO layers 64*a*, 64*b*, 64*c*, and 64*d* in the eleventh embodiment may each be a single layer or multiple layers formed of at least one other material as long as the single layer or the multiple layers achieve the functions of the layers.

According to the present invention, a pillar-shaped semiconductor memory device having a high density and a low cost, and a high-performance, new-function electronic device using the memory device can be provided.

The invention claimed is:

1. A method for producing a pillar-shaped semiconductor memory device, the method comprising:
 a mask material layer-forming step of forming, on a semiconductor substrate, a mask material layer having a circular shape in plan view;
 a first semiconductor pillar-forming step of forming a first semiconductor pillar by etching the semiconductor substrate using the mask material layer as a mask to form a semiconductor pillar on the semiconductor substrate, and retracting a side face of the semiconductor pillar to the inside of the semiconductor pillar;
 a tunnel insulating layer-forming step of forming a tunnel insulating layer so as to surround an outer periphery of the first semiconductor pillar;
 a data charge storage insulating layer-forming step of forming a data charge storage insulating layer so as to surround an outer periphery of the tunnel insulating layer;
 a first conductor layer-forming step of forming a first conductor layer on the outer periphery of the first semiconductor pillar and above the semiconductor substrate by allowing a material atom to be incident from a direction perpendicular to an upper surface of the mask material layer;
 a second interlayer insulating layer-forming step of forming a second interlayer insulating layer by allowing a material atom to be incident on the first conductor layer from a direction perpendicular to the upper surface of the mask material layer; and
 a stacked material layer-forming step of forming at least one stacked material layer in a direction perpendicular to an upper surface of the semiconductor substrate, the stacked material layer including the first conductor layer and the second interlayer insulating layer as one set,
 wherein data writing and erasing due to data charge transfer between the first semiconductor pillar and the data charge storage insulating layer through the tunnel insulating layer or data charge retention by the data charge storage insulating layer is performed by application of a voltage to the first conductor layer.

2. The method according to claim 1, further comprising:
 before the formation of the stacked material layer including the first conductor layer and the second interlayer insulating layer as one set, a step of forming a first material layer so as to surround an outer periphery of the data charge storage insulating layer,
 wherein an outer periphery of the first material layer coincides with or is disposed inside an outer periphery of the mask material layer in plan view.

3. The method according to claim 2, further comprising:
 a step of removing the first material layer after the formation of the stacked material layer including the first conductor layer and the second interlayer insulating layer as one set.

4. The method according to claim 1, further comprising:
 a space-forming step of forming a space between a side face of the data charge storage insulating layer and side faces of the first conductor layer and the second interlayer insulating layer in parallel with the first conductor layer-forming step and the second interlayer insulating layer-forming step.

5. The method according to claim 4, further comprising:
 a step of filling the space with an insulating layer after the formation of the stacked material layer including the first conductor layer and the second interlayer insulating layer as one set.

6. The method according to claim 1, further comprising:
 before the formation of the stacked material layer including the first conductor layer and the second interlayer insulating layer as one set, a step of forming a second material layer so as to cover an entire surface;
 a step of polishing the second material layer so that an upper surface of the second material layer becomes flush with an upper surface of the mask material layer; and
 a step of etching the second material layer from the upper surface to leave the second material layer under the mask material layer.

7. The method according to claim 6, further comprising:
 a step of removing the second material layer after the formation of the stacked material layer including the first conductor layer and the second interlayer insulating layer as one set.

8. The method according to claim 6, further comprising:
 a step of removing the second material layer disposed above an upper surface of the stacked material layer in a vertical direction after the formation of the stacked material layer including the first conductor layer and the second interlayer insulating layer as one set.

9. The method according to claim 1, further comprising:
 a second conductor layer-forming step of forming a second conductor layer on the outer periphery of the first semiconductor pillar and on the at least one stacked material layer by allowing a material atom to be incident from a direction perpendicular to the upper surface of the mask material layer; and
 a second conductor layer-first interlayer insulating layer-connecting step of connecting the second conductor layer to the first interlayer insulating layer by expanding the second conductor layer by heat treatment in a direction parallel to the upper surface of the semiconductor substrate.

10. The method according to claim 9, wherein, between the stacked material layer-forming step and the second conductor layer-first interlayer insulating layer-connecting step, heat treatment is performed in an atmosphere containing hydrogen.

11. The method according to claim 9, wherein, between the stacked material layer-forming step and the second conductor layer-first interlayer insulating layer-connecting step, heat treatment is performed in an atmosphere containing oxygen to form an oxide insulating layer in a surface layer of a side face of the first conductor layer.

12. The method according to claim 1, comprising:
 a truncated cone-shaped mask material layer-forming step of forming, as the mask material layer, a truncated cone-shaped mask material layer having a truncated cone shape on the first semiconductor pillar; and
 a cone-shaped stacked material layer-forming step of depositing a material atom by allowing the material atom to be incident from a direction perpendicular to the upper surface of the semiconductor substrate under a condition in which a deposition rate of the material atom on a side face of the truncated cone-shaped mask material layer is lower than a removal rate of the material atom to form the at least one stacked material layer above the semiconductor substrate and to form, on the truncated cone-shaped mask material layer, a cone-shaped stacked material layer having a conical shape and formed of a material layer common to the at least one stacked material layer.

13. The method according to claim 1, further comprising:
a first gate insulating layer-forming step of forming a first gate insulating layer below the at least one stacked material layer so as to surround the outer periphery of the first semiconductor pillar;
a third conductor layer-forming step of forming a third conductor layer so as to surround an outer periphery of the first gate insulating layer;
a first impurity region-forming step of forming a first impurity region below the third conductor layer and in a bottom portion of the first semiconductor pillar, the first impurity region containing a donor or acceptor impurity;
a second gate insulating layer-forming step of forming a second gate insulating layer above the at least one stacked material layer so as to surround the outer periphery of the first semiconductor pillar;
a fourth conductor layer-forming step of forming a fourth conductor layer so as to surround an outer periphery of the second gate insulating layer; and
a second impurity region-forming step of forming a second impurity region above the fourth conductor layer, the second impurity region having the same conductivity type as the first impurity region,
wherein the first conductor layer of the at least one stacked material layer is connected to a word-line wiring metal layer,
the third conductor layer is connected to a source-side selection gate wiring metal layer,
the first impurity region is connected to a common source wiring metal layer,
the fourth conductor layer is connected to a drain-side selection gate wiring metal layer, and
the second impurity region is connected to a bit-line wiring metal layer to form a NAND-type flash memory element in the first semiconductor pillar.

14. The method according to claim 13, further comprising:
a first outer peripheral semiconductor region-forming step of forming a first outer peripheral semiconductor region in an outer periphery of a memory element region in which the first semiconductor pillar is formed;
a second semiconductor pillar-forming step of forming, in a second outer peripheral semiconductor region included in the first outer peripheral semiconductor region, a second semiconductor pillar whose top portion has a height substantially equal to that of a top portion of the first semiconductor pillar, and whose bottom surface has a height substantially equal to that of a bottom surface of the fourth conductor layer;
a third gate insulating layer-forming step of forming a third gate insulating layer so as to surround an outer periphery of the second semiconductor pillar;
a fifth conductor layer-forming step of forming a fifth conductor layer whose upper and lower ends have heights substantially equal to those of upper and lower ends of the fourth conductor layer in a direction perpendicular to the semiconductor substrate so as to surround an outer periphery of the third gate insulating layer;
a third impurity region-forming step of forming a third impurity region above the fifth conductor layer and in a top portion of the second semiconductor pillar, the third impurity region containing a donor or acceptor impurity; and
a fourth impurity region-forming step of forming a fourth impurity region below the fifth conductor layer and in a bottom portion of the second semiconductor pillar, the fourth impurity region having the same conductivity type as the third impurity region,
wherein a surrounding gate MOS transistor (SGT) is formed in which when one of the third impurity region and the fourth impurity region functions as a source, the other functions as a drain, the second semiconductor pillar disposed between the third impurity region and the fourth impurity region functions as a channel, and the fifth conductor layer function as a gate.

15. The method according to claim 14, further comprising:
a third interlayer insulating layer-forming step of forming a third interlayer insulating layer on the semiconductor substrate so as to surround the outer periphery of the first semiconductor pillar, the third interlayer insulating layer extending to a side face and an upper surface of the first outer peripheral semiconductor region; and
a contact hole-forming step of forming a contact hole so as to be connected to an upper surface of the first conductor layer of the at least one stacked material layer that has an upper surface on an upper end of a side face of the second outer peripheral semiconductor region,
wherein the at least one stacked material layer is formed on the third interlayer insulating layer,
an upper surface of the at least one stacked material layer has a height substantially equal to that of an upper surface of the third interlayer insulating layer located on the first outer peripheral semiconductor region, and
the first conductor layer and the word-line wiring metal layer are connected to each other through the contact hole.

* * * * *